(12) United States Patent
Mihara

(10) Patent No.: US 11,302,791 B2
(45) Date of Patent: Apr. 12, 2022

(54) SEMICONDUCTOR DEVICE INCLUDING A FIN-TYPE TRANSISTOR AND METHOD OF MANUFACTURING THE SAME

(71) Applicant: RENESAS ELECTRONICS CORPORATION, Tokyo (JP)

(72) Inventor: Tatsuyoshi Mihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 8 days.

(21) Appl. No.: 16/854,306

(22) Filed: Apr. 21, 2020

(65) Prior Publication Data

US 2020/0403073 A1 Dec. 24, 2020

(30) Foreign Application Priority Data

Jun. 24, 2019 (JP) .............................. JP2019-116338

(51) Int. Cl.

| H01L 29/423 | (2006.01) |
|---|---|
| H01L 21/306 | (2006.01) |
| H01L 21/762 | (2006.01) |
| H01L 27/11568 | (2017.01) |
| H01L 29/08 | (2006.01) |
| H01L 21/28 | (2006.01) |
| H01L 29/66 | (2006.01) |
| H01L 29/78 | (2006.01) |
| H01L 29/792 | (2006.01) |

(Continued)

(52) U.S. Cl.
CPC .. H01L 29/42344 (2013.01); H01L 21/30604 (2013.01); H01L 21/76224 (2013.01); H01L 27/11568 (2013.01); H01L 29/0847 (2013.01); H01L 29/40117 (2019.08); H01L 29/66545 (2013.01); H01L 29/66795 (2013.01); H01L 29/66833 (2013.01); H01L 29/7851 (2013.01); H01L 29/792 (2013.01)

(58) Field of Classification Search
CPC ..... H01L 21/823412; H01L 21/823807; H01L 29/66492; H01L 29/7833–7836; H01L 29/7848; H01L 29/78621; H01L 29/78624; H01L 29/78627; H01L 29/7863; H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 27/11568; H01L 29/66833; H01L 29/40117; H01L 29/792; H01L 29/42344; H01L 29/665; H01L 21/823418
See application file for complete search history.

(56) References Cited

U.S. PATENT DOCUMENTS 7,504,689 B2   3/2009   Hisamoto et al.
2017/0358592 A1*  12/2017  Yamaguchi ....... H01L 21/67167

FOREIGN PATENT DOCUMENTS

JP   2006-041354 A   2/2006

* cited by examiner

*Primary Examiner* — Sonya McCall-Shepard
(74) *Attorney, Agent, or Firm* — McDermott Will & Emery LLP

(57) ABSTRACT

In order to improve the reliability of a semiconductor device, in a memory cell of a split-gate type MONOS memory formed on a fin, a drain region is formed in an epitaxial layer on the fin, and a source region is formed in the fin, and a silicide layer is formed on an upper surface of the fin in which the source region is formed.

14 Claims, 35 Drawing Sheets

(51) Int. Cl.
*H01L 21/8234* (2006.01)
*H01L 27/088* (2006.01)
*H01L 27/11573* (2017.01)

FIG. 33

| APPLIED VOLTAGE / OPERATION | Vd | Vcg | Vmg | Vs | Vb |
|---|---|---|---|---|---|
| WRITE | Vdd | 1V | 12V | 6V | Vb |
| ERASE | 0 | 0 | -6V | 6V | 0 |
| READ | Vdd | Vdd | 0 | 0 | 0 |

Vdd = 1.5V

SEMICONDUCTOR DEVICE INCLUDING A FIN-TYPE TRANSISTOR AND METHOD OF MANUFACTURING THE SAME

CROSS-REFERENCE TO RELATED APPLICATIONS

The disclosure of Japanese Patent Application No. 2019-116338 filed on Jun. 24, 2019 including the specification, drawings and abstract is incorporated herein by reference in its entirety.

BACKGROUND

The present invention relates to a semiconductor device and a method of manufacturing the same, and more particularly, the present invention relates to a technique useful for a semiconductor device including a fin-type transistor.

A fin-type transistor is known as a transistor which has a high operating speed and can reduce leakage current and power consumption and can be miniaturized. The fin-type field effect transistor (FINFET: Fin Field Effect Transistor) is, for example, a semiconductor element having a pattern, as a channel layer, comprised of a plate-like semiconductor layer protruded on a substrate. Also, the FINFET has a gate electrode formed so as to straddle the pattern.

In addition, an EEPROM is used as a non-volatile memory device which can be electrically written and erased. These memory devices typified by a flash memory have a conductive floating gate electrode surrounded by an oxide film or a trapping insulating film, that are located beneath a gate electrode of a MISFET. The storage device uses the charge accumulation states of the floating gate electrode or the trapping insulating film as a storage information. Also, the storage device reads the storage information as a threshold value of the transistor. The trapping insulating film is an insulating film capable of accumulating charge, and as an example, a silicon nitride film or the like can be given. The threshold value of the MISFET is shifted by injecting and discharging a charge into and from the charge storage region, thereby these memory devices operate as a storage element. As the flash memory, there is a split-gate type memory cell using a MONOS (Metal-Oxide-Nitride-Oxide-Semiconductor) film.

There are disclosed techniques listed below.
[Patent Document 1] Japanese Unexamined Patent Application Publication No. 2006-041354

Patent Document 1 discloses to form a silicide layer covering a surface of a fin, in a split-gate type MONOS memory including the FINFET.

SUMMARY

In the FINFET, the following first and second methods are considered as a method for reducing the connecting resistance between a contact plug and a source and drain region formed in a fin having a narrow width. The first method is to form an epitaxial layer on the source and drain region. However, in the split-gate type MONOS memory comprised of the FINFET, since a distance between the epitaxial layer to which a high voltage is applied and a memory gate electrode is short, the breakdown voltage between the epitaxial layer and the memory gate electrode is low. In addition, by forming the epitaxial layer, a stress in a channel region of the FINFET may be increased, and the performance of the storage element may be deteriorated. The second method is to replace the gate electrode with a metal gate electrode (metal film), after forming a silicide layer on the source and drain region. However, the silicide layer may be deteriorated by heat treatment performed in the step of replacing the metal gate electrode, and conversely, the connection resistance may be increased. That is, when the MONOS memory is composed of the FINFET, there is an objective of reducing the connection resistance without lowering the breakdown voltage and the performance of the MONOS memory.

Other objects and novel features will become apparent from the description of this specification and the accompanying drawings.

The typical ones of the embodiments disclosed in the present application will be briefly described as follows.

A semiconductor device according to one embodiment is related to a split-gate type MONOS memory comprised of a FINFET having a first gate electrode and a second gate electrode that are adjacent to each other, and that are formed on a first protruding portion which is a part of a semiconductor substrate. Here, the first protruding portion sandwiches both the first gate electrode and the second gate electrode in plan view. Also, a first semiconductor layer including a first semiconductor region therein is formed on the first protruding portion located on the first gate electrode side. In addition, a silicide layer is formed on the first protruding portion located on the second gate electrode side and including a second semiconductor region therein.

Also, a method of manufacturing a semiconductor device according to one embodiment is related to a technology covering a drain region of a split-gate type MONOS memory comprised of a FINFET with an epitaxial layer, and covering a source region of the MONOS memory with a silicide layer after replacing a gate electrode with a metal film.

According to the embodiment disclosed in the present application, the performance of a semiconductor device can be improved.

BRIEF DESCRIPTION OF THE DRAWINGS

FIG. 33 is a table showing an example of the conditions for applying a voltage to each portion of the selected memory cell during "WRITE", "ERASE" and "READ".

DETAILED DESCRIPTION

Figure 1:
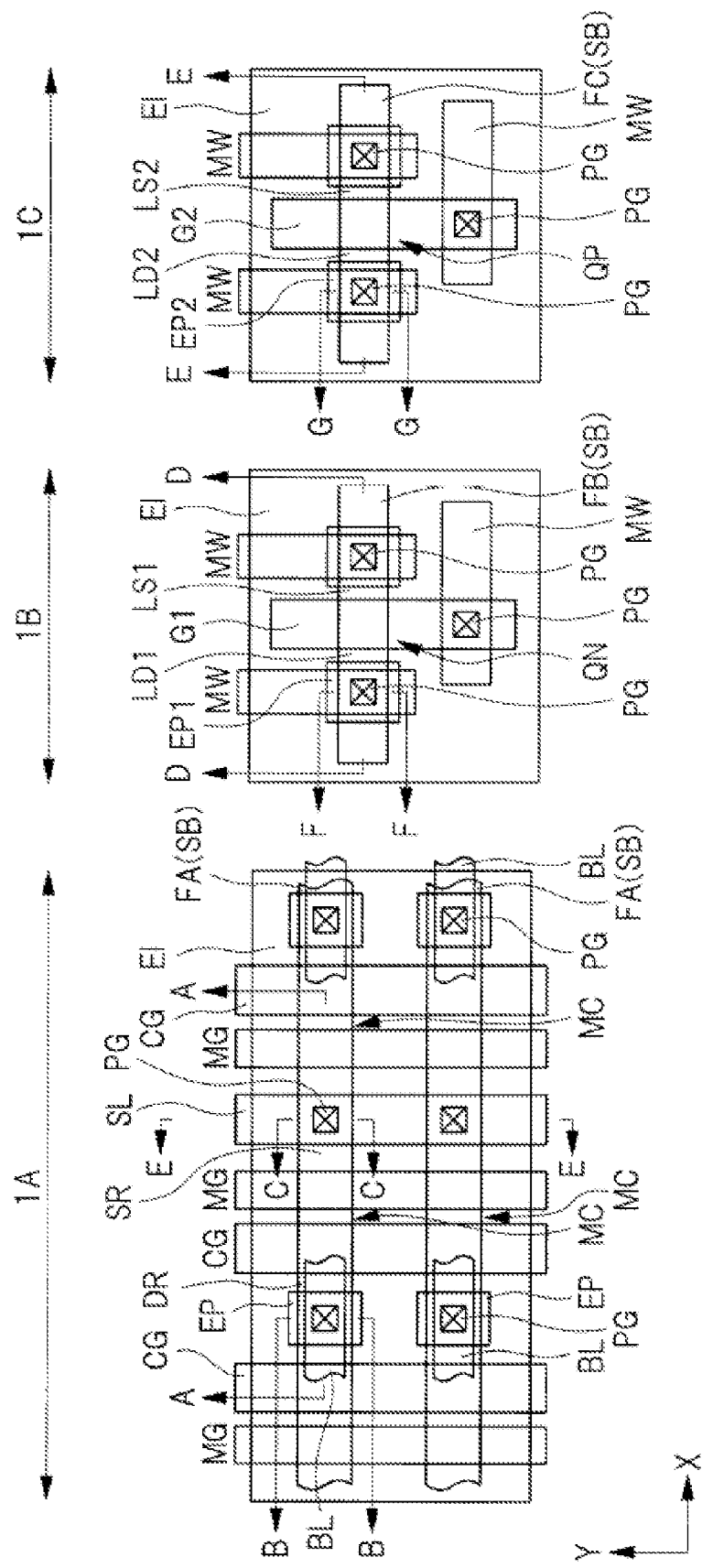
FIG. 1 is a plan view showing a semiconductor device according to an embodiment of the present invention.

In the following embodiments, when required for convenience, the description will be made by dividing into a plurality of sections or embodiments, but except when specifically stated, they are not independent of each other, and one is related to the modified example, detail, supplementary description, or the like of part or all of the other. In addition, in the following embodiments, the number of elements or the like (including the number, the number, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the constituent elements (including element steps and the like) are not necessarily essential except for the case in which they are specifically specified, the case in which they are considered to be obviously essential in principle, and the like. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The embodiments will be described based on drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

<Configuration Example of Semiconductor Chip>

The configuration of a semiconductor chip having a non-volatile memory according to the present embodiment will be described below. Semiconductor chips (not shown) in present embodiment include CPUs (Central Processing Unit), RAMs (Random Access Memory), and analogue circuits. In addition, the semiconductor chips in present embodiment have EEPROM (Electrically Erasable Programmable Read Only Memory). The semiconductor chip includes a flash memory and an I/O (Input/Output) circuit.

The CPUs, also called central processing units (device), read and decode instructions from a storage device, and perform operations and control based on the instructions. A RAM (circuit) is a memory in which stored information can be written and read at any time. As the RAM, a SRAM (Static RAM using static circuits) is used. Analog circuits are circuits that handle temporally continuously varying voltage and current signals, i.e., analog signals, and consist of, for example, amplification circuits, transduction circuits, modulation circuits, oscillation circuits and electrical power supply circuits.

EEPROM and flash memories are a type of non-volatile memory in which stored data can be electrically rewritten in a write operation and an erase operation, and are also referred to as electrically erasable programmable read-only memories. The memory cells of EEPROM and the flash memory are composed of, for example, MONOS transistors for memory. Here, a MONOS (Metal Oxide Nitride Oxide Semiconductor) transistor for storage is sometimes referred to as a MONOS memory.

The I/O circuit is an input/output circuit. The I/O circuit is a circuit for outputting data from the inside of the semiconductor chip to a device connected to the outside of the semiconductor chip, or inputting data from a device connected to the outside of the semiconductor chip to the inside of the semiconductor chip.

Semiconductor device of present embodiment has a memory cell region and a logic circuit region. In the memory cell region, a memory cell array in which a plurality of non-volatile memory cells is arranged in a matrix is formed. In the logic circuit area, CPUs, RAMs, analogue circuits, I/O circuits, EEPROM, and the like are formed. In the logic circuit region, an address buffer of a flash memory, a row decoder, a column decoder, a verify sense amplifier circuit, a sense amplifier circuit, a write circuit, and the like are formed.

<Device Structure of Semiconductor Device>

Figure 2:
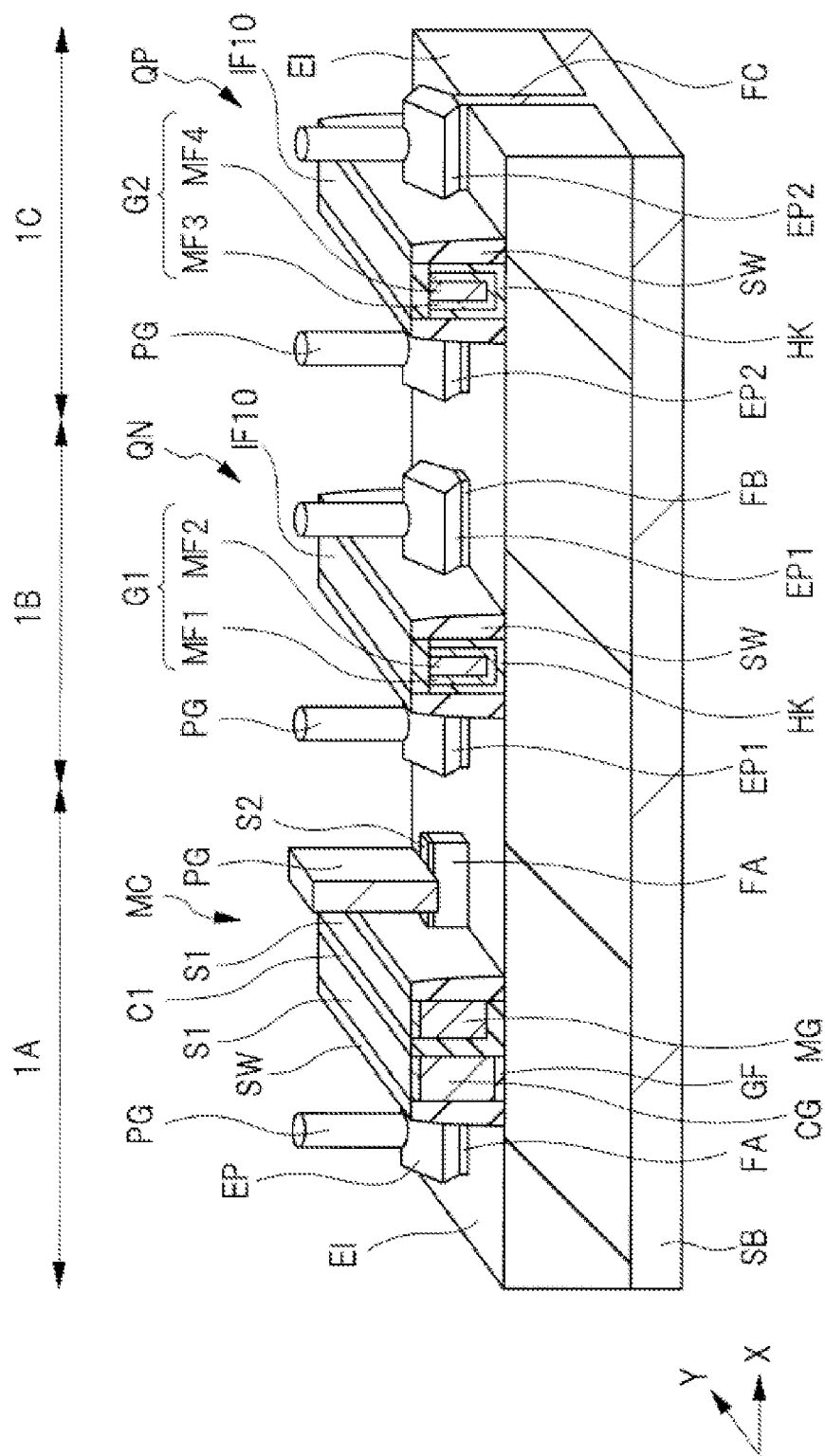
FIG. 2 is a perspective view showing the semiconductor device according to the embodiment of the present invention.
Figure 3:
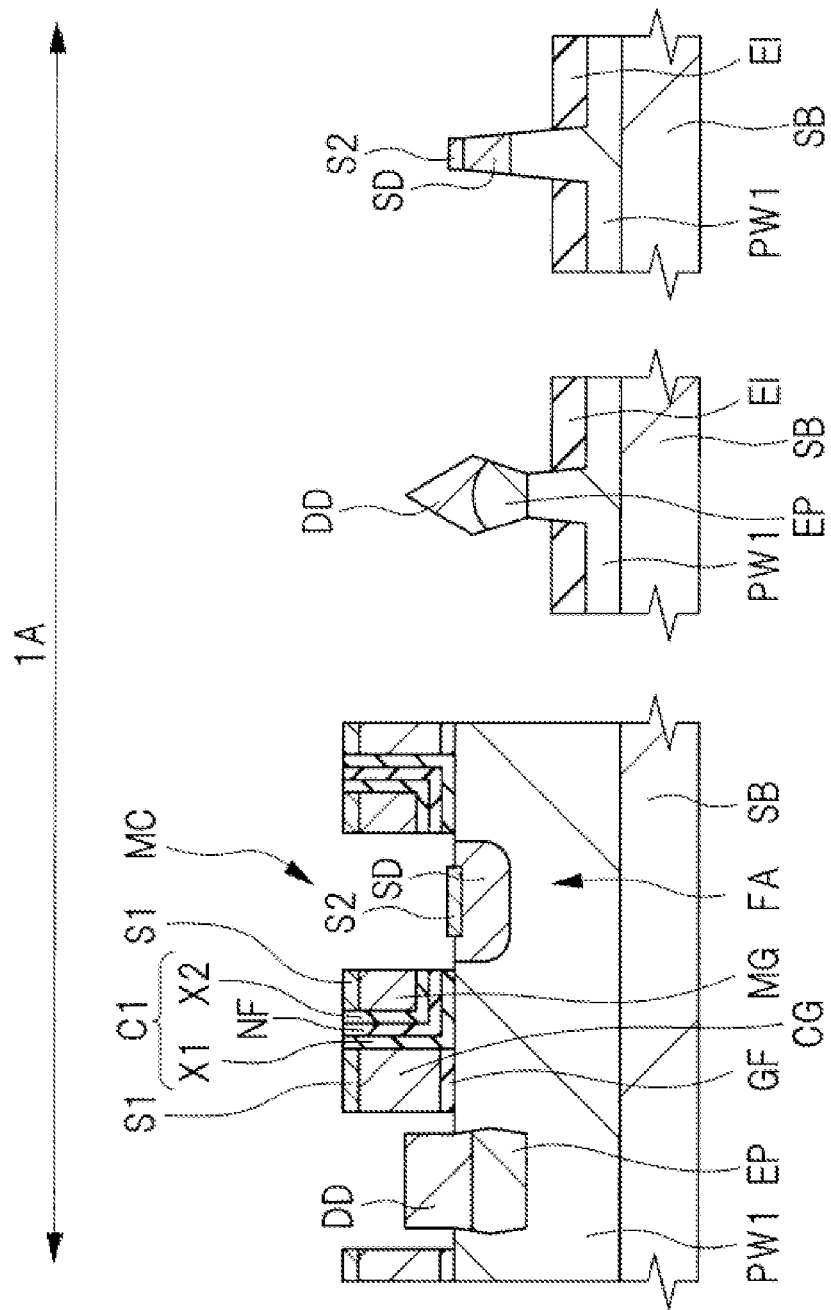
FIG. 3 is a cross section view showing the semiconductor device according to the embodiment of the present invention.
Figure 4:
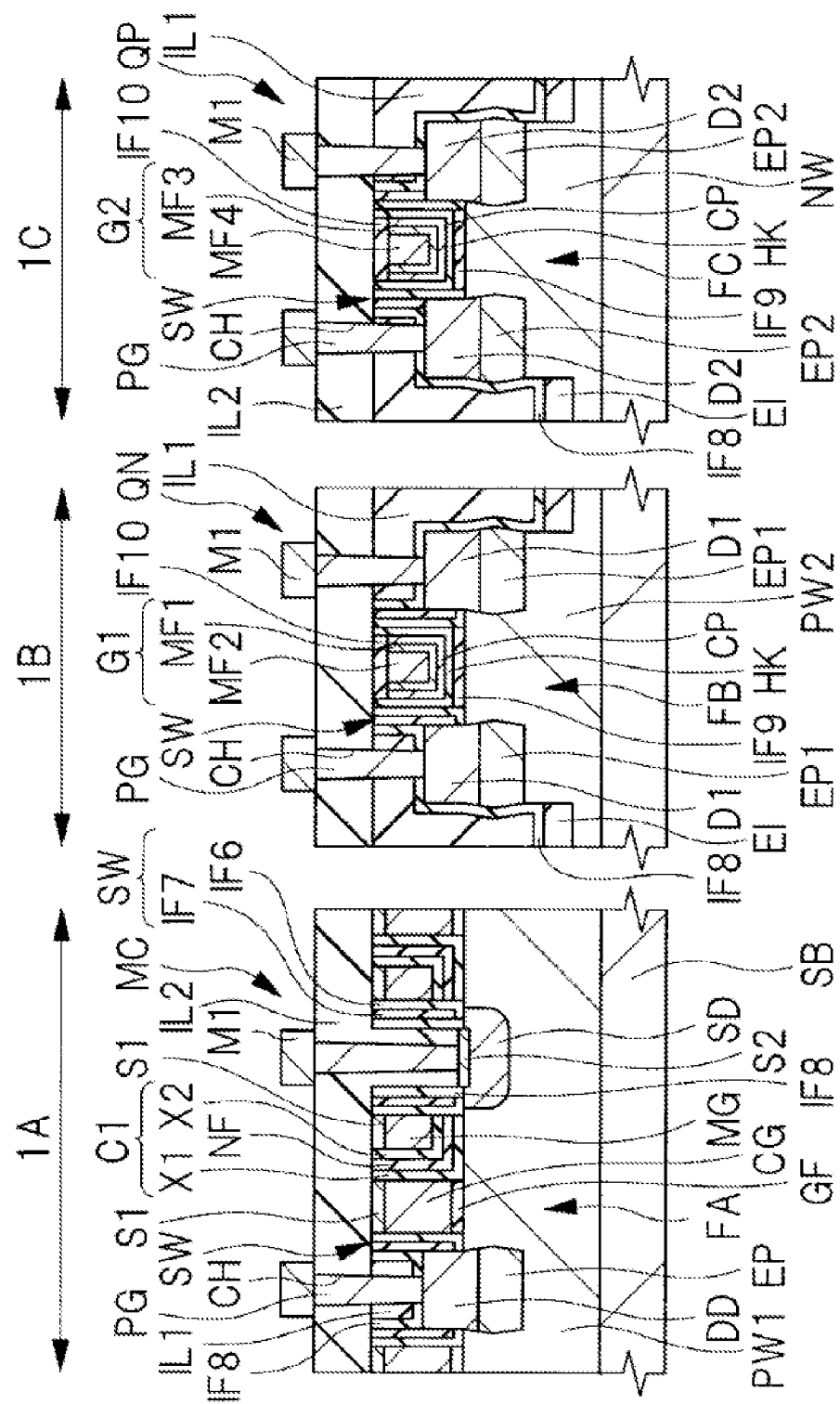
FIG. 4 is a cross section view showing the semiconductor device according to the embodiment of the present invention.
Figure 5:
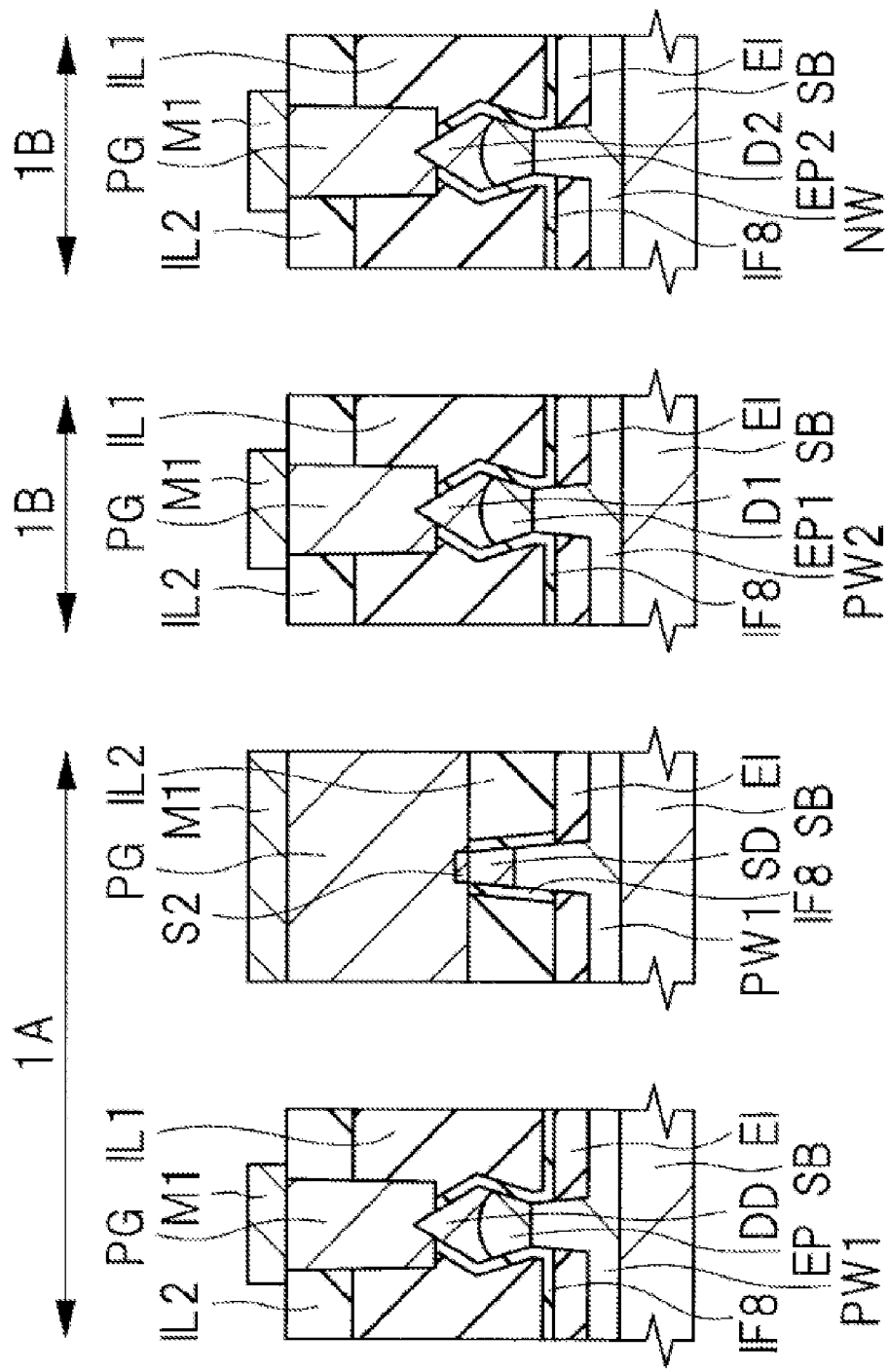
FIG. 5 is a cross section view showing the semiconductor device according to the embodiment of the present invention.

The structure of present embodiment semiconductor device will be described below with reference to FIGS. 1 to 5. FIG. 1 is a plan view of semiconductor device in present embodiment. FIG. 2 is a perspective view showing the semiconductor device according to the embodiment of the present invention. FIGS. 3-5 are a cross section view showing the semiconductor device according to the embodiment of the present invention. In FIG. 1, only a fin, an isolation film, an epitaxial layer, a gate electrode, a plug and a wiring are shown. In FIG. 2, an insulating film such as an interlayer insulating film on a well, an element isolation film and each element and a wiring are not shown. In FIG. 3, an insulating film such as an interlayer insulating film on an element isolation film and each element, a plug and a wiring are not shown. In FIGS. 4 and 5, an interlayer insulating film composing a first wiring layer and other wiring layers on the first wiring are not shown. In cross section view of the present application, the control gate electrode and the memory gate electrode in the memory cell region are shown with a width smaller than the gate electrode in the logic circuit region (nMIS region and pMIS region) in order to make the drawing easier to understand. Actually, however, the gate electrode in the logic circuit region (nMIS region and pMIS region) has a smaller width in the gate length direction than the control gate electrode and the memory gate electrode.

In FIG. 1, the memory cell array in the memory cell region 1A, the n-type transistor QN in nMIS region 1B, and the p-type transistor QP in pMIS region 1C are shown in order from the left. The n-type transistor QN and the p-type transistor QP compose a logic circuit or the like in a logic circuit region. The n-type transistor QN is exemplified by an n-type MISFET (Metal Insulator Semiconductor Field Effect Transistor and a MIS-type field-effect transistor. As the p-type transistor QP, a p-type MISFET is exemplified. Here, the n-type MISFET is sometimes referred to as nMIS, and the p-type MISFET is sometimes referred to as pMIS.

The memory cell MC formed in the memory cell area 1A is formed in, for example, a flash memory. The n-type transistor QN in nMIS region 1B and the p-type transistor QP in pMIS region 1C are formed in, for example, RAMs or CPUs.

As shown in FIG. 1, in the memory cell area 1A, a plurality of fins FA extending in the X direction is arranged at equal intervals in the Y direction. The X and Y directions are the directions along the upper surface of the semiconductor substrate SB. The X direction is crossing (orthogonal) to the Y direction. The fin FA is, for example, a rectangular parallelepiped protruding portion (convex portion) selectively protruding from the bottom surface of the groove (trench) formed in the upper surface of the semiconductor substrate SB, and the fin FA has a plate-like shape. That is, the fin FA is a portion of the semiconductor substrate SB remaining in a plate shape between adjacent grooves when the upper surface of the semiconductor substrate SB is receded by etching so as to form a plurality of grooves. The periphery of the lower end portion of the fin FA is surrounded by an element isolation film (element isolation region) EI covering the bottom surface of the groove. The fin FA is a part of the semiconductor substrate SB and is active region of the semiconductor substrate SB. In plan view, the groove between the adjacent fins FA is filled with the element isolation film EI. The upper surface (main surface) of semiconductor substrate SB referred to in the present application refers to an upper surface of semiconductor substrate SB before the groove is formed or an upper surface of semiconductor substrate SB (for example, upper surface of the fin FA) in the region where the groove is not formed.

A plurality of control gate electrodes CG and a plurality of memory gate electrodes MG are arranged on the plurality of fins FA and extend in the Y direction. A groove (trench) is formed in the upper surface of the fin FA that is adjacent to the control gate electrode CG in plan view, and that is located on opposite side of the memory gate electrode MG, and an epitaxial layer (raised semiconductor layer) EP is formed in the groove. That is, the epitaxial layer EP is formed on the upper surface of the fin FA located on the control gate electrode CG side, among the fin FA sandwiching the control gate electrode CG and the memory gate electrode MG in plan view, and is in contact with the upper surface of the fin FA. A drain region (n-type semiconductor region) DR is formed in the epitaxial layer EP. A source region (n-type semiconductor region) SR is formed on the upper and side surfaces of the fin FA that is adjacent to the memory gate electrodes MG in plan view, and that is located on opposite side of the control gate electrode CG. That is, the source region SR is formed in the fin FA located on the memory gate electrode MG side, among the fin FA sandwiching the control gate electrode CG and the memory gate electrode MG in plan view.

That is, the drain region DR on the control gate electrode CG side and the source region SR on the memory gate electrode side are formed. That is, one control gate electrode CG and one memory gate electrode MG adjacent to each other are located between the source region SR and the drain region DR in the X direction (longitudinal direction of the fin FA) in plan view.

The drain region DR and the source region SR are n-type semiconductor regions. The drain region DR is formed between two control gate electrodes CG adjacent to each other in the X direction in plan view, and the source region SR is formed between two memory gate electrodes MG adjacent to each other in the X direction in plan view. The memory cell MC is a non-volatile memory element including a control gate electrode CG, a memory gate electrode MG, a charge storage film (not shown), a drain region DR and a source region SR. Hereinafter, the source region SR and the drain region DR compose one memory cell MC may be referred to as a source/drain region.

The two memory cells MC adjacent to each other in the X direction share one of the drain region DR and the source region SR. The layout of each of the two memory cells MC sharing the drain region DR is line-symmetric in the X direction about an axis which overlaps the drain region DR and extends in the Y direction in plan view. The layout of each of the two memory cells MC sharing the source region SR is line-symmetrical in the X direction about an axis overlapping the source region SR and extending in the Y direction in plan view.

A plurality of memory cells MC arranged in the X direction are formed in each fin FA. The drain region DR of each memory cell MC is electrically connected to a plug (contact plug, conductive connection portion) PG formed in a contact hole penetrating an interlayer insulating film (not shown) formed on the memory cell MC. The plug PG is electrically connected to a bit line BL extending in the X direction. The source region SR of each of the plurality of memory cells MC arranged side by side in the Y direction is electrically connected to a source line SL extending in the Y direction via a plug PG. The bit line BL and the source line SL are arranged on the memory cell MC.

Fins FBs extending in the X-direction, for example, are formed in nMIS regions 1B. Like the fin FA, the fin FB is a part of semiconductor substrate SB, and has a plate-like shape protruding upward from the bottom surface of the groove formed in upper surface of semiconductor substrate. The fin FB is an active area of semiconductor substrate SB, and the lower end portion of the fin FB is surrounded by the device isolation film EI covering the bottom surface of the trench. A gate electrode G1 extending in the Y direction is disposed on the fin FB. A groove is formed in each upper surface of the fins FB on both sides adjacent to the gate electrode G1 in plan view, and an epitaxial layer (semiconductor layer) EP1 is formed in the groove. A drain region LD1 is formed in one of the epitaxial layers EP1 sandwiching the gate electrode G1 in the X-direction, and a source region LS1 is formed in the other of the epitaxial layers. The drain region LD1 and the source region LS1 are n-type semiconductor regions.

The n-type transistor QN includes a gate electrode G1, a drain region LD1, and a source region LS1. The gate electrode G1, the drain region LD1, and the source region LS1 are electrically connected to the interconnection MW via plugs PG formed in the contact holes, respectively.

In addition, the fin FC extending in the X-direction and p-type transistor QP above the fin FC are formed in pMIS region 1C. The layout of the p-type transistor QP composed of the gate electrode G2, the drain region LD2, and the source region LS2 is the same as the layout of the n-type transistor QN, for example. However, the drain region LD2 and the source region LS2 are p-type semiconductor regions. Each of the drain region LD2 and the source region LS2 is formed in an epitaxial layer EP2 buried in a trench formed in the upper surface of the fin FC. The wiring MW is disposed on each of the n-type transistor QN and the p-type transistor QP. Hereinafter, the source region LS1, LS2 and the drain region LD1, LD2 compose each of the n-type transistor QN and the p-type transistor QP may be referred to as a source/drain region.

Each of the fins FA, FB, and FC is, for example, a rectangular parallelepiped protruding portion that is protruded from the bottom surface of the groove formed in the upper surface of the semiconductor substrate SB in a vertical direction against the bottom surface. However, Fin FA, FB and FC does not necessarily have to be a rectangular parallelepiped, and the corner portion of the rectangle may be rounded in the cross section view in the lateral direction. Also, the sides of the fins FA, FB and FC may be perpendicular to upper surface of semiconductor substrate SB, but may have angles of inclination close to perpendicular, as shown in FIG. 5. That is, the cross section shape of each of the fins FA, FB, and FC is a rectangular parallelepiped or a trapezoid. Here, the sides of the fins FA, FB and FC are inclined obliquely with respect to upper surface of semiconductor substrate SB.

As shown in FIG. 1, the direction in which the fins FA, FB, and FC extend in plan view is the longitudinal direction (long side direction) of each fin, and the direction orthogonal to the long side direction is the short side direction (short side direction) of each fin. Each of the transverse and longitudinal directions of the fins referred to herein is along upper surface of semiconductor substrate. Each of the fins FA, FB, and FC may have any shape as long as they are protruding portion having a length, a width and a height. For example, it may have a layout meandering in plan view.

In the memory cell region 1A of FIG. 1, a plurality of elements arranged on one fin FA are shown, whereas in nMIS region 1B of FIG. 1, only one element is shown on one fin FB. Also, in pMIS region 1C of FIG. 1, only one element is shown on one fin FC. However, a plurality of elements may be arranged in the X-direction on each of the fins FB and FC in the same manner as in the memory cell area 1A. In this case, adjacent elements may share either the drain region or the source region. This also applies to the figures after FIG. 4.

In FIGS. 2 and 4, the memory cell region 1A, nMIS region 1B and pMIS region 1C are shown side by side in order from the left side to the right side. In the memory cell regions 1A of FIGS. 4 and 5, interlayer insulating films, plugs, wires, and the like, which are not illustrated in FIG. 3, are additionally illustrated. FIG. 3 shows, in order from the left, a cross section taken along line A-A of FIG. 1, a cross section taken along line B-B of FIG. 1, and a cross section taken along line C-C of FIG. 1. In FIG. 3 showing only the memory cell region 1A, a cross section along the longitudinal direction of the fin including the gate electrode and the source/drain region, a cross section along the latitudinal direction of the fin including the drain region, and a cross section along the latitudinal direction of the fin including the source region are shown in order from the left. In FIG. 4, a plurality of cross sections along the longitudinal direction of each fin are shown side by side. FIG. 4 shows, in order from the left, a cross section of the semiconductor element in each of the A-A line, the D-D line, and the E-E line of FIG. 1.

In FIG. 5, a plurality of cross-sections of each fin along the lateral direction are shown side by side. In FIG. 5, in order from the left, the line B-B in FIG. 1, C-C line, shows a cross-section in the line F-F and G-G. In FIG. 5, a cross section of the fin FA including the drain region of the memory cell region 1A and a cross section of the fin FA including the source region of the memory cell region 1A are shown side by side in order from the left. In FIG. 5, a cross section of the fins FB including the drain region of nMIS region 1B is shown on the right side of the cross section of the memory cell region 1A. Further, FIG. 5 shows a cross section of the fin FC including the drain region of pMIS region 1C on the right side of the cross section of nMIS region 1B.

As shown in FIGS. 2 and 3, a memory cell MC is formed on the fin FA composing the semiconductor substrate SB in the memory cell region 1A. An n-type transistor QN is formed above the fin FB composing the semiconductor substrate SB in nMIS region 1B. A p-type transistor QP is formed above the fin FC composing the semiconductor substrate SB of pMIS region 1C.

The control gate electrode CG and the memory gate electrode MG extend in the Y direction so as to straddle the fin FA, the gate electrode G1 extends in the Y direction so as to straddle the fin FB, and the gate electrode G2 extends in the Y direction so as to straddle the fin FC. The upper surface of each of the control gate electrode CG and the memory gate electrode MG is covered with a silicide layer S1. The silicide layer S1 is made of, for example, nickel silicide (NiSi) or cobalt silicide (CoSi). The silicide layer S1 may contain platinum. Although FIG. 2 shows a cylindrical plug PG, the cross section shape of the plug may be a quadrangle or the like. In FIG. 2, the insulating film IF9 and the metallic film CP (see FIG. 3) are not shown.

As shown in FIGS. 3 to 5, the lower portion of the side surface of each of the fins FA, FB, and FC is surrounded by the device isolation film EI formed on the bottom surface of the trench formed in the upper surface of the semiconductor substrate SB. That is, the fins are separated from each other by the element isolation film EI. In the fin FA, a p-type well PW1, which is a p-type semiconductor region, is formed from the upper surface of the fin FA to the lower portion. Similarly, a p-type well PW2, which is a p-type semiconductor region, is formed in the fin FB from upper surface to the lower portion of the fin FB. In the fin FC, n-type wells NW, which are n-type semiconductor regions, are formed from upper surface of the fin FC to the lower portion of the fin FC.

The control gate electrode CG is formed on each of the upper surface of the fin FA and the side surface of the fin FA via a gate insulating film GF. In a region adjacent to the control gate electrode CG in the X direction, a memory gate electrode MG is formed with an insulating film C1 interposed therebetween. An insulating film C1 is interposed between the control gate electrode CG and the memory gate electrode MG, and the control gate electrode CG and the memory gate electrode MG are electrically isolated by the insulating film C1. An insulating film C1 is interposed between the memory gate electrode MG and each of the upper surface of the fin FA and the side surface of the fin FA. The insulating film C1 is continuously formed so as to cover the side surface and the bottom surface of the memory gate electrode MG. Therefore, the insulating film C1 has an L-shaped cross-section shape.

The gate insulating film GF is a thermal oxide film (silicon oxide film) formed by thermally oxidizing each of the upper surface of the fin FA and the side surface of the fin FA, which is a protruding portion of the semiconductor substrate SB comprised of silicon, and the thickness of the gate insulating film GF is, for example, 2 nm. The insulating film C1 has a silicon oxide film X1 made of a thermal oxide film having a thickness of 4 nm, which is formed by thermally oxidizing an upper surface and a side surface of the fin FA, which is a protruding portion of the semiconductor substrate SB comprised of silicon. The insulating film C1 has a silicon nitride film NF formed on the silicon oxide film X1 and a silicon oxide film X2 formed on the silicon nitride film NF. The silicon nitride film NF is a charge storage film of the memory cell MC. The silicon nitride film has a thickness of 7 nm, for example, and the silicon oxide film X2 has a thickness of 9 nm, for example.

That is, the insulating film C1 has a laminated structure composed of a silicon oxide film X1, a silicon nitride film NF, and a silicon oxide film X2 that are stacked in this order from each of the upper surface side of the fin FA and the side surface of the control gate electrode CG. That is, the insulating film C1 is an Oxide Nitride Oxide film. The thickness of the insulating film C1 is, for example, 20 nm, and is larger than the thickness of the gate insulating film GF under the control gate electrode CG. The silicon oxide film X2 may be formed of a silicon oxynitride film.

Note that the insulating film interposed between the control gate electrode CG and the memory gate electrode MG is not limited to the ONO film having the charge accumulation portion, and may be an insulating film made of a silicon oxide film or the like. That is, the insulating film C1 between the memory gate electrode MG and the fin FA and the insulating film interposed between the control gate electrode CG and the memory gate electrode MG may be different films.

In the lateral direction (Y direction) of the fins FA, the control gate electrodes CG extend along upper surface of the device isolation film EI. Similarly, in the Y-direction, the memory gate electrodes MG extend along upper surface of the device isolation film EI. The silicide layer S1 is formed on the upper surface of each of the control gate electrodes CG and the memory gate electrodes MG.

The side surface of the pattern including the control gate electrode CG, the memory gate electrode MG, the gate insulating film GF, the insulating film C1 and the silicide layer S1 is covered with the sidewall spacer SW. The sidewall spacer SW has a stack structure composed of, for example, an insulating film IF6 made of a silicon nitride film and an insulating film IF6 IF7 made of a silicon oxide film.

In plan view, grooves (concave portions) reaching a mid-depth of the fins FA are formed on upper surface of the fins FA on the control gate electrodes CG-side among the fins FA sandwiching the patterns and the sidewall spacers SW in the X-direction. The bottom surface of the trench is located at a position higher than upper surface of the device isolation film EI, for example. An epitaxial layer (semiconductor layer) EP formed by an epitaxial growth method is buried in the trench. The epitaxial layer EP fills the trench and protrudes out of the trench in the upward and Y directions. Upper surface of the epitaxial layer EP is located above upper surface of the fins FA immediately below the control gates CG, and the width of the epitaxial layer EP in the Y direction is larger than the width of the fins FA in the Y direction.

The epitaxial layer EP has a rhombic shape in a cross section along the Y direction, see FIGS. 3 and 5. That is, the side surface of the epitaxial layer EP of the memory cell area 1A has the side surface of the lower portion and the side surface of the upper portion. The side surface of the lower portion is inclined so as to be away from the fins FA in the direction along upper surface of semiconductor substrate SB as the side of the device isolation film EI is directed upward. Further, the side surface of the upper portion is inclined so as to approach the fins FA in the direction along upper surface of semiconductor substrate SB from the device isolation film EI side toward the upper side. The upper end of the lower side surface and the lower end of the upper side surface are connected.

In other words, in the Y direction, the width between the left terminal end and the right terminal end of the epitaxial layer EP is larger at the center between the upper end and the lower end of the epitaxial layer EP than at the upper end and the lower end of the epitaxial layer EP. Also, in the cross section along the X direction, see FIGS. 3 and 5, a part of the epitaxial layer EP has a shape close to a rhombic shape. The epitaxial layer EP is formed on the fin FA so as to cover the upper surface of the fin FA. The epitaxial layer EP is in contact with the upper surface of the fin FA. The epitaxial layer EP is made of, for example, silicon phosphide (SiP) or silicon carbide (SiC).

A diffusion region DD, which is an n-type semiconductor region, is formed from the upper surface of the epitaxial layer EP to an intermediate depth of the epitaxial layer EP. The diffusion region DD composes a drain region DR. Since the lower end of the diffusion region DD is located under compared to the uppermost surface of the fin FA, a part of the diffusion region DD and a part of the fin FA are adjacent to each other in the X direction.

An upper surface of the diffusion region DD is located above the upper surface of the fin FA directly below the control gate electrode CG. A silicide layer is not formed in upper surface (upper surface of the epitaxial layer EP) of the diffusion region DD. That is, upper surface of the diffusion region DD is exposed from the silicide layer. In other words, upper surface of the diffusion region DD is separated from any silicide layer and is not in contact with the silicide layer. The lower end of the diffusion region DD may reach the fin FA below the epitaxial layer EP1.

On the other hand, in plan view, a diffusion region SD is formed on the upper surface of the fin FA located on the memory gate electrodes MG side among the fin FA sandwiching the pattern and the sidewall spacer SW in the X-direction. The diffusion region SD is an n-type semiconductor region and composes a source region SR. The diffusion region SD are formed at a predetermined depth from upper surface of the fins FA. The lower end of the diffusion region SD is located above upper surface of the device isolation film EI, for example. That is, the diffusion region SD is also formed in a part of the side surface of the fin FA. The diffusion region SD may extend from upper surface of the fins FA to the same height as upper surface of the device isolation film EI.

Here, no trench is formed in the upper surface of the fin FA in which the diffusion region D composing the source region of the memory cell region 1A is formed, and the upper surface of the fin FA is covered with the silicide layer S2. That is, the upper surface of the fin FA exposed from the pattern including the control gate electrode CG, the epitaxial layer EP and the sidewall spacer SW is covered with the silicide layer S2. The silicide layer S2 is in contact with the upper surface of the diffusion region SD and is electrically connected to the diffusion region SD. The silicide layer S2 is made of one of, for example, NiSi and CoSi. The position of the upper surface of the silicide layer S2 is lower than the position of the bottom surface of the memory gate electrode MG. The position of the upper surface at the end portion of the silicide layer S2 located on the memory gate electrode MG side is lower than the position of the lower surface of the memory gate electrode MG located on the silicide layer S2 side. On the other hand, the position of the upper surface of the epitaxial layer EP is higher than the position of the lower surface of the memory gate electrode MG.

The control gate electrode CG, the memory gate electrode MG, the charge storage film (silicon nitride film NF), the source region and the drain region compose a memory cell MC. In other words, the memory cell MC has a control gate electrode CG, a memory gate electrode MG, a charge storage film, a drain region and a source region. The control gate electrode CG and the source/drain region compose a control transistor, and the memory gate electrode MG and the source/drain region compose a memory transistor. The memory cell MC includes the control transistor and the memory transistor. That is, the control transistor and the memory transistor share the source/drain region. The control gate electrode CG, the memory gate electrode MG, the insulating film C1 including the charge storage film, and the source/drain region compose a memory cell MC, which is a split-gate type MONOS memory (non-volatile memory element). The distance between the drain region and the source region in the gate length direction (X direction) of each of the control gate electrode CG and the memory gate electrode MG corresponds to the channel length of the memory cell MC.

As described above, the groove and the epitaxial layer EP in the groove are provided in the fin FA on the side of the control gate electrode CG, that is, on the side of the drain region, and there is no silicide layer. On the other hand, a groove and an epitaxial layer are not provided in the fin FA on the side of the memory gate electrode MG, that is, on the side of the source region, and a silicide layer S2 is formed. That is, the source/drain region sandwiching the pattern including the control gate electrode CG and the memory gate electrode MG in plan view has an asymmetric structure. One of the main features of present embodiment is that the epitaxial layer EP is formed on the drain region side of the memory cell MC made of FINFET, and the epitaxial layer EP is not provided on the source region side of the memory cell MC. Here, while the epitaxial layer EP is not covered with the silicide layer, upper surface of the fins FA in which the source regions are formed is covered with the silicide layer.

The epitaxial layer EP is a semiconductor layer and can be integrated with the fins FA (semiconductor substrate SBs). The epitaxial layer EP is distinguishable from the fin FA because upper surface of the epitaxial layer EP protrudes upward as compared with the fin FA and has a wide width in the Y-direction. Therefore, the width of the epitaxial layer EP in the Y direction is larger than the width of the diffusion region DD and the width of the diffusion region SD. The epitaxial layer EP is a semiconductor layer formed on the fin FA and in contact with the upper end (upper surface) of the fin FA. When it is considered that one semiconductor layer is composed of the epitaxial layer EP and the fin FA, the fin FA is an extended portion, and the epitaxial layer EP is a protruding portion (convex portion, wide portion) in the latitudinal direction and upward direction of the semiconductor layer.

In nMIS region 1B, the gate electrode G1 is formed on each of the upper surface of the fin FB and the side surface of the fin FB via the insulating film IF9 functioning as a gate insulating film, the insulating film HK functioning as a gate insulating film and the metallic film CP. That is, the insulating film HK is formed on the insulating film IF9, the metal film CP is formed on the insulating film HK, and the gate electrode G1 is formed on the metal film CP. The insulating film HK and the metal film CP continuously cover the bottom surface and the side surface of the gate electrode G1.

The insulating film IF9 is made of, for example, a silicon oxide film. The insulating film HK is an insulating film having a dielectric constant (relative dielectric constant) higher than that of the silicon nitride film, i.e., a so-called High-k film (high dielectric constant film). The metal film CP is made of, for example, a titanium nitride (TiN) film. The gate electrode G1 includes a metal film MF1 covering upper surface and the side surface of the insulating film HK, and a metal film MF2 formed on the insulating film HK with the metal film MF1 therebetween. That is, the metal film MF1 continuously covers the lower surface and the side surface of the metal film MF2. The metallic film MF1 is a work-function film for adjusting the threshold value of the n-type transistor QN. The metal film MF1 is made of, for example, titanium aluminum (TiAl), and the metal film MF2 is made of, for example, tungsten (W).

An insulating film IF10 made of, for example, a silicon nitride film is formed on the insulating film HK and the gate electrode G1. In the lateral direction (Y direction) of the fins FB, the gate electrodes G1 extend continuously along upper surface of the device isolation film EI. The side surface of the pattern comprised of the insulating film IF9, the insulating film HK, the gate electrode G1 and the insulating film IF10 is covered with the sidewall spacer SW.

A groove is formed in each of the upper surfaces of the fin FB, which are respectively located on both sides of the gate electrode G1 in the X-direction in plan view. The bottom surface of each groove reaches to the mid-depth of the fin FB located above compared to the upper surface of the device isolation film EI. An epitaxial layer EP1 is formed inside of each groove. The epitaxial layer EP1 has a configuration similar to that of the epitaxial layer EP of the memory cell area 1A. That is, the epitaxial layer EP1 has a width larger than the width of the fin FB in the Y-direction. Also, the upper end of the epitaxial layer EP1 protrudes upward from the upper surface of the fin FB. The epitaxial layer EP1 is formed on the upper surface of the fin FB so as to bury in each groove, and is in contact with the upper surface of the fin FB. The epitaxial layer EP1 is comprised, for example, of silicon phosphide (SiP) or silicon carbide (SiC).

A diffusion region D1, which is an n-type semiconductor region, is formed from the upper surface of each of the pair of epitaxial layers EP1 sandwiching the gate electrode G1 to an intermediate depth of the epitaxial layer EP1 of the gate electrode G1. Since the lower end of the diffusion region D1 is located under compared to the uppermost surface of the fin FB, a part of the diffusion region D1 and a part of the fin FB are adjacent to each other in the X direction. The lower end of the diffusion region D1 may reach the fin FB located beneath the epitaxial layer EP1. One of the pair of diffusion regions D1 sandwiching the gate electrode G1 composes a drain region LD1 (refer to FIG. 1) and the other of the pair of diffusion regions D1 composes a source region LS1 (see FIG. 1). As described above, the source/drain region sandwiching the gate electrode G1 is formed in the epitaxial layer EP1. The gate electrode G1, the drain region LD1 and the source region LS1 compose an n-type transistor QN.

A silicide layer is not formed in upper surface (upper surface of the epitaxial layer EP1) of the diffusion region D1. That is, the upper surface of the diffusion region D1 is exposed from the silicide layer. In other words, upper surface of the diffusion region D1 is separated from any silicide layer and is not in contact with the silicide layer.

In pMIS region 1C, the gate electrode G2 is formed on each of the upper surface of fin FC and the side surface of the fin FC via the insulating film IF9 functioning as a gate insulating film, the insulating film HK functioning as a gate insulating film and the metallic film CP. That is, the insulating film HK is formed on the insulating film IF9, the metal film CP is formed on the insulating film HK, and the gate electrode G2 is formed on the metal film CP. The insulating film HK and the metal film CP continuously cover the bottom surface and the side surface of the gate electrode G2.

The insulating film IF9 is made of, for example, a silicon oxide film. The insulating film HK is an insulating film having a dielectric constant (relative dielectric constant) higher than that of the silicon nitride film, i.e., a so-called High-k film (high dielectric constant film). The metal film CP is made of, for example, a titanium nitride (TiN) film. The gate electrode G2 includes a metal film MF3 covering upper surface and the side surface of the insulating film HK, and a metal film MF4 formed on the insulating film HK with the metal film MF3 interposed therebetween. That is, the metal film MF3 continuously covers the lower surface and the side surface of the metal film MF4. The metallic film MF3 is a work-function film for adjusting the threshold value of the p-type transistor QP. The metal film MF3 is made of, for example, titanium aluminum (TiAl), and the metal film MF4 is made of, for example, tungsten (W).

An insulating film IF10 made of, for example, a silicon nitride film is formed on the insulating film HK and the gate electrode G2. In the lateral direction (Y direction) of the fin FC, the gate electrode G2 extends continuously along the upper surface of the device isolation film EI. The side surface of the pattern comprised of the insulating film IF9, the insulating film HK, the gate electrode G2 and the insulating film IF10 is covered with the sidewall spacer SW.

The grooves are formed in the upper surface of the fin located on both sides of the gate electrode G2 in the X-direction in plan view. The bottom surface of these grooves reaches the mid-depth of the fin FC located above compared to the upper surface of the device isolation film EI. An epitaxial layer EP2 is formed inside each of the trenches. The epitaxial layer EP2 has a configuration similar to that of the epitaxial layer EP of the memory cell area 1A. That is, the epitaxial layer EP2 has a width larger than the width of the fin FC in the Y-direction, and the upper end of the epitaxial layer EP2 protrudes upward from the upper surface of the fin FC. The epitaxial layer EP2 is made of, for example, SiGe. The epitaxial layer EP2 is formed on the upper surface of the fin FC so as to fill the groove, and are in contact with upper surface of the fin FC.

A diffusion region D2, which is a p-type semiconductor region, is formed from each upper surface of the pair of epitaxial layers EP2 sandwiching the gate electrode G2 to an intermediate depth of the epitaxial layer EP2 of the gate electrode G2. Since the lower end of the diffusion region D2 is located below the uppermost surface of the fin FC, a part of the diffusion region D2 and a part of the fin FC are adjacent to each other in the X direction. The lower end of the diffusion region D2 may reach the fin FC located beneath the epitaxial layer EP2. Of the pair of diffusion regions D2 sandwiching the gate electrode G2, one composes a drain region LD2 (see FIG. 1), the other composes a source region LS2 (see FIG. 1). As described above, the source/drain region sandwiching the gate electrode G2 is formed in the epitaxial layer EP2. The gate electrode G2, the drain region LD2 and the source region LS2 compose a p-type transistor QP.

A silicide layer is not formed in upper surface (upper surface of the epitaxial layer EP2) of the diffusion region D2. That is, upper surface of the diffusion region D2 is exposed from the silicide layers. In other words, upper surface of the diffusion region D2 is separated from any silicide layer and is not in contact with the silicide layer.

Further, in each of the memory cell region 1A, nMIS region 1B, pMIS region 1C, an interlayer insulating film IL1, IL2 is formed in order on each of the fins FA, FB, and FC, and the device isolation film EI. Upper surface of each of the interlayer insulating film IL1, the sidewall spacer SW, and the insulating film IF10 is flattened on substantially the same plane, and is located at the same height as each other. Upper surface of each of the control gate electrode CG and the memory gate electrode MG is located, for example, at a position lower than upper surface of each of the interlayer insulating film IL1, the sidewall spacer SW, and the insulating film IF10. Upper surface of the silicide layer S1 on each of the control gate electrode CG and the memory gate electrode MG is located, for example, at a position higher than upper surface of each of the interlayer insulating film IL1, the sidewall spacer SW, and the insulating film IF10.

However, in the memory cell region 1A, each of the upper surface of the fin FA in which the diffusion region SD is formed and the side surface of the fin FA in which the diffusion region SD is formed is exposed from the interlayer insulating film IL1, and is covered with the interlayer insulating film IL2. That is, the interlayer insulating film IL1 is not formed between the memory gate electrodes MG adjacent to each other without interposing the control gate electrode CG, and the interlayer insulating film IL2 is buried in the memory gate electrodes MG.

An insulating film IF8 is interposed between the interlayer insulating film IL1 and the device isolation film EI, the fins FA, FB, FC, the silicide layer S1, the epitaxial layer EP, EP1, EP2, and the sidewall spacers SW. The insulating film IF8 is an etching stopper film (liner insulating film) made of, for example, a silicon nitride film. Upper surface of the fins FA in the portions where the diffusion region SD are formed is exposed from the insulating film IF8. Upper surface of the device isolation film EI adjoining the fins FA in the portion where the diffusion region SD are formed in plan view is exposed from the interlayer insulating film IL1 and the insulating film IF8. The interlayer insulating film IL2 on the interlayer insulating film IL1 covers upper surface of each of the interlayer insulating film IL1, the sidewall spacers SW, the silicide layers S1 and S2, and the insulating film IF8. Upper surface of the interlayer insulating film IL2 is flattened. The interlayer insulating film IL1, IL2 is made of, for example, a silicon oxide film.

A plurality of wirings M1 are formed on the interlayer insulating film IL2. Some of the wires M1 are electrically connected to the source region or the drain region through plugs PG provided in contact holes CH penetrating the interlayer insulating films IL2 and IL1. That is, the bottom surface of the plug PG electrically connected with the drain region of the memory cell region 1A is in direct contact with the upper surface of the epitaxial layer EP. The bottom surface of the plug PG electrically connected with the source region of the memory cell region 1A is in direct contact with the upper surface of the silicide layer S2. The bottom surface of the plug PG electrically connected with the source/drain region of nMIS region 1B is in direct contact with the upper surface of the epitaxial layer EP1. The bottom surface of the plug PG electrically connected with the source/drain region of pMIS region 1C is in direct contact with the upper surface of the epitaxial layer EP2.

The upper surface of the plug PG is flattened in substantially the same plane as the upper surface of the interlayer insulating film IL2. In present embodiment, the position of upper surface of the epitaxial layer EP is higher than the position of upper surface of the silicide layer S2. Therefore, in the vertical direction, the length of the plug PG connected to the epitaxial layer EP is smaller than the length of the plug PG connected to the silicide layer S2. Here, the vertical direction is a direction perpendicular to upper surface of semiconductor substrate SB, that is, a direction perpendicular to both the X direction and the Y direction.

Figure 34:
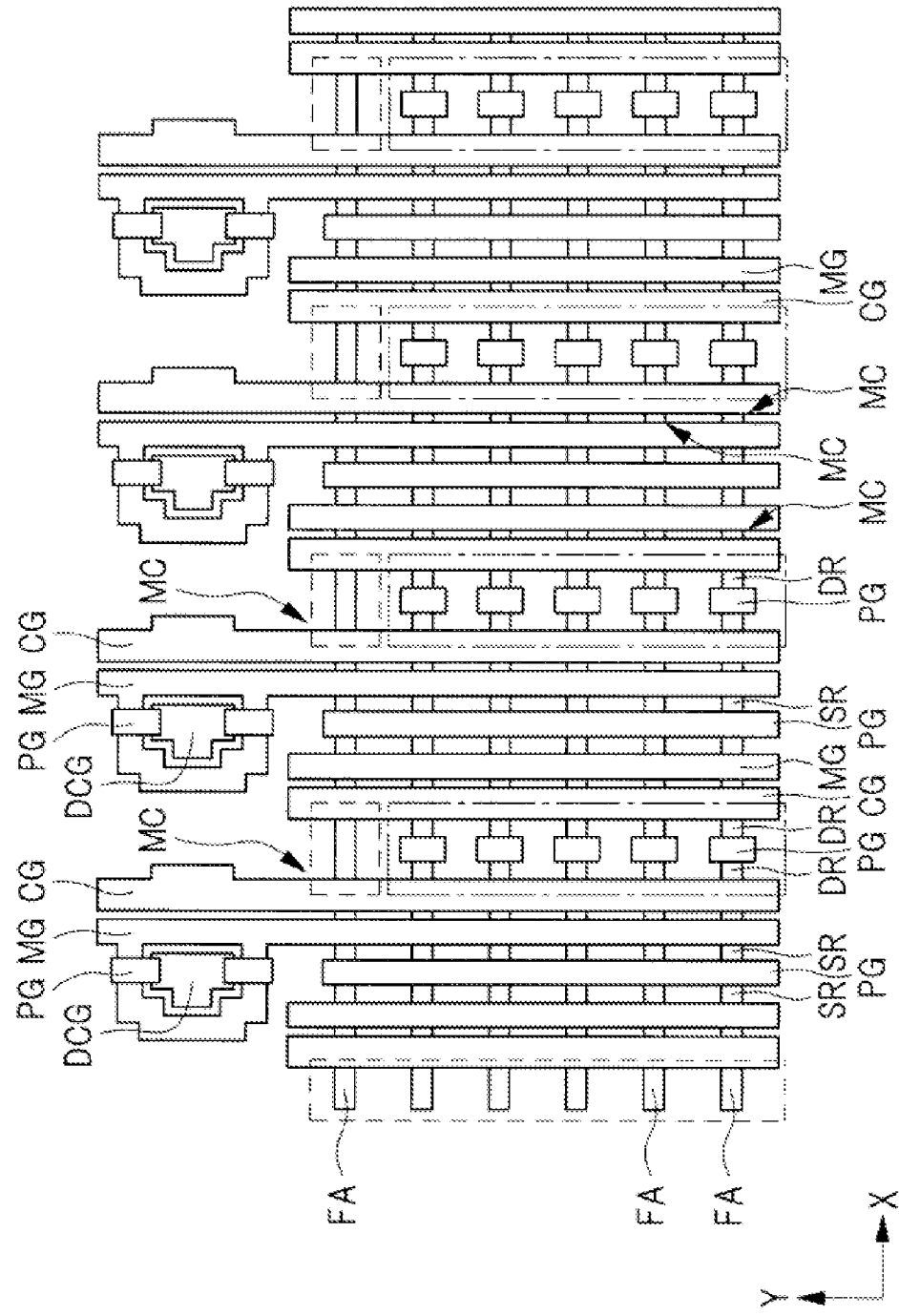
FIG. 34 is a plan view showing a semiconductor device according to a modified example of the embodiment of the present invention.

In addition, some other wirings M1 are electrically connected to the control gate electrode CG, the memory gate electrode MG, and the gate electrode G1 or G2 via plugs PG provided in contact holes CH penetrating the interlayer insulating film IL2. However, FIG. 4 and FIG. 5 do not show the plugs PG on the gate electrodes. FIG. 34 shows the plug PG connected to the memory gate electrode MG. Some of the plugs PG are electrically connected to the control gate electrode CG and the memory gate electrode MG via the silicide layer S1. A plug PG is in direct contact with the gate electrodes G1 and G2.

Each silicide layer S1 and S2 has a function of reducing the connection resistance between the plug PG and each of the source region, the control gate electrode CG, and the memory gate electrode MG, for example. The plug PG is a connection portion made of a metal film mainly containing tungsten (W). The plugs PG connected to the epitaxial layers EP, EP1, and EP2 are in contact with the semiconductor layer (epitaxial layer) without intervention of the silicide layer. However, the epitaxial layers EP, EP1, and EP2 are wider than the fins FA, FB, and FC. Therefore, even if the plug PG is not connected via the silicide layer, the connection resistances between the plug PG and each epitaxial layer EP, EP1, and EP2 can be reduced.

As shown in FIG. 5, each of the side surfaces located on both sides, respectively, of the fin FA including the diffusion region SD is covered with an insulating film IF8. Therefore, the silicide layers S2 cover only upper surface of the fins F A. The side surface of each of the epitaxial layer EP and the fin FA located below the epitaxial layer EP is covered with an insulating film IF8. Similarly, the side surface of each of the epitaxial layer EP1, EP2, the fin FB and the fin FC is covered with an insulating film IF8.

In the Y-direction, the width of the plug PG may be larger or smaller than the width of each epitaxial layer EP, EP1, and EP2 to be connected. However, in the Y-direction, the width of the plug PG connected to each epitaxial layer EP, EP1, or EP2 is larger than the width of the fin. The plug PG electrically connected to the source region of the memory cell region 1A extends in the Y direction, and the length of the plug PG in the Y direction is larger than the width of the fins FA in the Y direction. The plugs PG electrically connected to the source regions of the memory cell regions 1A are electrically connected to the plurality of source regions arranged in the Y-direction, respectively, as shown in FIG. 34.

Although a structure in which the source/drain region composing each transistor has no extension region has been described here, the source/drain region may have an extension region therein. In other words, the source/drain region having Lightly Doped Drain structure may be formed. The extension region is a semiconductor region in contact with the diffusion region DD, D1, or D2, and its conductivity type is the same as that of the adjacent diffusion region DD, D1, or D2. The impurity concentration of the extension region is lower than that of the adjacent diffusion region DD, D1, or D2. In each of the upper surface of each fin FA, FB or FC and the side surface of each fin FA, FB or FC, the extension region is formed closer to the channel region than the neighboring diffusion region DD, D1 or D2. The channel region herein refers to a region in which a channel is formed during operation of a transistor.

<Operation of Non-Volatile Memory>

Next, an operation example of the non-volatile memory will be described with reference to FIG. 33.

FIG. 33 is a table showing an example of the conditions for applying a voltage to each portion of the selected memory cell during "WRITE", "ERASE" and "READ". In the table of FIG. 33, voltages to be applied to the respective portion of the memory cell (selected memory cell) MC shown in FIG. 3 at the time of "WRITE", "ERASE" and "READ" are described. The table of FIG. 33 shows the voltage Vmg applied to the memory gate electrode MG, the voltage Vs applied to the source region, and the voltage Vcg applied to the control gate electrode CG. Further, the table of FIG. 33 shows the voltage Vd applied to the drain region, and the voltage Vb applied to the p-type well PW1. Note that what is shown in the table of FIG. 33 is a suitable example of the voltage application condition, and is not limited to this, and can be variously changed as necessary. Here, an injection of an electron into the silicon nitride film NF (see FIG. 3), which is the charge storage portion in the insulating film C1 of the memory transistor, is defined as "WRITING", and an injection of a hole is defined as "ERASING".

As a writing system, a writing method (hot electron injection writing method) in which writing is performed by hot electron injection by source side injection is used. This write scheme is called SSI (Source Side Injection: Source-Side Injection) scheme. For example, writing is performed by applying a voltage as shown in the column of "WRITE" in FIG. 33 to each portion of the selected memory cell in which writing is performed, and by injecting an electron into the silicon nitride film NF composing the insulating film C1 of the selected memory cell.

In the write operation, for example, 1.5V is applied to the drain region and 6V is applied to the source region. Therefore, the current flows from the source region memory gate electrode MG side to the drain region (control gate electrode CG side). The carriers (electrons) flow from the drain region DR (on the control gate electrode CG side) to the source region SR (on the memory gate electrode MG side). That is, here, the semiconductor region (drain region DR) located on the control gate electrode CG side functions as a source, and the semiconductor region (source region SR) located on the memory gate electrode MG side functions as a drain.

At this time, hot electrons are generated in a channel region under the insulating film C1 located between the memory gate electrode MG and the control gate electrode CG, and are injected into the silicon nitride film NF which is a charge accumulation portion in the insulating film C1 under the memory gate electrode MG. The injected hot electrons are captured by the trap level in the silicon nitride film NF of the insulating film, the threshold voltage of the memory transistor rises. That is, the memory transistor MTR is changed to be the "WRITE" state.

As an erasing method, an erasing method in which erasing is performed by injecting hot holes by BTBT (Band-To-Band Tunneling (band-to-band tunneling), which is called a so-called BTBT method, is used. That is, erasing is performed by injecting holes generated by BTBT (Band-To-Band Tunneling) into the charge-storage portion (silicon nitride film NF in insulating). Such an erasing method is called a hot hole injection erasing method. For example, a voltage as shown in the column of "ERASE" in FIG. 33 is applied to each portion of the selected memory cell to be erased. As a result, a hole is generated by BTBT phenomena and accelerated by an electric field, thereby injecting the hole into the silicon nitride film NF composing the insulating film C1 of the selected memory cell. The threshold voltage of the memory transistor is lowered by this injection. That is, the memory transistor MTR is changed to be the "ERASE" state.

At the time of reading, for example, a voltage as shown in the column of "READ" in FIG. 33 is applied to each portion of the selected memory cell to be read. The voltage Vmg applied to the memory gate electrode MG at the time of reading is set to a value between the threshold voltage of the memory transistor in the write state and the threshold voltage of the memory transistor in the erase state. Thus, the write state and the erase state are discriminated.

In the read operation, for example, 1.5V is applied to the drain region and 0V is applied to the source region. Therefore, the current flows from the drain region DR (on the side of the control gate electrode CG) to the source region SR (on the side of the memory gate electrode MG). The carriers (electrons) flow from the source region SR (on the memory gate electrode MG side) to the drain region DR (on the control gate electrode CG side). That is, when the read operation and the write operation are compared, the role of each of a source and a drain is interchanged between the semiconductor region located on the control gate electrode CG side and the semiconductor region located on the memory gate electrode MG side.

<Effect of Semiconductor Device>

Figure 35:
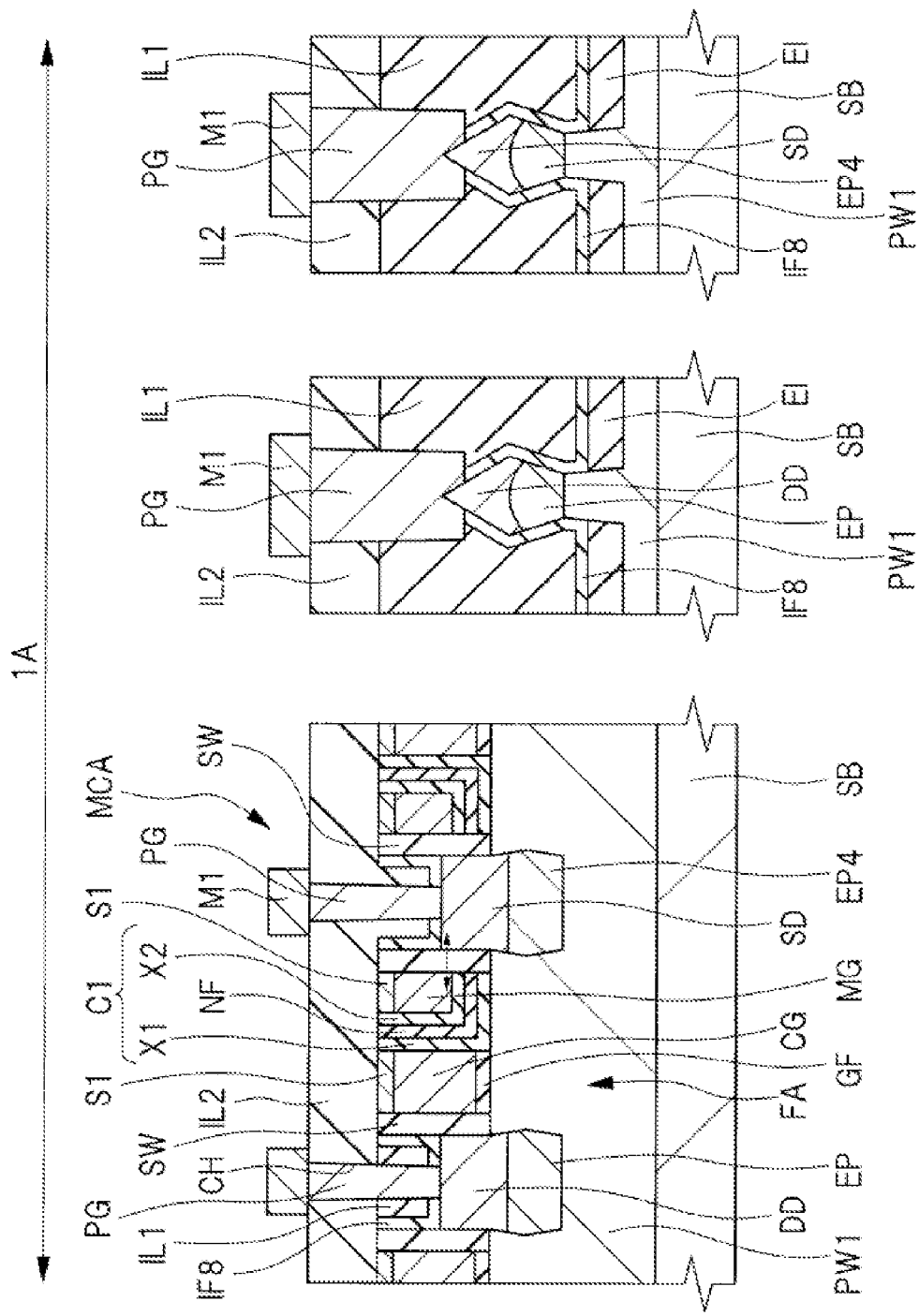
FIG. 35 is a cross section view explaining a manufacturing process of a semiconductor device according to a comparative example.

In FINFET, since the width of the fin in the latitudinal direction is small, when the source/drain region is formed only in the fin, the contact area between the plug connected with the source/drain region and the fin becomes small. Therefore, there is a problem that the connection resistance between the plug and the source/drain region increases. Therefore, in the comparative examples shown in FIG. 35, the epitaxial layers EP and EP4 covering upper surface of the fin FA and having widths larger than those of the fin FA in the short direction are formed. Here, a diffusion region DD composing a drain region is formed in the epitaxial layer EP, and a diffusion region SD composing a source region is formed in the epitaxial layer EP4. FIG. 35 is a cross section view showing a comparative semiconductor device. FIG. 35 shows, in order from the left, a cross section along the longitudinal direction of the fin including the gate electrode and the source/drain region, a cross section along the latitudinal direction of the fin including the drain region, and a cross section along the latitudinal direction of the fin including the source region. In FIG. 35, unlike FIG. 4, the sidewall spacer SW having the stacked structure is shown as one film for easy understanding of the drawing.

In the comparative examples, epitaxial layers EP and EP4 each having a width larger than the fin FA are formed in the memory cell regions 1A by epitaxial growth. At this time, the upper end of the epitaxial layer EP4 may reach a position above the bottom surface of the memory gate electrode MG composing the memory cell MCA. At this time, the breakdown voltage between the memory gate electrodes MG and the source regions MG may be lowered as compared with the case where the diffusion regions are formed only in the fins FA without forming the epitaxial layers EP4. That is, as shown by arrows in FIG. 35, the distances between the diffusion region SD and the memory gate electrodes MG are smaller than when the epitaxial layers EP4 are not formed. A voltage higher than that of the drain region (diffusion region DD on the control gate electrode CG side) is applied to the source region (diffusion region SD on the memory gate electrode MG side). Therefore, when the epitaxial layers EP4 are formed on the source regions, dielectric breakdown is likely to occur between the memory gate electrodes MG and the source regions MG. As described above, the epitaxial layers EP4 grow to a position adjacent to the memory gate electrodes MG via the sidewall spacers, thereby lowering the breakdown voltage of the memory cells MCA.

When epitaxial layers are formed on the fins adjacent to the memory gate electrodes MG, stresses applied to FINFET channel regions increase. As a result, the flow direction of the current in the channel region under the memory gate electrode MG can be changed. That is, when the epitaxial layers EP4 are formed, the times required for rewriting the memory cells MCAs vary, and the reliability of semiconductor device decreases.

In present embodiment, as shown in FIG. 3, epitaxial layers EP are formed on the fins FAs adjacent to the control gate electrodes CG of the memory cell regions 1A. On the other hand, an epitaxial layer is not formed on the fin FA adjacent to the memory gate electrode MG, and a silicide layer S2 is formed.

Since the position of upper surface of the silicide layer S2 is lower than the position of the lower surface of the memory gate electrode MG, a drop in breakdown voltage between the memory gate electrode MG and the source region can be prevented as compared with the comparative example. By forming the silicide layer S2, the connection resistance between the source region and the plug PG can be reduced without forming an epitaxial layer.

In addition, by not forming the epitaxial layer on the source region side, the generation of stress applied to the channel region due to the formation of the epitaxial layer can be prevented. Therefore, it is possible to prevent the operation of the memory cell MC from fluctuating due to stress. As described above, the reliability of the semiconductor device can be improved.

<Method of Manufacturing Semiconductor Device>

Figure 6:
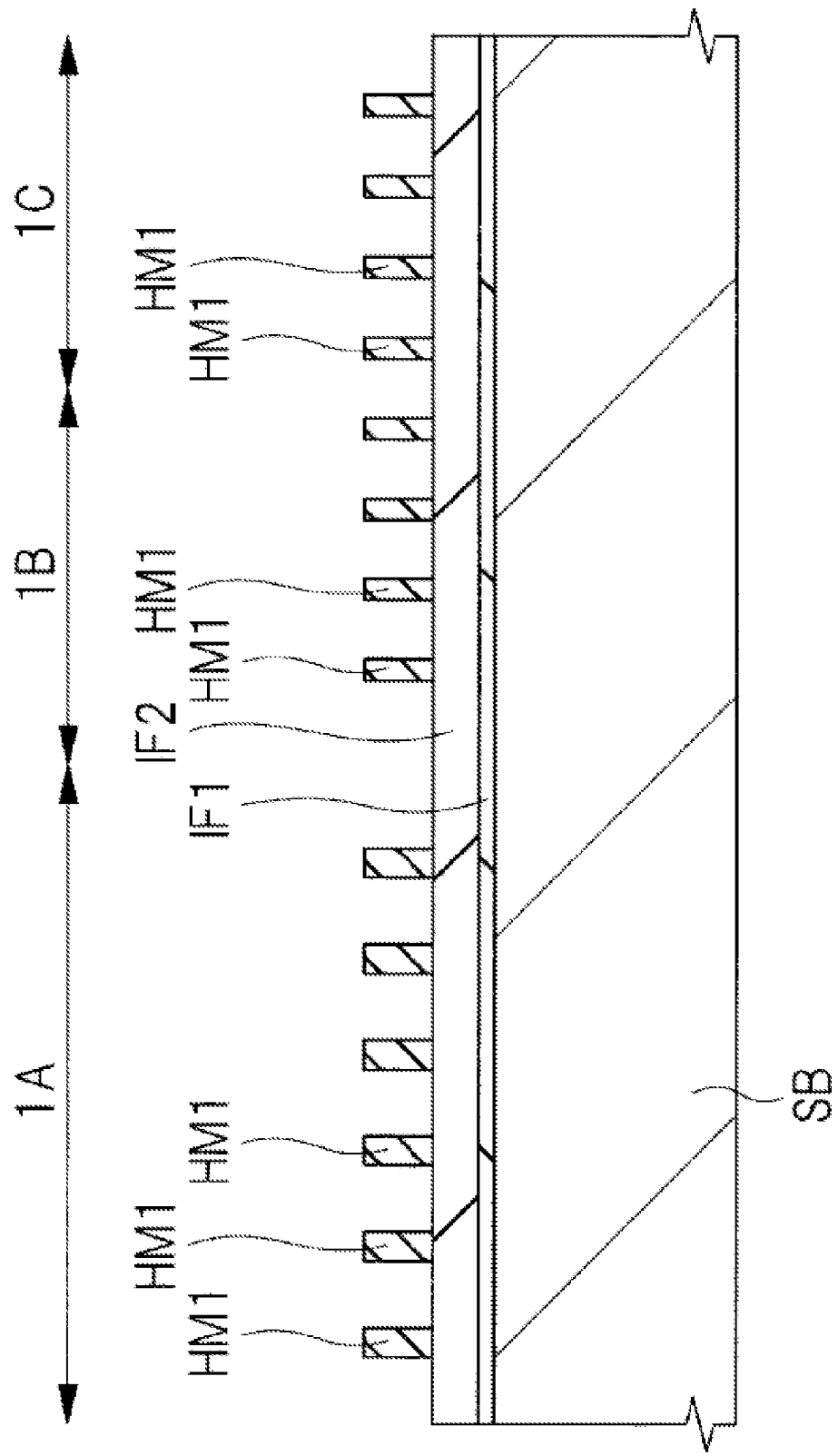
FIG. 6 is a cross section view explaining a manufacturing process of the semiconductor device according to the embodiment of the present invention.
Figure 7:
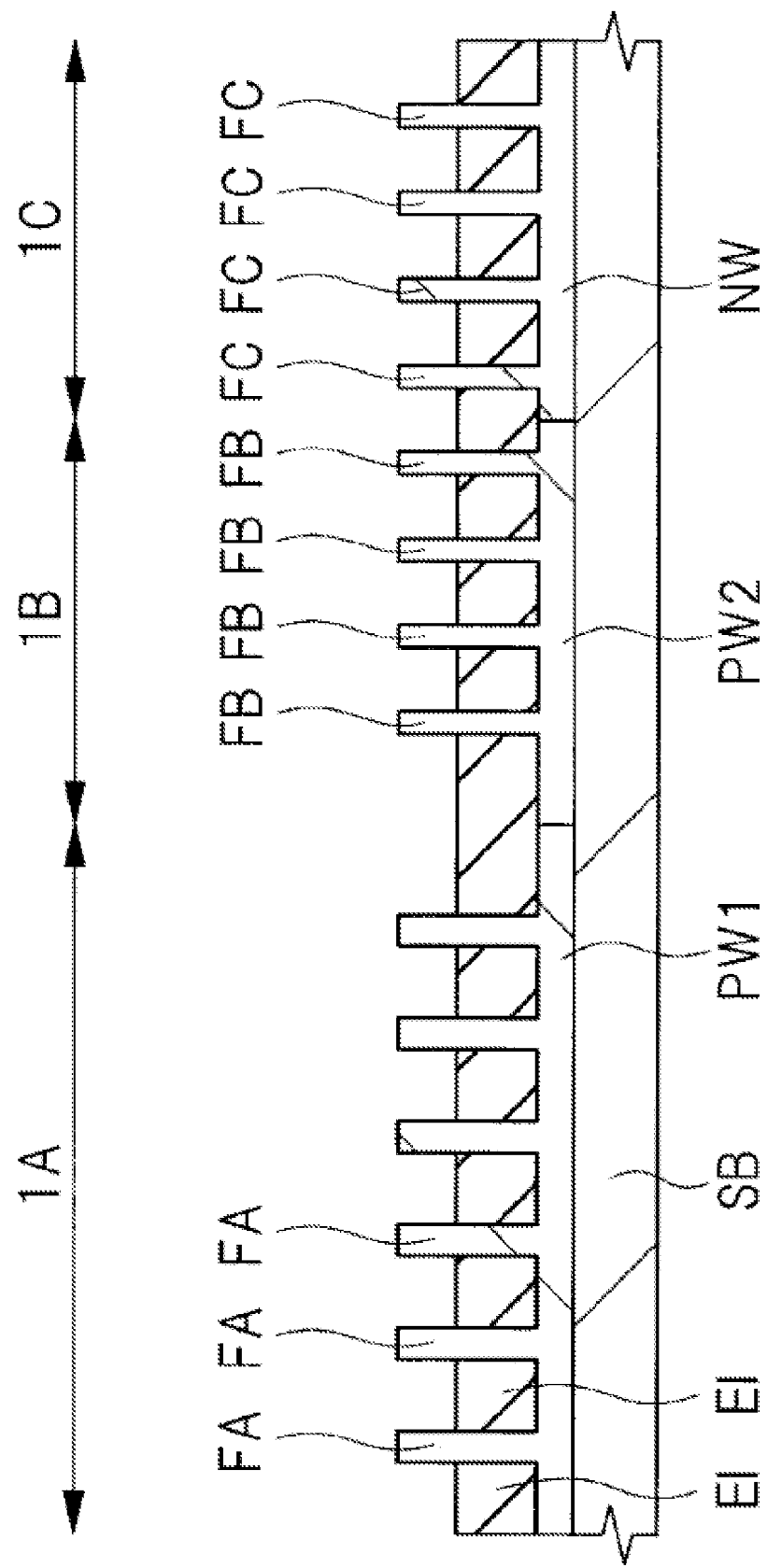
FIG. 7 is a cross section view explaining the manufacturing process of the semiconductor device following to FIG. 6.

The method of manufacturing a semiconductor device of present embodiment will be described below with reference to FIGS. 6 to 32. FIGS. 6-32 are a cross section view explaining a manufacturing process of the semiconductor device according to the embodiment of the present invention. FIGS. 6, 7 and 22 are a cross section view along the Y-direction. FIG. 22 is a cross section view showing the same plurality of regions as FIG. 5.

FIGS. 6 to 21 and FIGS. 23 to 32 show a memory cell region 1A, nMIS region 1B and pMIS region 1C arranged in order from left to right. nMIS region 1B and pMIS region 1C are a region composing a logic circuit region. In FIGS. 9 to 14, a gate pattern which is a part of the memory cell area 1A (the left side of the drawing) is not shown, unlike the gate pattern of FIGS. 15 to 21 and 23 to 32, for the sake of clarity. In addition, if not specifically described below, the photoresist film is removed after being used as an etching mask or an ion implantation blocking mask.

First, as shown in FIG. 6, semiconductor substrate SBs are prepared. Thereafter, an insulating film IF1 and an insulating film IF2 are sequentially formed on upper surface of the prepared semiconductor substrate SB, and a plurality of hard masks HM1 are formed on the insulating film IF2. Semiconductor substrate SB is made of, for example, p-type monocrystalline silicon having a resistivity of about 1 to 10 Ωcm, and has an upper surface (main surface) and an opposing lower surface (back surface). The insulating film IF1 is made of, for example, a silicon oxide film, and can be formed by, for example, an oxidation method or a CVD (Chemical Vapor Deposition) method. The thickness of the insulating film IF1 is about 2 nm to 10 nm. The insulating film IF2 is made of, for example, a silicon nitride film, and has a thickness of about 20 nm to 100 nm. The insulating film IF2 is formed by, for example, a CVD method.

The hard mask HM1 is made of an insulating film formed in a sidewall spacer shape on the side surface of a silicon pattern (not shown) formed on the insulating film IF2. After the insulating film is formed, the silicon pattern and a part of the insulating film are removed, so that only a plurality of hard masks HM1 of the insulating film extending along upper surface of semiconductor substrate SB remain on the insulating film IF2. The hard mask HM1 is made of, for example, a silicon oxide film.

Next, as shown in FIG. 7, anisotropic dry-etching is performed on the insulating films IF2, IF1 and semiconductor substrate SBs using the hard mask HM1 as a mask. As a result, patterns, i.e., fins FA, FB, and FC, which are portions of semiconductor substrate SB processed into a plate shape, are formed immediately below the hard mask HM1. Here, trenches are formed by digging upper surface of semiconductor substrate SBs 100-250 nm in areas exposed from the hard mask HM1. Thereby, fins FA, FB and FC having a height of 100 to 250 nm from the bottom surface of the groove can be formed.

Subsequently, an insulating film made of a silicon oxide film or the like is deposited on semiconductor substrate SB so as to cover the fins FA, FB, FC, the insulating film IF1 and IF2. Subsequently, the insulating film is polished by a Chemical Mechanical Polishing method to expose upper surface on IF2 of the insulating film. Thus, an element isolation film EI made of the insulating film is formed. The hard mask HM1 is removed by the CMP process. Note that the hard mask HM1 may be removed prior to forming the insulating film forming the device isolation film EI.

Subsequently, the insulating film IF1, IF2 is removed. Subsequently, the upper surface of the element isolation film EI is etched to cause the upper surface of the element isolation film EI to recede in height. This exposes a portion of the sides and upper surface of the fins FA, FB and FC, respectively.

Subsequently, an impurity is introduced into upper surface of semiconductor substrate SB by ion implantation. Thus, the p-type well PW1 is formed in the fin FA of the memory cell region 1A, the p-type well PW2 is formed in the fin FB of nMIS region 1B, and the n-type well NW is formed in the fin FC of pMIS region 1C. The p-type well PW1, PW2 is formed by implanting a p-type impurity (e.g., boron (B)). The n-type well NW is formed by implanting an n-type impurity (for example, phosphorus (P) or arsenic (As)). Each well is formed extending entirely within each fin and a portion of semiconductor substrate SBs beneath each fin.

Figure 8:
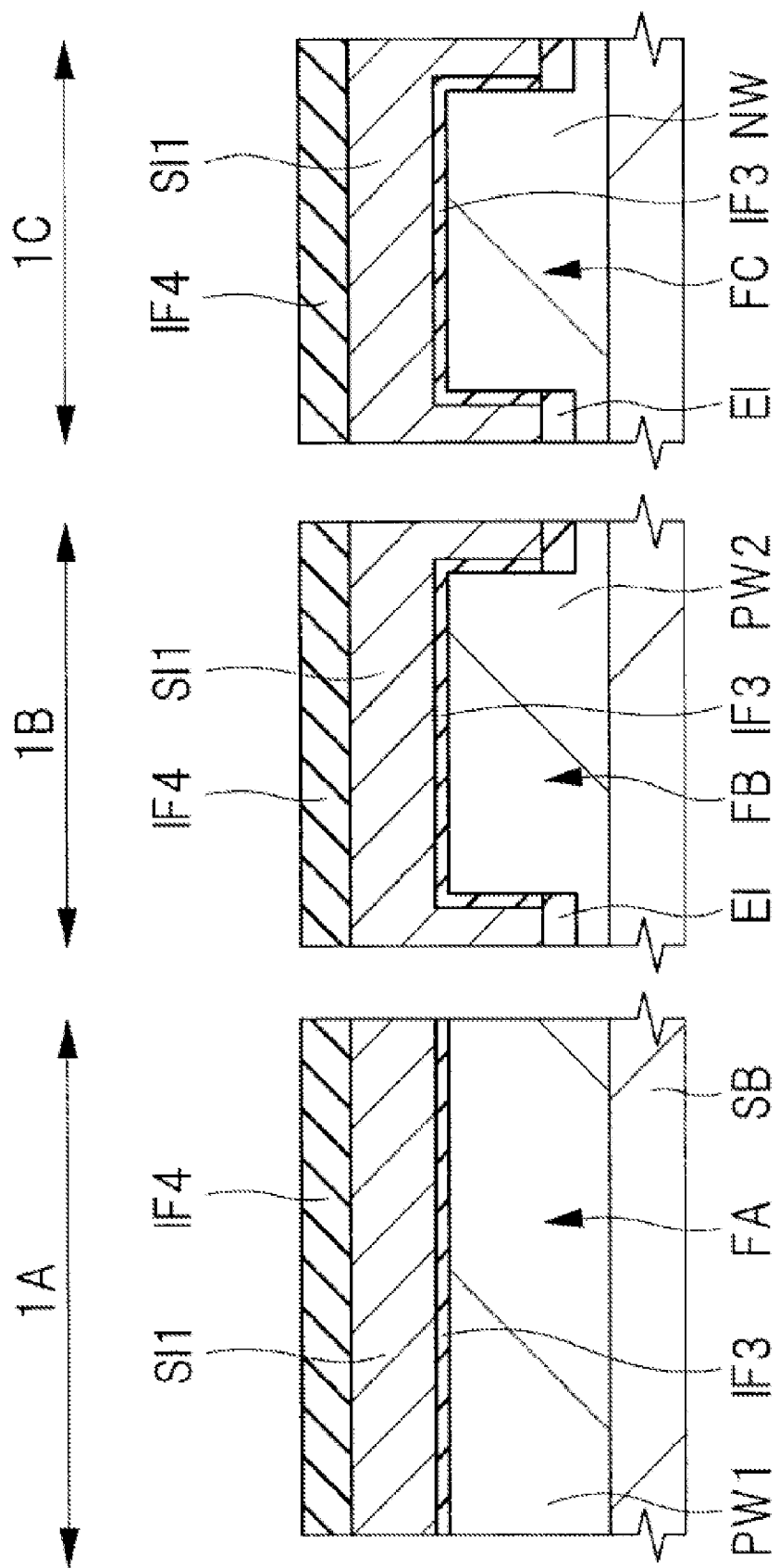
FIG. 8 is a cross section view explaining the manufacturing process of the semiconductor device following to FIG. 7.

Next, as shown in FIG. 8, an insulating film IF3 covering the upper and side surfaces of each of the fin FA, the fin FB and the fin FC is formed. The insulating film IF3 can be formed by, for example, a thermal oxidation method, and is made of, for example, a silicon oxide film having a thickness of about 2 nm. Subsequently, a semiconductor film SI1 having a thickness equal to or larger than the height of each of the fins FA, FB, and FC is deposited on the insulating film IF3 by the CVD method or the like. Subsequently, upper surface of the semiconductor film SI1 is planarized by a CMP method or the like, thereby forming a semiconductor film SI1 having a flat upper surface. Thereafter, an insulating film IF4 is formed on SI1 of the semiconductor film by, e.g., CVD. The semiconductor film SI1 is made of, for example, a polysilicon film, and the insulating film IF4 is made of, for example, a silicon nitride film. Even after the CMP-based polishing process is performed on the semiconductor film SI1 as described above, the semiconductor film SI1 remains on the upper surface of each of the fins FA, FB, and FC.

Figure 9:
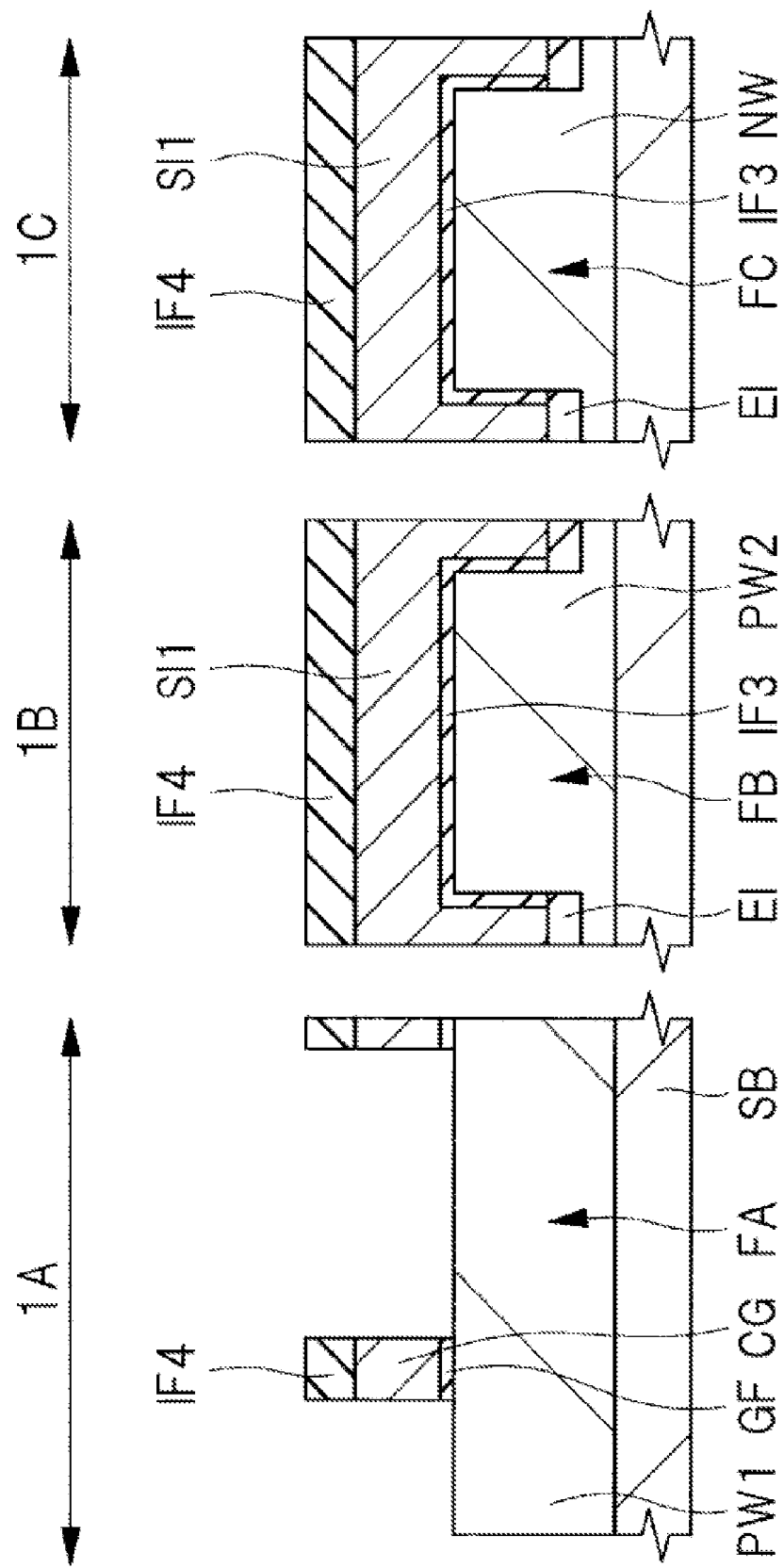
FIG. 9 is a cross section view explaining the manufacturing process of the semiconductor device following to FIG. 8.

Next, as shown in FIG. 9, a photo resist film (not shown) is formed to cover a part of the fins FA in the memory cell region 1A and nMIS region 1B and pMIS region 1C. The photoresist film includes a resist pattern extending in the Y direction, the resist pattern being formed so as to cover a part of each of the plurality of fins FA arranged in the Y direction in the memory cell area 1A. In the regions next to the resist patterns, upper surface of the fins F A is exposed from the photoresist film.

Subsequently, a part of each of the insulating film IF4 and the semiconductor film SI1 in the memory cell area 1A is removed by etching using the photoresist film as a mask. As a result, the upper surface of the device isolation film EI in the memory cell area 1A and a front surface of the insulating film IF3 in the memory cell area 1A are exposed. That is, a part of upper surface and a part of the side surface of the fin FA are exposed from the insulating film IF4 and the semiconductor film SI1. As a result, the control gate electrodes CG of the semiconductor film SI1 are formed on the fins FA. As a result, the gate insulating film GF composed of the insulating film IF3 between the control gate electrode CG and the fin FA is formed.

Here, a case will be described in which the insulating film IF3 covering the surface of the fin FA exposed from the control gate electrode CG is removed by the above-described etching and a cleaning process performed thereafter, and the surface of the fin FA is exposed. However, it may remain that the upper and side surfaces of the fin FA are covered with the insulating film IF3.

Figure 10:
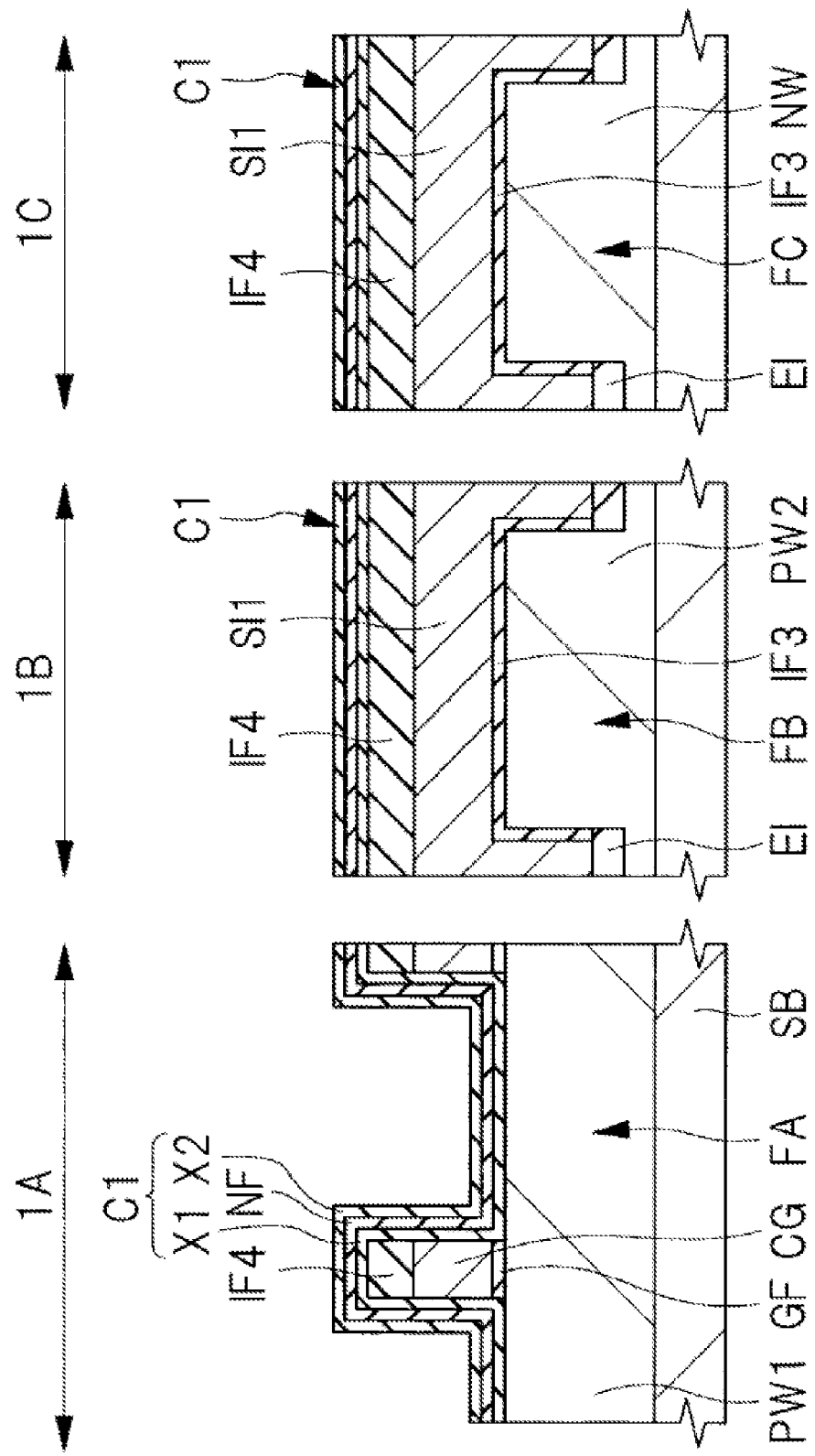
FIG. 10 is a cross section view explaining the manufacturing process of the semiconductor device following to FIG. 9.

Next, as shown in FIG. 10, a silicon oxide film (bottom oxide film) X1, a silicon nitride film NF, and a silicon oxide film (top oxide film) X2 are formed in this order on semiconductor substrate SB. As a result, the insulating film C1 having a stacked structure composed of the silicon oxide film X1, the silicon nitride film NF, and the silicon oxide film X2 is formed. That is, the insulating film C1 is an ONO film. The silicon oxide film X1 can be formed by an oxidation method, a CVD method, or the like. The silicon nitride film NF and the silicon oxide film X2 are formed (deposited) by, for example, a CVD method.

The insulating film C1 covers the upper surface of the device isolation film EI and the upper and side surfaces of the fin FA. In addition, the insulating film C1 covers the upper surface and side surfaces of the laminated pattern comprised of the control gate electrode CG and the insulating film IF4. Note that the silicon nitride film NF is a film functioning as a charge storage film of a memory cell to be formed later, but a high-k film made of HfSiO or the like may be formed instead of the silicon nitride film NF. Instead of the silicon oxide film X2, an aluminum oxide (AlO) film may be formed.

Figure 11:
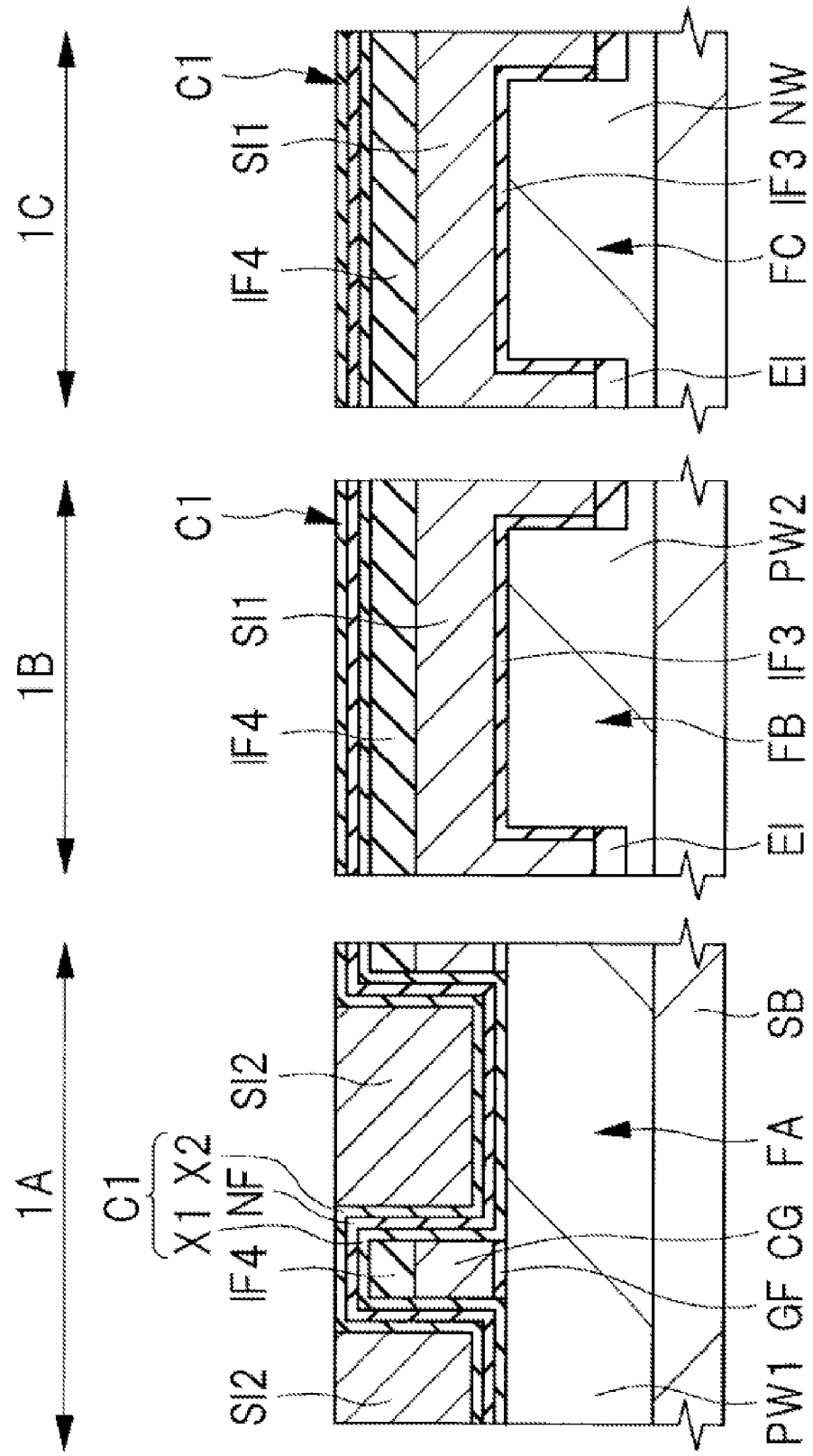
FIG. 11 is a cross section view explaining the manufacturing process of the semiconductor device following to FIG. 10.

Next, as shown in FIG. 11, a semiconductor film SI2 is formed on semiconductor substrate SB by, e.g., CVD. The semiconductor film SI2 is made of, for example, a polysilicon film and has a film thickness larger than that of a stacked body including the control gate electrodes CG and the insulating film IF4. Subsequently, upper surface on SI2 of the semiconductor film is polished by the CMP method to expose upper surface of the insulating film C1 on the insulating film IF4.

Figure 12:
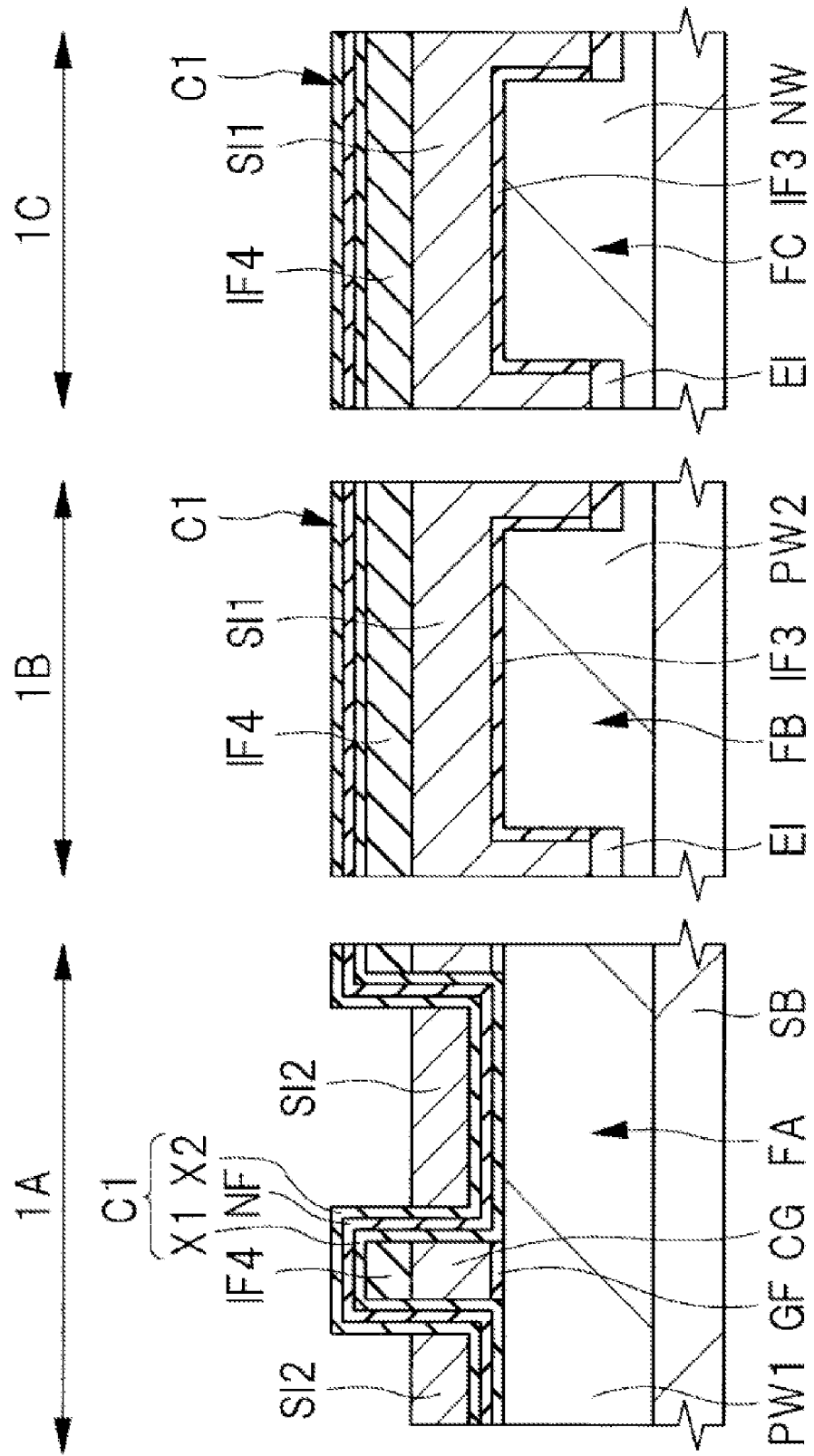
FIG. 12 is a cross section view explaining the manufacturing process of the semiconductor device following to FIG. 11.

Next, as shown in FIG. 12, the upper surface of the semiconductor film SI2 is made to recede by performing an etch-back process. As a result, the position of upper surface of the semiconductor film SI2 becomes substantially equal to the position of upper surface of the control gate electrode CG, for example.

Figure 13:
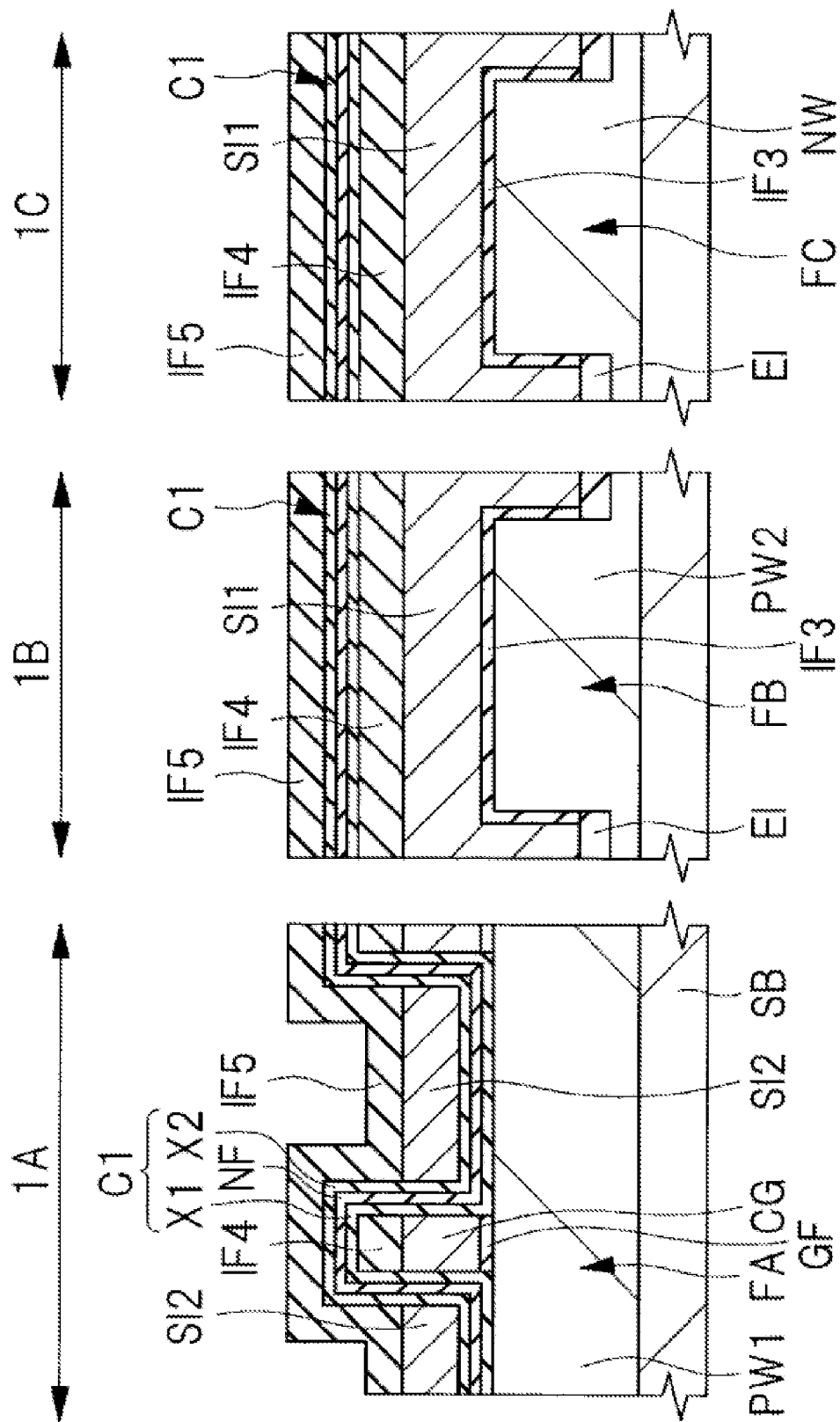
FIG. 13 is a cross section view explaining the manufacturing process of the semiconductor device following to FIG. 12.

Next, as shown in FIG. 13, an insulating film IF5 is formed on semiconductor substrate SB by, e.g., CVD. The insulating film IF5 is made of, for example, a silicon nitride film, covers the side surface of the insulating film IF4 and upper surface with the insulating film C1 interposed therebetween, and covers upper surface of the semiconductor film SI2.

Figure 14:
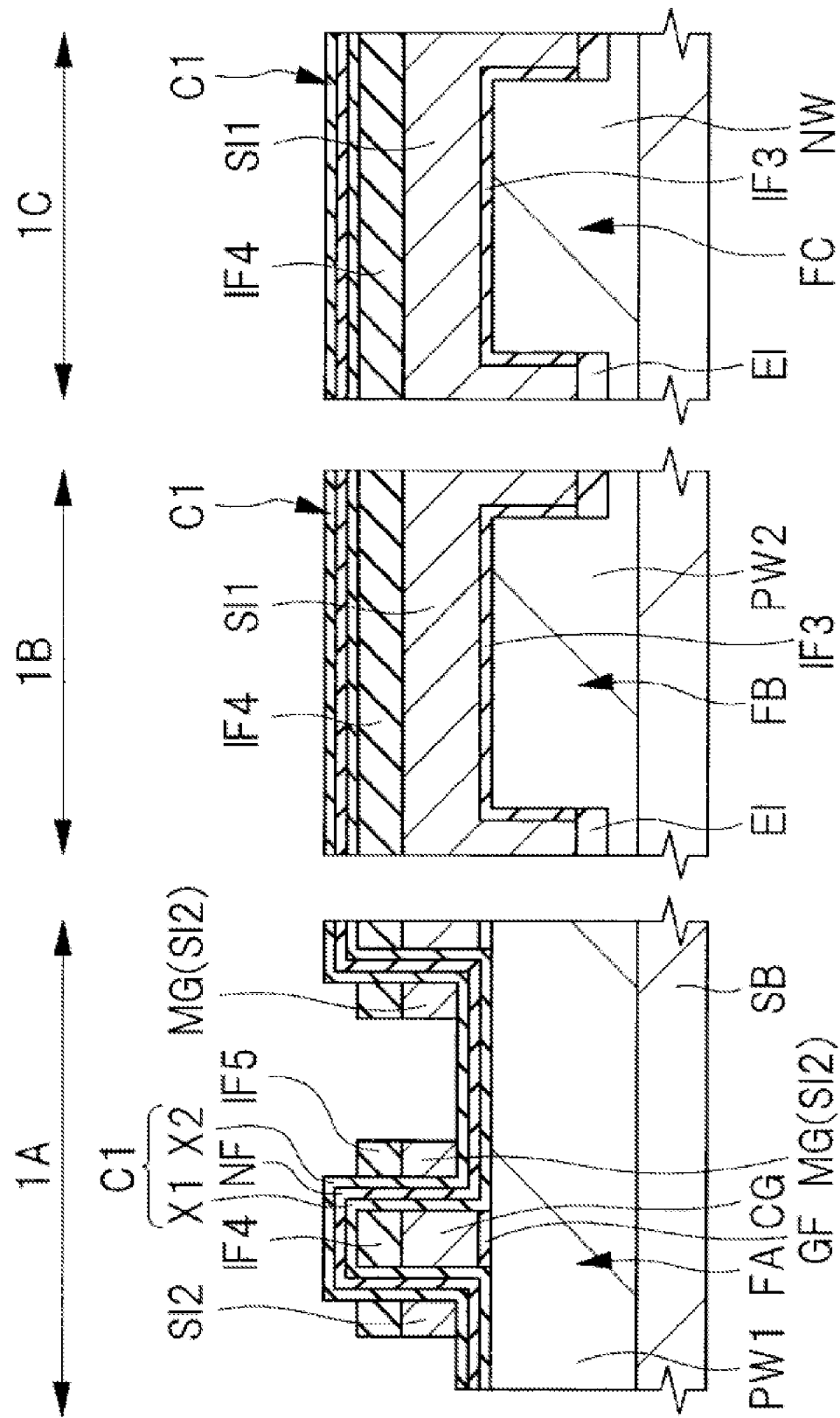
FIG. 14 is a cross section view explaining the manufacturing process of the semiconductor device following to FIG. 13.

Next, as shown in FIG. 14, a part of the insulating film IF5 is removed by dry-etching, thereby exposing upper surface of the insulating film C1 and a part of upper surface of the semiconductor film SI2. That is, the insulating film IF5 remains in a sidewall spacer shape on the side surface of the insulating film IF4 with the insulating film C1 interposed therebetween. Subsequently, the semiconductor film SI2 is processed by etching using the insulating film IF5 as a mask. As a result, the semiconductor film SI2 remains in the region adjacent to the side surface located on both sides of the control gate electrode CG. Also, the upper surface of the fin FA is exposed from the semiconductor film SI2 in the region other than the region adjacent to the side surface located on both sides of the control gate electrode CG.

The semiconductor film SI2 adjacent to one side surface of the control gate electrode CG in the gate length direction (X direction) via the insulating film C1 composes the memory gate electrode MG. The memory gate electrode MG extends in the Y direction so as to straddle the plurality of fins FA in parallel with the control gate electrode CG.

Figure 15:
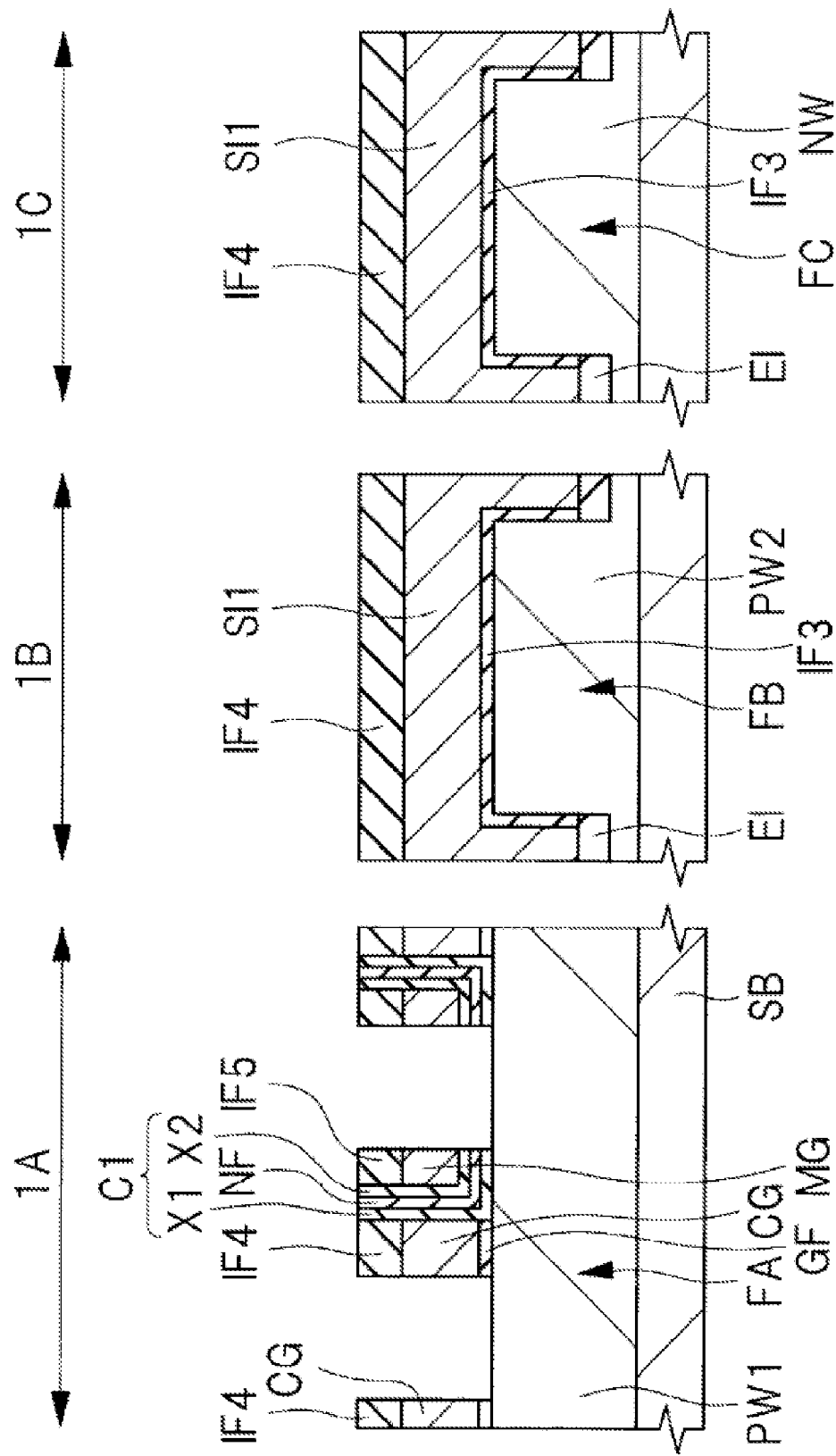
FIG. 15 is a cross section view explaining the manufacturing process of the semiconductor device following to FIG. 14.

Next, as shown in FIG. 15, a resist pattern (not shown) covering the memory gate electrode MG and the insulating film IF5 immediately above the memory gate electrode MG is formed, and then the memory gate electrode MG is etched using the resist pattern as a mask. Thus, the insulating film IF5 and the semiconductor film SI2 exposed from the resist pattern are removed. As a result, in the gate length direction, the memory gate electrode MG remains on one side surface of the control gate electrode CG via the insulating film C1, and the other side surface of the control gate electrode CG is exposed from the semiconductor film SI2.

Subsequently, the insulating film IF5 and the insulating film C1 not covered with the memory gate electrodes MG are removed by etching. As a result, upper surface of the insulating film IF4, upper surface of the fin FA, the side surface of the fin FA, and upper surface of the device isolation film EI are exposed. In addition, the side surface of the insulating film IF4 and the side surface of the control gate electrode CG that are not covered with the memory gate electrode MG are exposed. On the left side of the memory cell area 1A in FIG. 15, control gate electrodes CG (not shown in FIG. 14) are illustrated.

Figure 16:
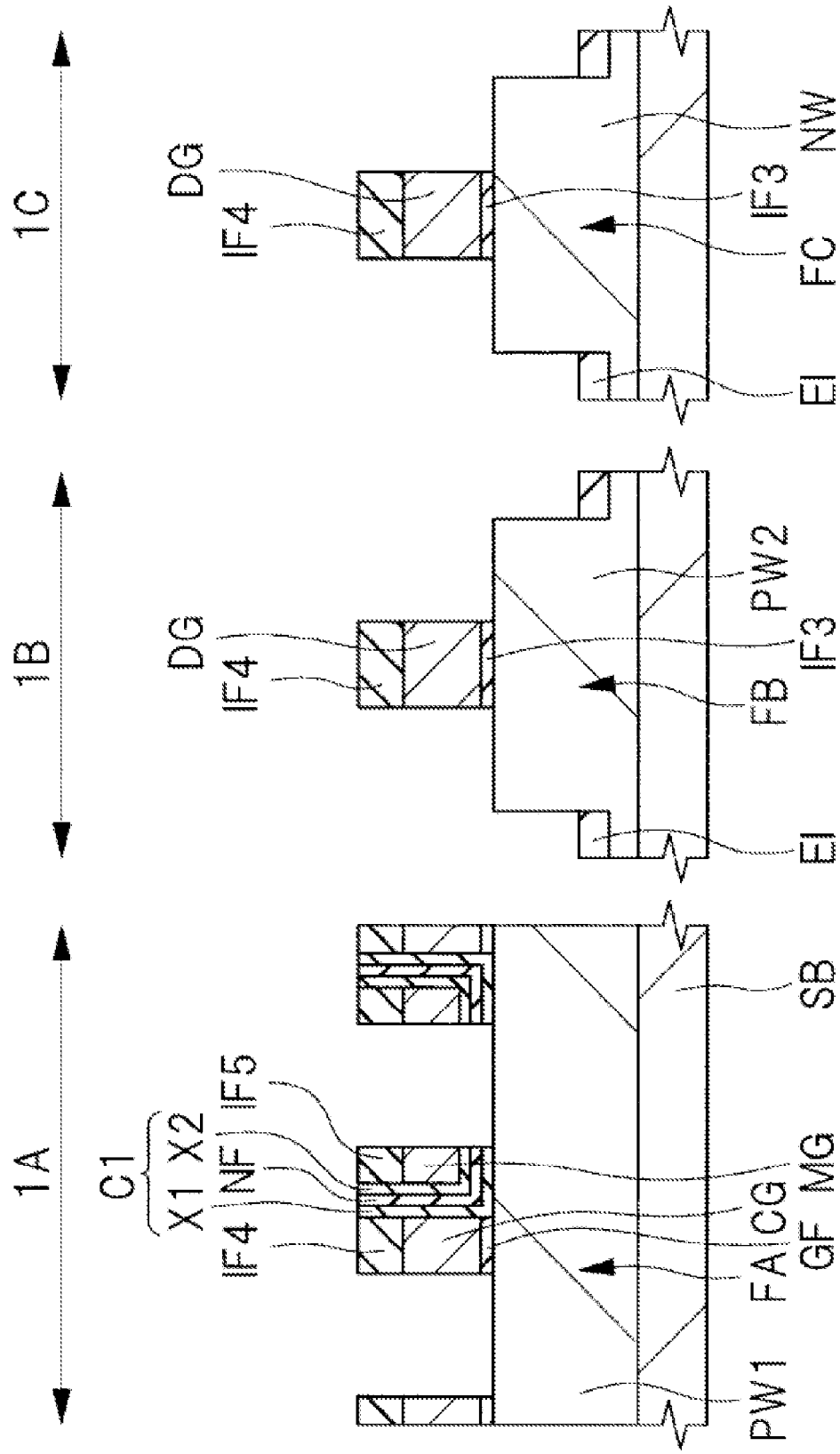
FIG. 16 is a cross section view explaining the manufacturing process of the semiconductor device following to FIG. 15.

Next, as shown in FIG. 16, a photo resist film (not shown) is formed to cover the memory cell region 1A and portions of the fins FB and FC of nMIS region 1B and pMIS region 1C. The photoresist film includes a resist pattern extending in the Y direction and formed so as to cover a portion of each of the plurality of fins FB arranged in the Y direction. The photoresist film includes a resist pattern extending in the Y direction and formed so as to cover a part of each of the plurality of fins FC arranged in the Y direction. In the regions next to the resist patterns, upper surface of each of the fins FB and FC is exposed from the photoresist film.

Subsequently, etching is performed using the photoresist film as a mask to remove portions of the insulating film IF4 and the semiconductor film SI1 in nMIS region 1B and pMIS region 1C, respectively. As a result, the upper surface of the device isolation film EI in each of nMIS region 1B and pMIS region 1C and a front surface of the insulating film IF3 in each of nMIS region 1B and pMIS region 1C are exposed. That is, a part of upper surface and a part of the side surface of each of the fins FB and FC are exposed from the insulating film IF4 and the semiconductor film SI1. As a result, dummy gate electrodes DG made of the semiconductor film SI1 are formed on the fins FB and FC with the insulating film IF3 interposed therebetween.

The dummy gate electrode DG is a film which is removed in a later step and replaced with a metal gate electrode, and does not remain in the completed semiconductor device. That is, the dummy gate electrode DG is a pseudo gate electrode. Here, the case that the insulating film IF3 covering the front surface of each of the fin FB and the fin FC that are exposed from the dummy gate electrodes DG is removed will be described.

After the formation process of the gate electrodes G1 and G2 described with reference to FIG. 16, an extension region may be formed before the formation process of an epitaxial layer described later with reference to FIG. 17. The extension region can be formed by introducing an impurity into each fin by an ion implantation method. When an extension region is formed in the memory cell region 1A or nMIS region 1B, an n-type impurity (for example, phosphorus (P) or arsenic (As)) is implanted into the fins FA or FB. When an extension region is formed in pMIS region 1C, a p-type impurity (e.g., boron (B)) is implanted into the fin FC.

Figure 17:
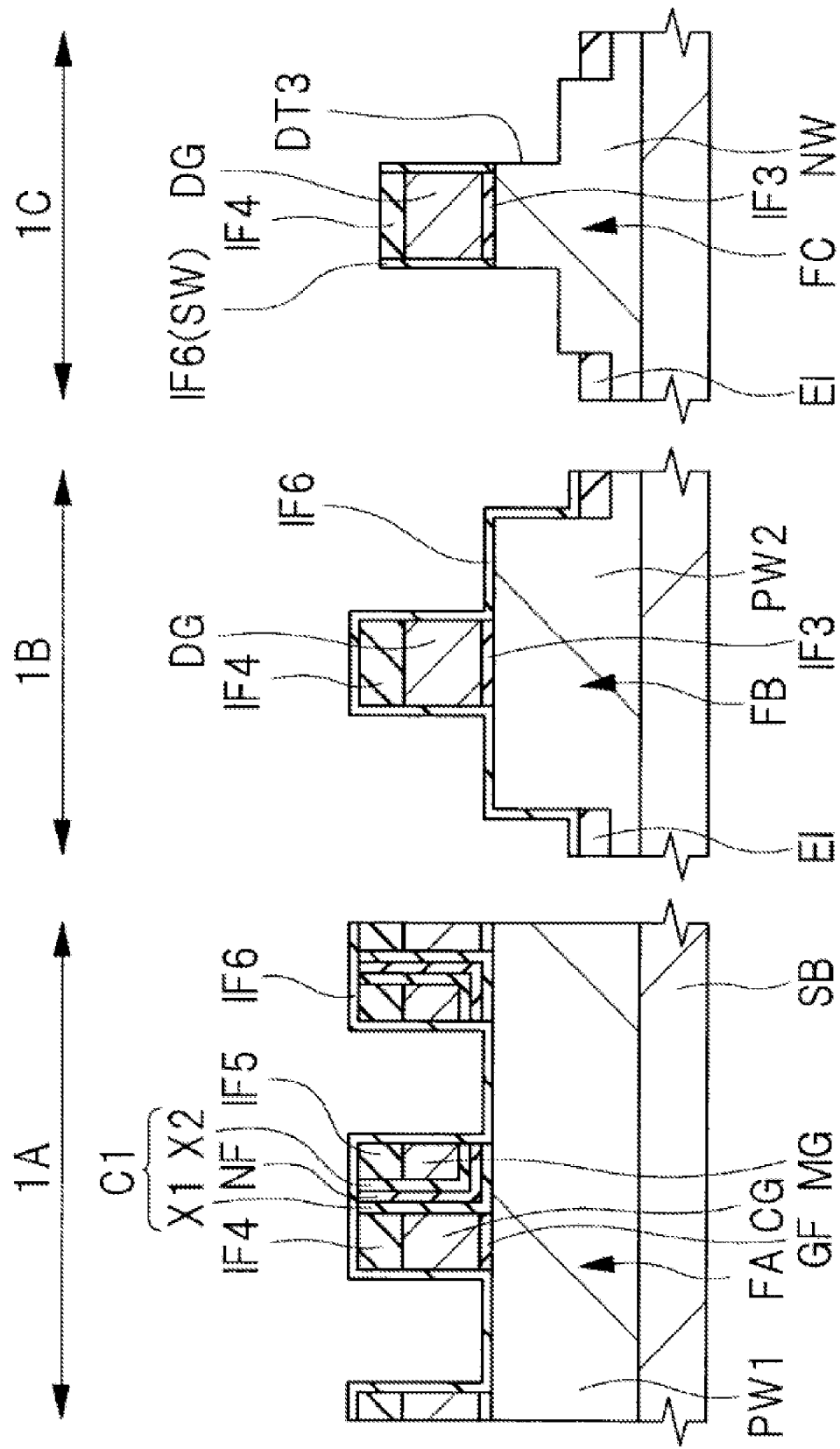
FIG. 17 is a cross section view explaining the manufacturing process of the semiconductor device following to FIG. 16.

Next, as shown in FIG. 17, an insulating film IF6 is formed on semiconductor substrate SB by, e.g., CVD. The insulating film IF6 is made of, for example, a silicon nitride film. The insulating film IF6 covers the front surface of each of the device isolation film EI, the fins FA, FB, FC, the control gate electrode CG, the memory gate electrode MG, the dummy gate electrode DG and the insulating films IF4 and IF5.

Next, a photo resist film (not shown) is formed to expose pMIS region 1C and cover the memory cell region 1A and nMIS region 1B. Thereafter, dry etching is performed by using the photoresist film as a mask. As a result, a part of the insulating film IF6 in pMIS region 1C is removed, thereby exposing upper surface of each of the device isolation film EI, the fins FC, and the insulating film IF4. A sidewall spacer SW made of an insulating film IF6 is formed on the side surface of the laminated body comprised of the dummy gate electrode DG of pMIS region 1C and the insulating film IF4 on the dummy gate electrode DG.

Subsequently, dry-etching is performed by using the photoresist film, the insulating film IF4 and the sidewall spacer SW as a mask. As a result, the upper surface of the fin FC exposed from the pattern including the dummy gate electrode DG and the sidewall spacer SW in pMIS region 1C is retracted. As a result, upper surface of the fins FC exposed from the patterns is higher than upper surface of the device isolation film EI and recedes to a position lower than upper surface of the fins FC immediately below the dummy gate electrodes DG. That is, a groove (trench) DT3 is formed on the upper surface of the fin FC positioned next to the dummy gate electrode DG in pMIS region 1C. Thereafter, the photoresist film is removed.

Figure 18:
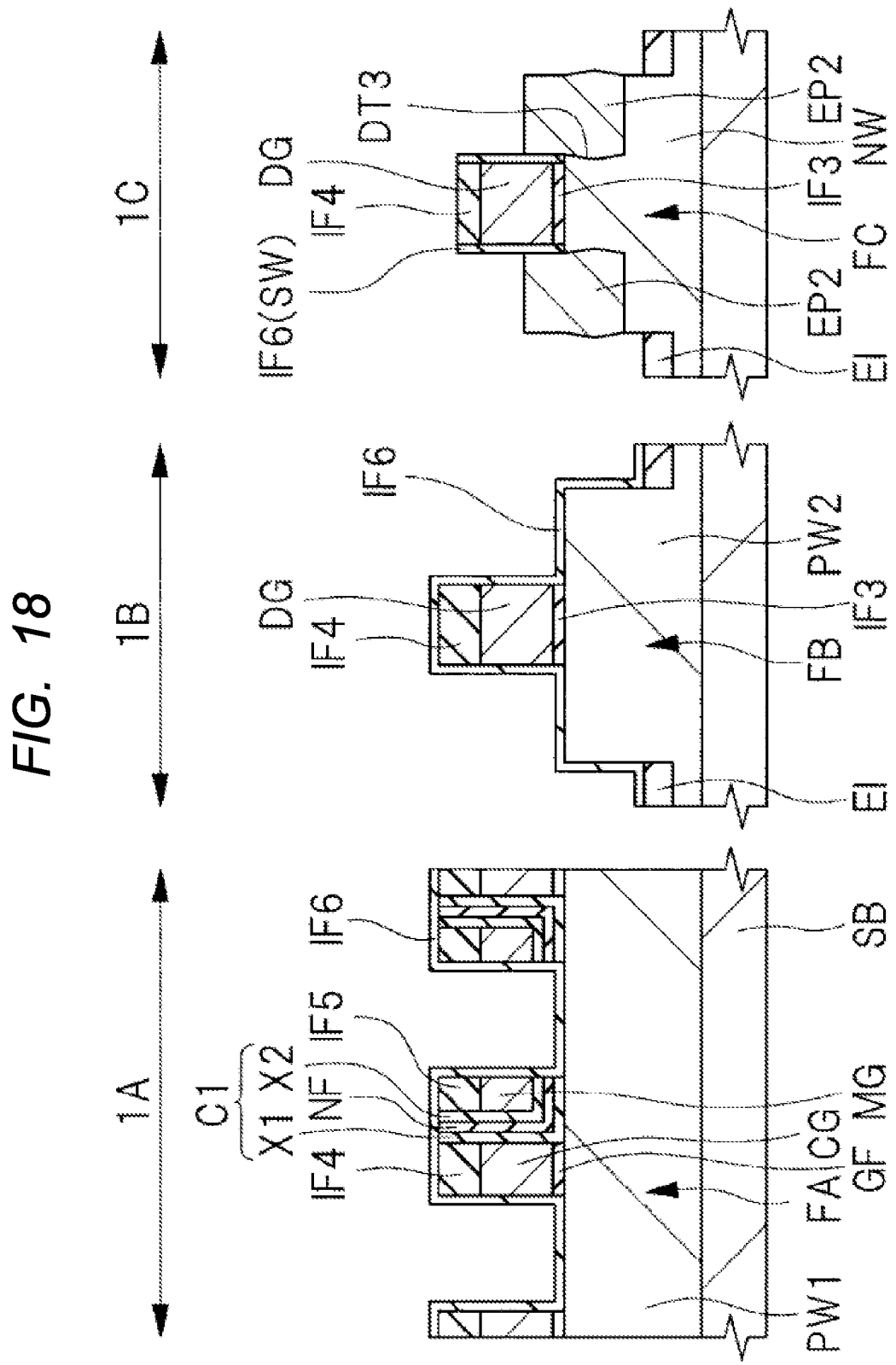
FIG. 18 is a cross section view explaining the manufacturing process of the semiconductor device following to FIG. 17.

Next, as shown in FIG. 18, an epitaxial layer EP2 is formed by an epitaxial growth method. The epitaxial layer EP2 is a semiconductor layer covering the upper surface of the fin FC exposed from the pattern including the dummy gate electrode DG and the sidewall spacer SW of pMIS region 1C. The epitaxial layer EP2 covers each of the bottom surface of the groove DT3 and the side surface of the groove DT3. In other words, a part of the epitaxial layer EP2 is buried in the groove DT3, and another part of the epitaxial layer EP2 protrudes out of the groove DT3 in the upward direction and the Y direction. The epitaxial layer EP2 is made of, for example, SiGe. As shown in FIG. 22, the epitaxial layer EP2 is a semiconductor layer having a rhombic cross-section shape and has a width larger than the width of the fins FC in the Y-direction. In this step, the insulating film IF6 is used as an epitaxial growth preventing film in the memory cell region 1A and nMIS region 1B.

Figure 19:
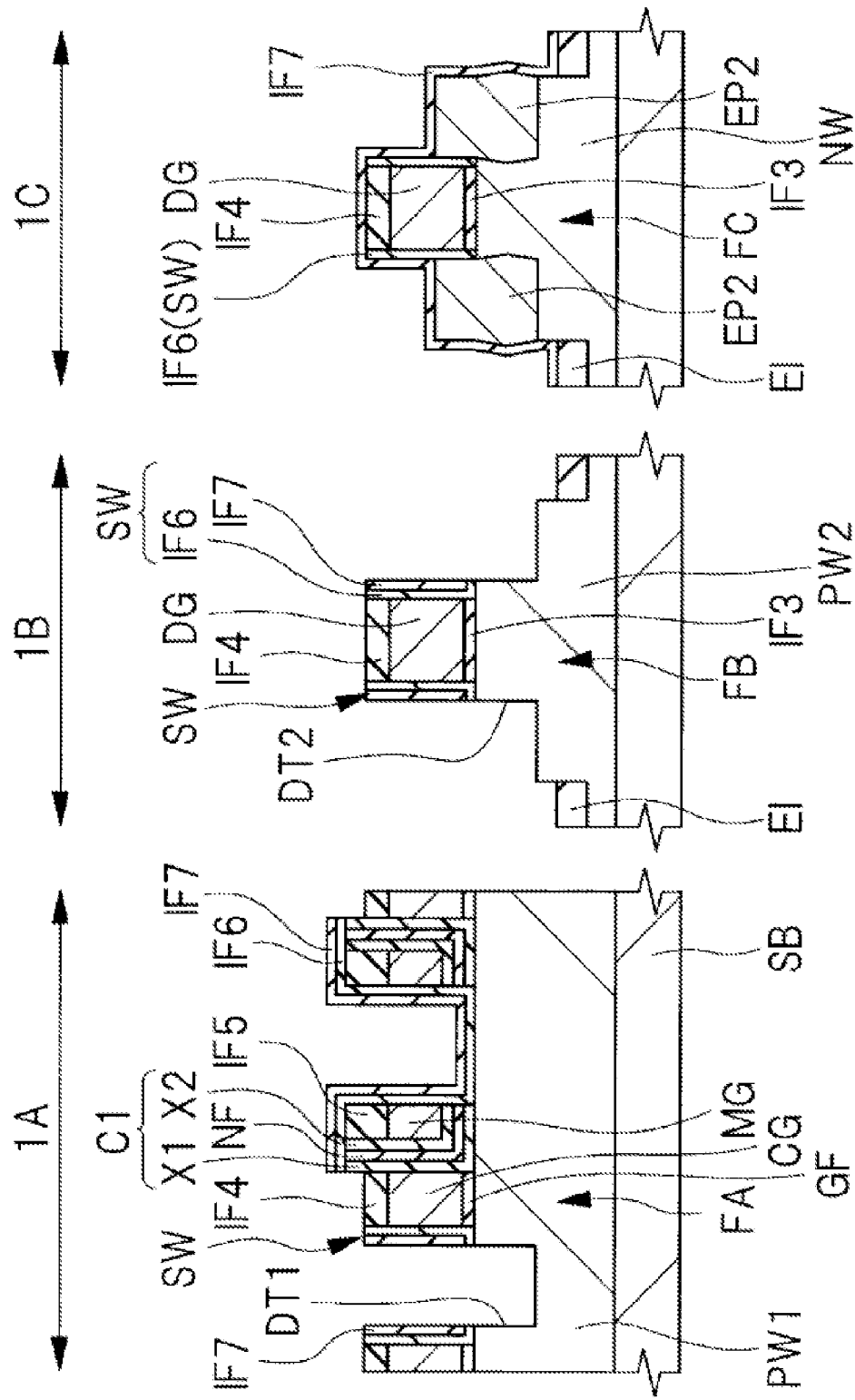
FIG. 19 is a cross section view explaining the manufacturing process of the semiconductor device following to FIG. 18.

Next, as shown in FIG. 19, an insulating film IF7 made of, for example, a silicon oxide film is formed on semiconductor substrate SB. The insulating film IF7 can be formed by, for example, a chemical vapor deposition method.

Next, a photoresist film (not shown) is formed to expose the entire memory cell region 1A and the entire nMIS region 1B and to cover the entire pMIS region 1C, and then dry etch is performed using the photoresist film as a mask. The photoresist film exposes the fins FA between the adjacent control gate electrodes CG in the fins FA in the memory cell region 1A without the memory gate electrodes MG interposed therebetween. The photoresist film covers the fin FA (source-forming region) between the adjacent memory gate electrodes MG without interposing the control gate electrode CG among the fins FA of the memory cell region 1A. Thus, a part of the insulating film IF6, IF7 in the memory cell region 1A and nMIS region 1B is removed. As a result, upper surface of each of the device isolation film EI, the fins FA, FB, and a part of the insulating film IF4 is exposed. However, of the fins FA in the memory cell region 1A, the fins FA between the adjacent memory gate electrodes MG without the control gate electrodes CG are covered with the insulating film IF6, IF7.

A sidewall spacer SW made of each of the insulating film IF6 and the insulating film IF7 is formed on the side surface of the laminated body comprised of the control gate electrode CG in memory cell area 1A and the insulating film IF4 on the control gate electrode CG. A sidewall spacer SW made of each of the insulating film IF6 and the insulating film IF7 is formed on the side surface of the laminated body comprised of the dummy gate electrode DG of nMIS region 1B and the insulating film IF4 on the dummy gate electrode DG.

Subsequently, dry-etching is performed by using the photoresist film, the insulating film IF4 and the sidewall spacer SW as a mask. As a result, upper surface of the fin FA (drain-forming region) in the region exposed from the sidewall spacer SW between the adjacent control gate electrodes CG in the fin FA (drain-forming region) of the memory cell region 1A is retracted. As a result, upper surface of the fin FA in the region is higher than upper surface of the device isolation film EI and recedes to a position lower than upper surface of the fin FA immediately below the control gate electrode CG. That is, the groove (trench) DT1 is formed on the upper surface of the fin FA positioned next to the control gate electrode CG in the memory cell region 1A.

In addition, the upper surface of the fin FB exposed from the pattern including the dummy gate electrode DG in nMIS region 1B and the sidewall spacer SW in nMIS region 1B is recessed by the etching process. As a result, the upper surface of the fin FB exposed from the pattern is receded to a position which is higher than upper surface of the isolation film EI, and which is lower than the upper surface of the fin FB located beneath the dummy gate electrode DG. That is, a groove (trench) DT2 is formed on the upper surface of the fin FB positioned next to the dummy gate electrode DG in nMIS region 1B. Thereafter, the photoresist film is removed.

Figure 20:
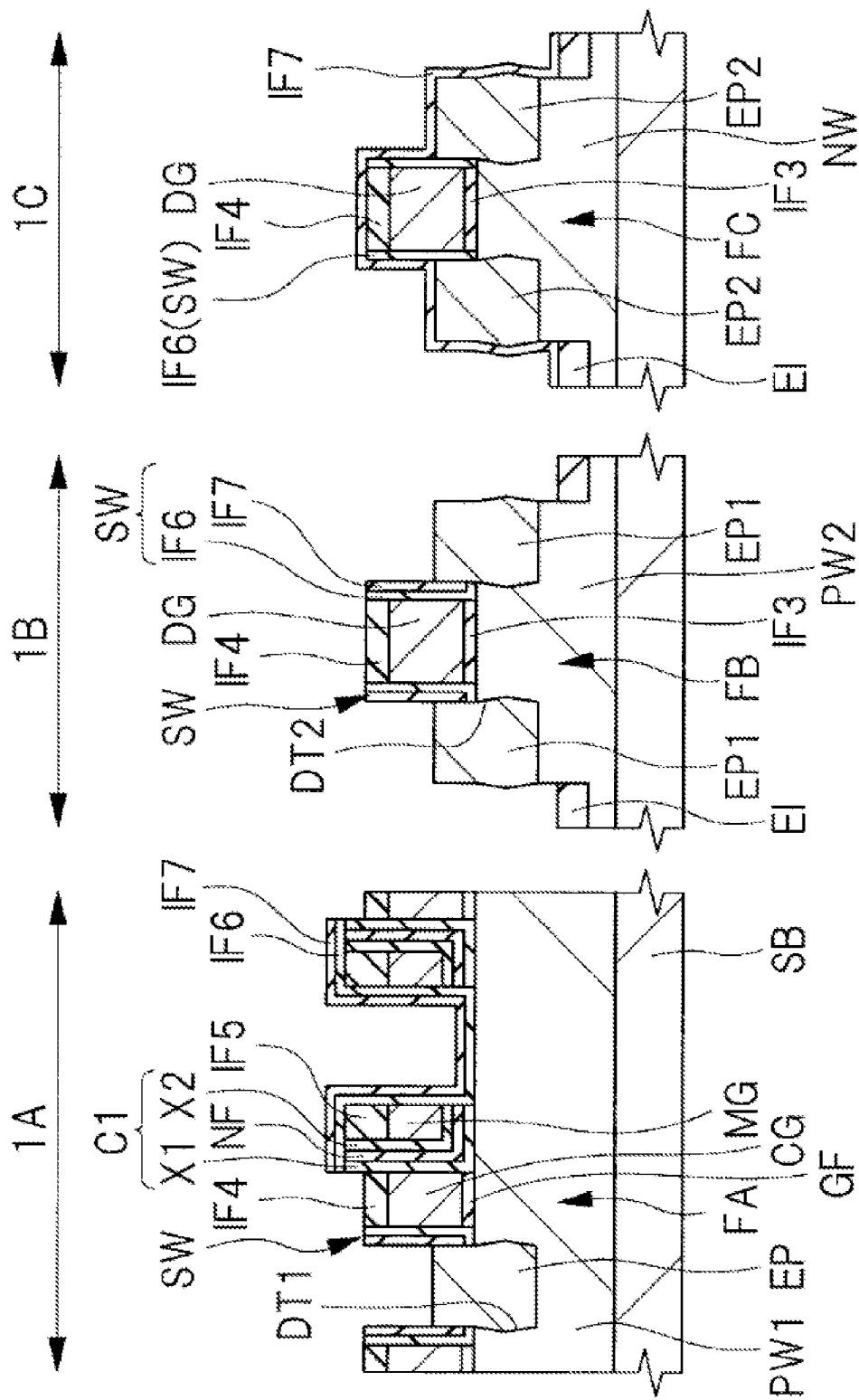
FIG. 20 is a cross section view explaining the manufacturing process of the semiconductor device following to FIG. 19.

Next, as shown in FIG. 20, epitaxial layers EP and EP1 are formed by epitaxial growth. The epitaxial layer EP is a semiconductor layer that covers upper surface of the fins FAs of the regions adjacent to the control gate electrodes CG of the memory cell regions 1A via the sidewall spacers SW. The epitaxial layer EP covers the bottom surface and the side surface of the groove DT1. In other words, a part of the epitaxial layer EP is buried in the groove DT1, and another part of the epitaxial layer EP protrudes out of the groove DT1 in the upward direction and the Y direction. In this step, the insulating film IF6, IF7 is used as an epitaxial growth preventing film in the source-forming region and pMIS region 1C of the memory cell region 1A.

The epitaxial layer EP1 is a semiconductor layer covering upper surface of the fins FBs exposed from the patterns including the dummy gate electrodes DG and the sidewall spacers SW of nMIS regions 1B. The epitaxial layer EP1 covers each of the bottom surface of the groove DT2 and the side surface of the groove DT2. In other words, a part of the epitaxial layer EP1 is buried in the groove DT2, and another part of the epitaxial layer EP1 protrudes out of the groove DT2 in the upward direction and the Y direction.

The epitaxial layers EP and EP1 are made of, for example, silicon (Si). Here, the epitaxial layers EP and EP1 made of, for example, a silicon phosphide (SiP) film or a silicon carbide (SiC) film may be formed. As shown in FIG. 22, each epitaxial layer EP, EP1 is a semiconductor layer having a cross-section shape of a rhombus, and having a width larger than each fin FA and FB in the Y-direction. As one of the main features of a method of manufacturing a semiconductor device of present embodiment, no epitaxial layer is formed on the source-forming region of the memory cell region 1A, that is, on the fin FA adjacent to the memory gate electrode MG.

Figure 21:
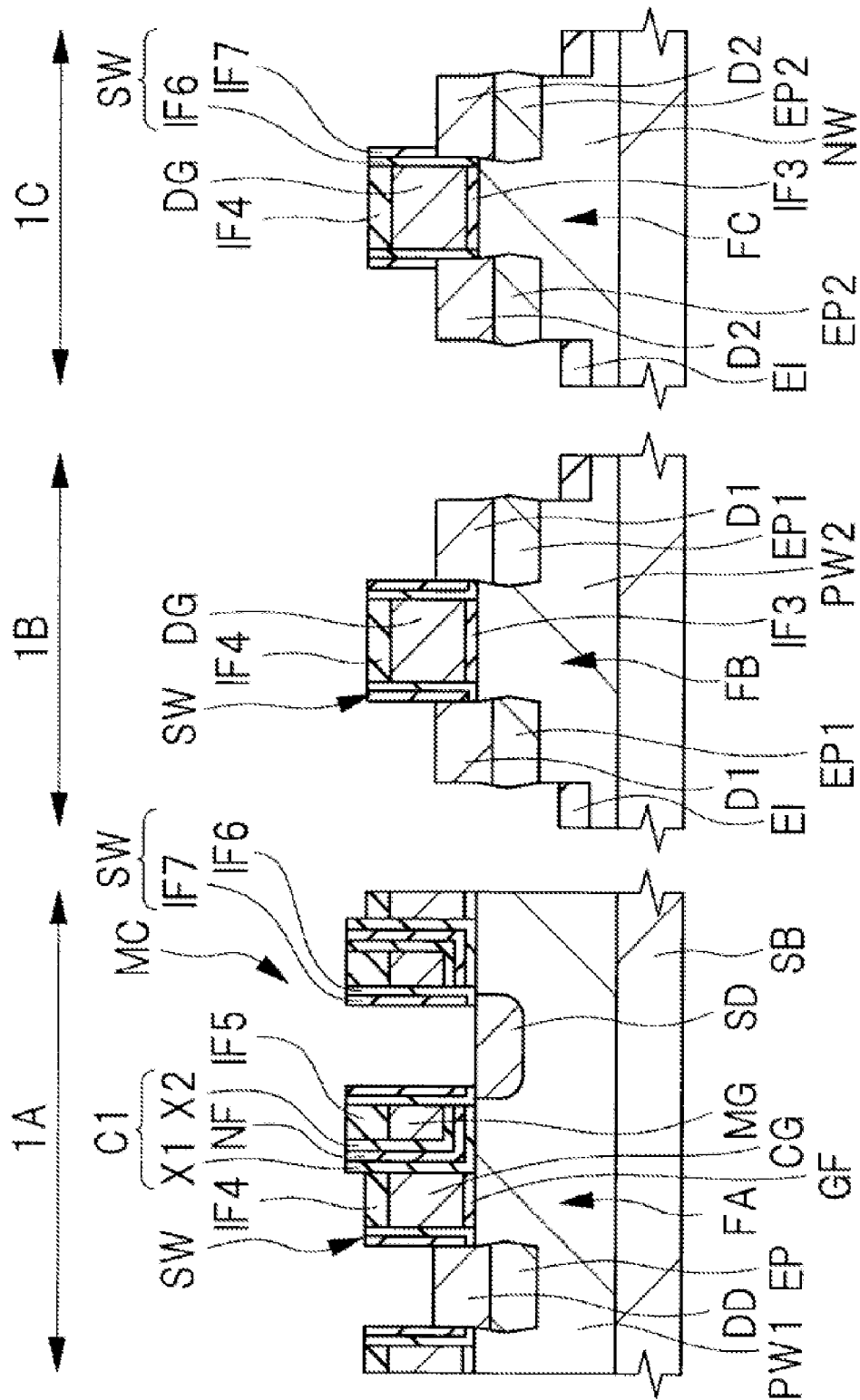
FIG. 21 is a cross section view explaining the manufacturing process of the semiconductor device following to FIG. 20.
Figure 22:
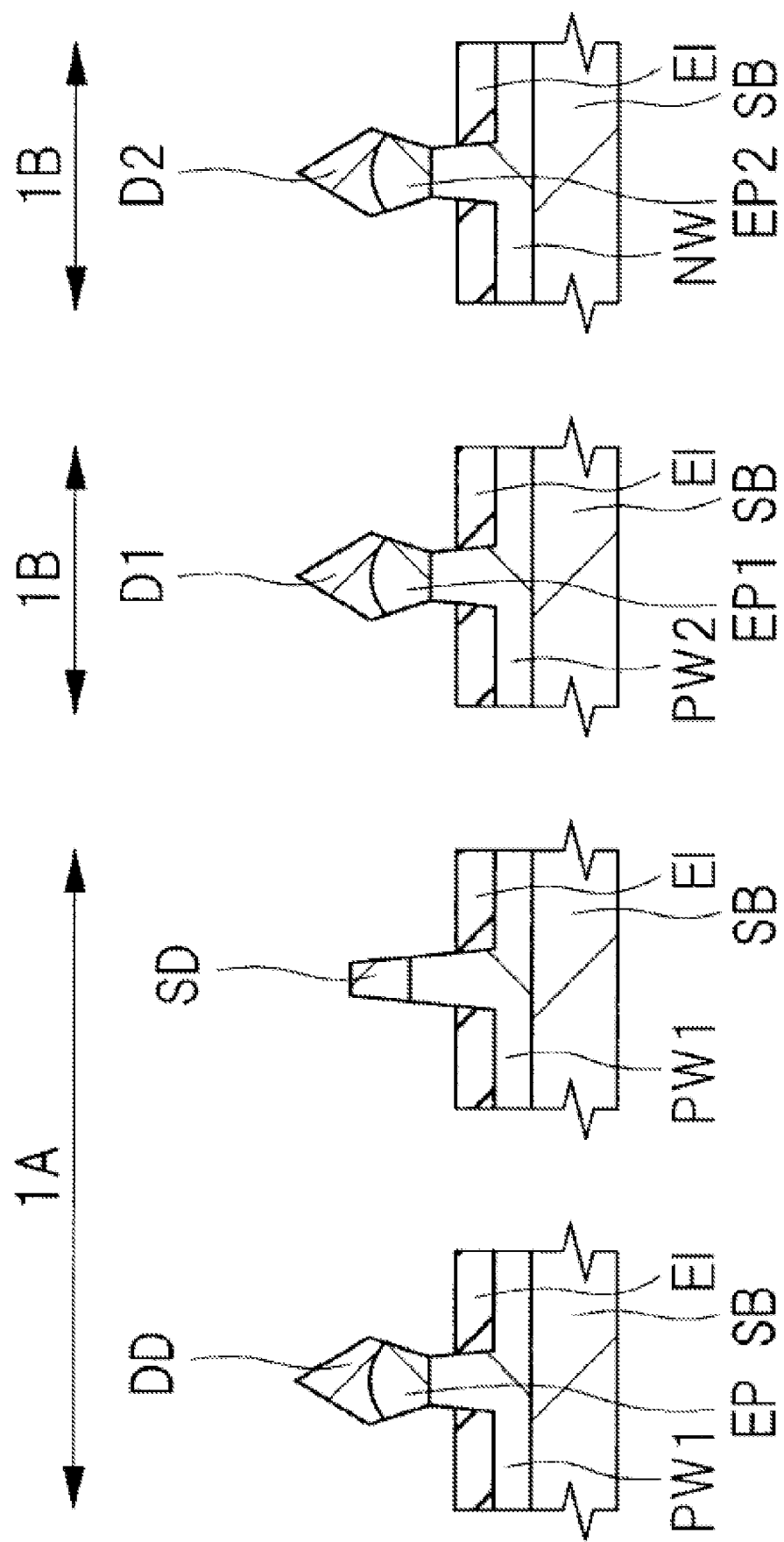
FIG. 22 is a cross section view along a latitudinal direction of a fin shown in FIG. 21.

Next, as shown in FIGS. 21 and 22, dry etching is performed. Thus, by removing each insulating film IF6, IF7 on the insulating film IF4, the upper surface of the insulating film IF5 in the memory cell region 1A and the upper surface of the insulating film IF4 in pMIS region 1C are exposed. Hereinafter, the insulating film IF7 of pMIS region 1C is regarded as a part of the sidewall spacer SW. That is, after the dry-etching process, the sidewall spacer SW of pMIS region 1C is comprised of each insulating film IF6, IF7.

Subsequently, ion implantation is performed using the insulating film IF4, the dummy gate electrode DG, the control gate electrode CG, the memory gate electrode MG, and the sidewall spacers SW as masks. Here, ions are implanted into upper surface of each of the fins FA, the epitaxial layers EP, and EP1, EP2. As a result, a diffusion region DD, which is an n-type semiconductor region, is formed from upper surface of the epitaxial layer EP to the intermediate depth of the epitaxial layer EP. A diffusion region D, which is an n-type semiconductor region, is formed from upper surface of the fin FA in the region adjacent to the memory gate electrode MG to the midway depth of the fin FA. In addition, a diffusion region D1, which is an n-type semiconductor region, is formed from upper surface of the epitaxial layer EP1 to an intermediate depth of the epitaxial layer EP1. In addition, a diffusion region D2, which is a p-type semiconductor region, is formed from upper surface of the epitaxial layer EP2 to an intermediate depth of the epitaxial layer EP2.

At least the diffusion region D2 is formed in a step different from the step of forming the diffusion regions DD, D1, and SD. The diffusion regions DD, D1, and SD can be formed by implanting an n-type impurity (e.g., phosphorus (P) or arsenic (As)). The diffusion region D2 can be formed by implanting a p-type impurity (for example, boron (B)). The lower end of the diffusion region DD may reach inside of the fin FA located beneath the epitaxial layer EP. The lower end of the diffusion region D1 may reach the fin FB located beneath the epitaxial layer EP1. The lower end of the diffusion region D2 may reach the fin FC located beneath the epitaxial layer EP2. The diffusion region DD composes a drain region, and the diffusion region SD composes a source region. The pair of diffusion regions D1 formed in nMIS region 1B composes the source/drain region. The pair of diffusion regions D2 formed in pMIS region 1C composes the source/drain region.

In the memory cell region 1A, the source/drain region and the control gate electrode CG compose a control transistor, and the source/drain region and the memory gate electrode MG compose a memory transistor. The control transistor and the memory transistor compose a memory cell MC.

Figure 23:
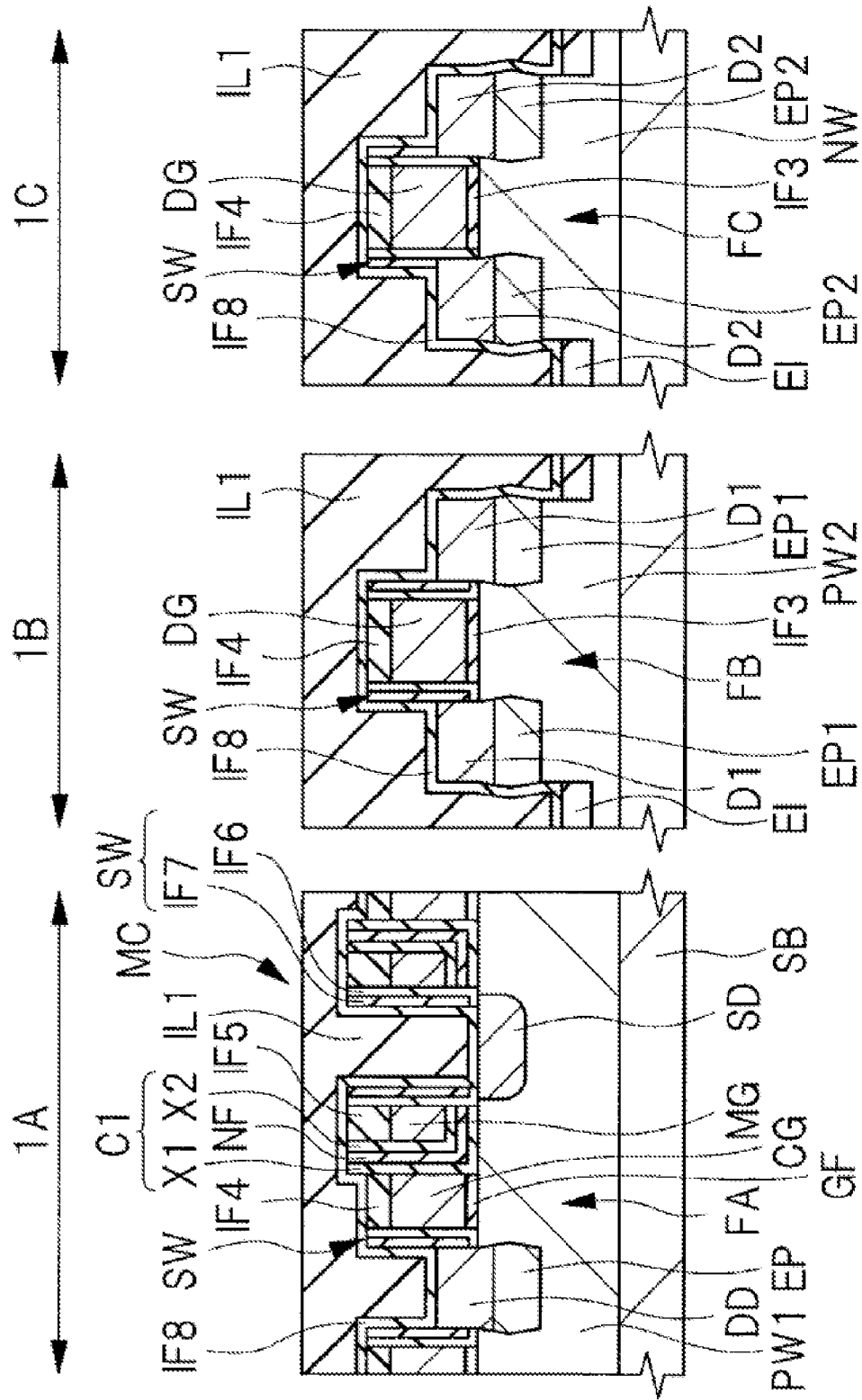
FIG. 23 is a cross section view explaining the manufacturing process of the semiconductor device following to FIG. 22.

Next, as shown in FIG. 23, an insulating film IF8 made of, for example, a silicon nitride film is formed on semiconductor substrate SB. The insulating film IF8 can be formed by, for example, a chemical vapor deposition method. The insulating film IF8 covers the fins FA, FB, FC, the device isolation film EI, the sidewall spacer SW, the epitaxial layers EP, EP1, EP2, and the insulating film IF4. The insulating film IF8 is an etching stopper film (liner insulating film).

Subsequently, an interlayer insulating film IL1 made of a silicon oxide film is formed on the insulating film IF8. The interlayer insulating film IL1 can be formed by, for example, a CVD method. The interlayer insulating film IL1 has a thickness larger than the height from upper surface of the device isolation film EI to upper surface of the insulating film IF4. Subsequently, the interlayer insulating film IL1 is baked and tightened. That is, semiconductor substrate SB on which the interlayer insulating film IL1 is formed is subjected to heat treatment at, for example, 600° C.

Figure 24:
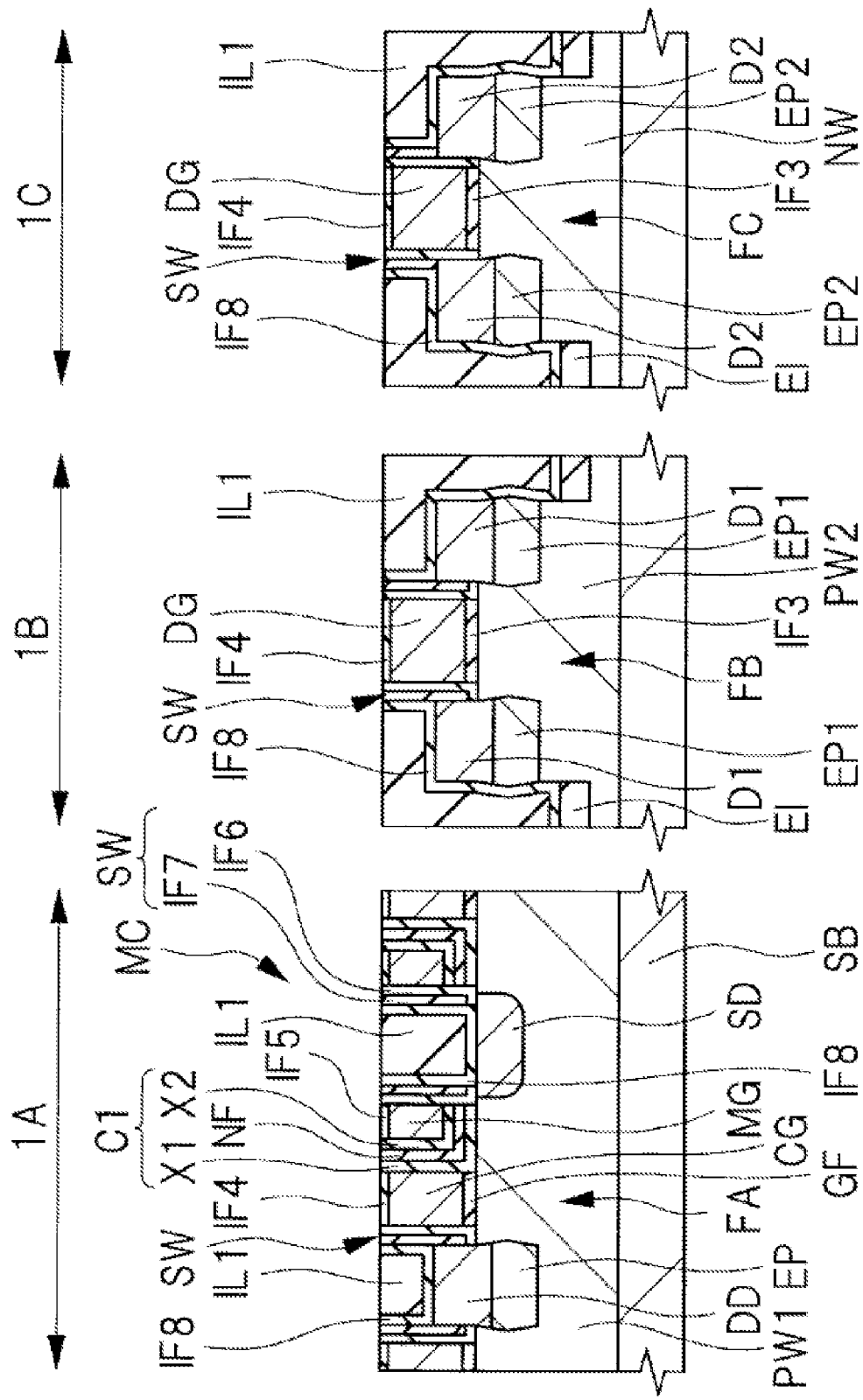
FIG. 24 is a cross section view explaining the manufacturing process of the semiconductor device following to FIG. 23.

Next, as shown in FIG. 24, upper surface of the interlayer insulating film IL1, the insulating film IF4, IF8, and the sidewall spacers SW are polished by, e.g., the CMP method. As a result, upper surface heights of the insulating film IF4 in the memory cell region 1A, nMIS region 1B and pMIS region 1C are equalized. That is, immediately after the polishing step, upper surface of the control gate electrode CG, the memory gate electrode MG, and the dummy gate electrode DG is not exposed.

Figure 25:
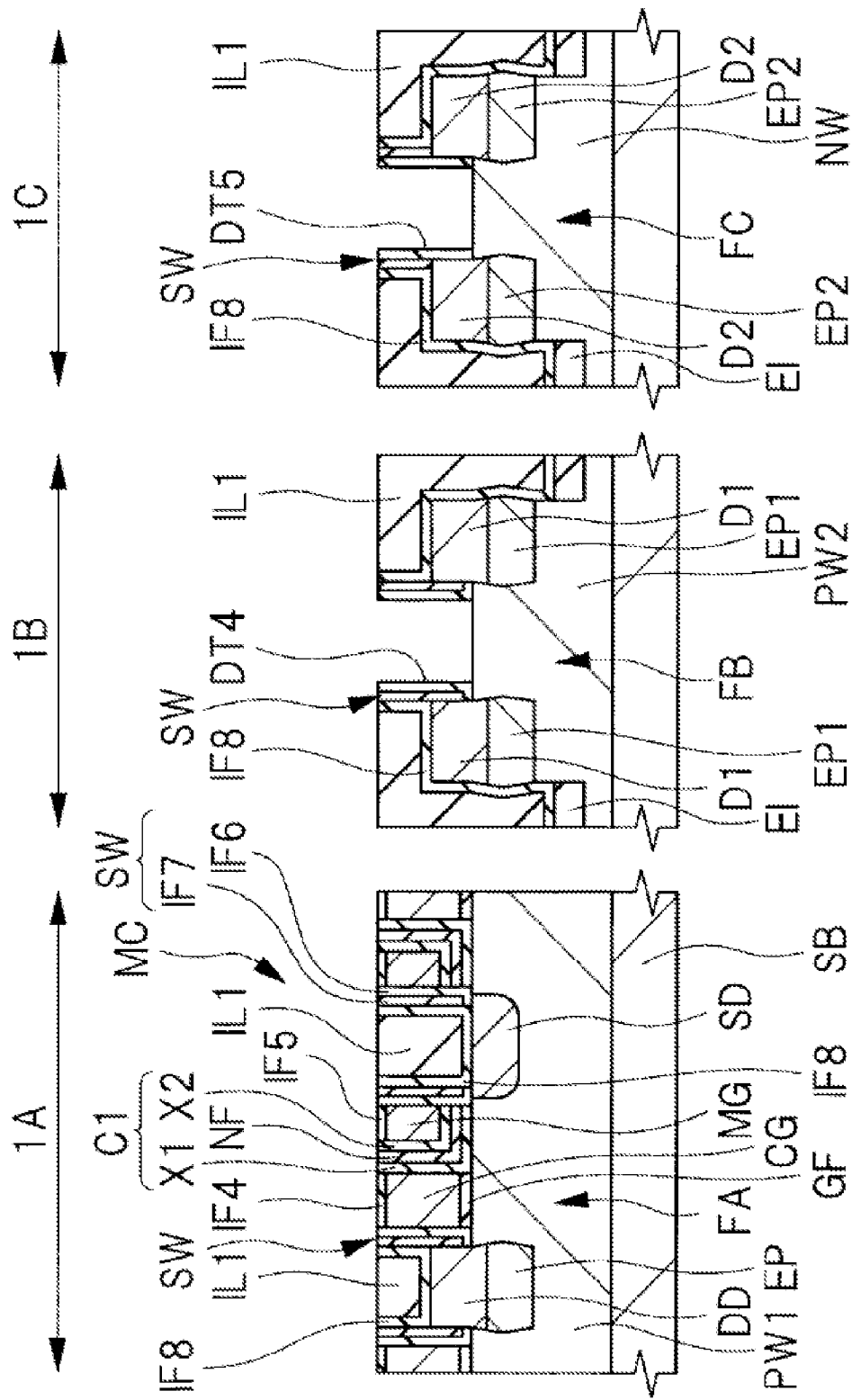
FIG. 25 is a cross section view explaining the manufacturing process of the semiconductor device following to FIG. 24.

Next, as shown in FIG. 25, the insulating film IF4 and the dummy gate electrode DG in nMIS region 1B and pMIS region 1C are removed by photolithography and dry-etching. Here, although the insulating film IF3 located beneath the dummy gate electrode DG is also removed, the insulating film IF3 may be left. By removing the dummy gate electrode DG and the insulating film IF3, a trench (groove) DT4 is formed in the upper surface of the insulating film including the interlayer insulating film IL1 and the sidewall spacer SW in nMIS region 1B. Similarly, in pMIS region 1C, a trench (groove) DT5 is formed in the upper surface of the insulating film including the interlayer insulating film IL1 and the sidewall spacer SW.

Figure 26:
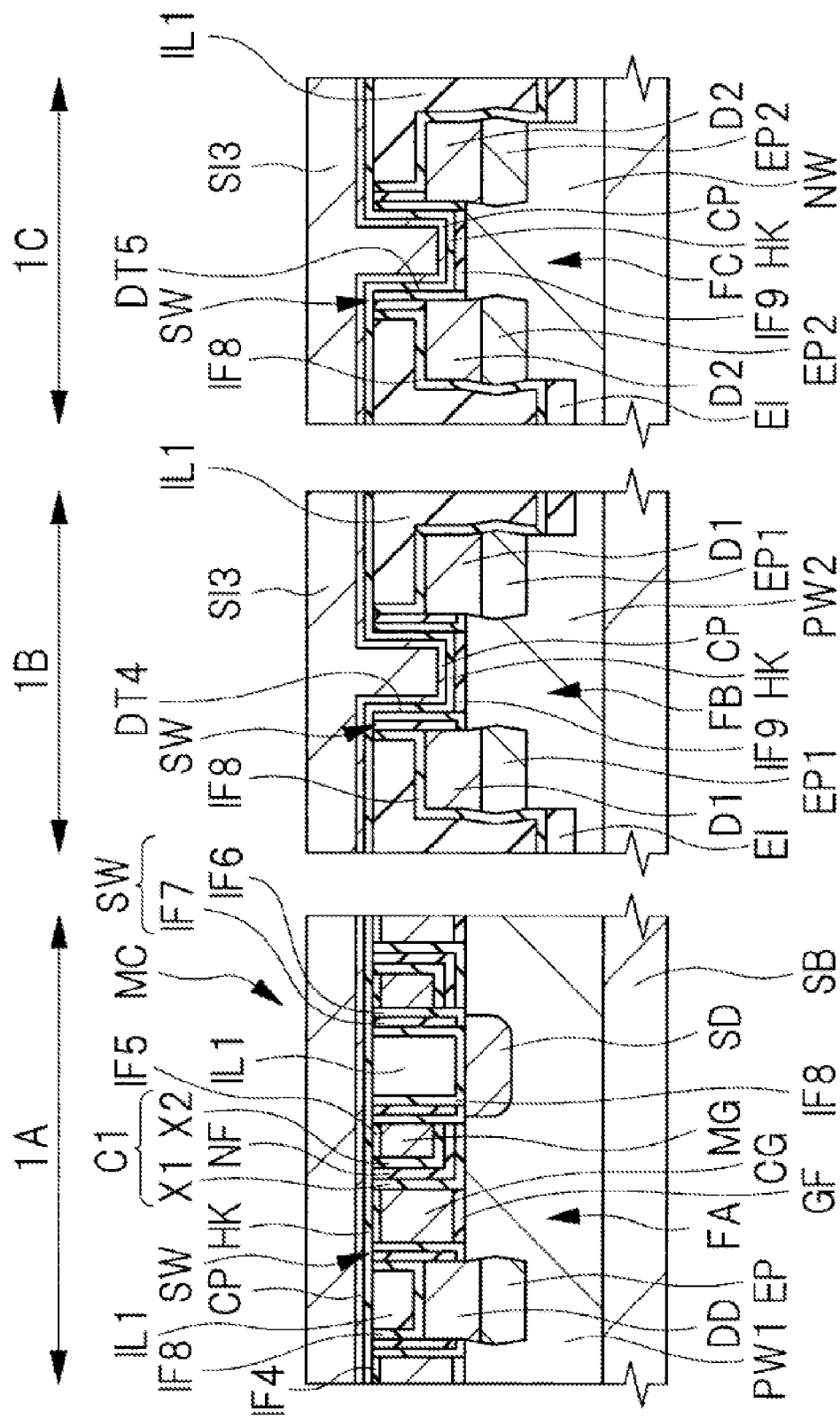
FIG. 26 is a cross section view explaining the manufacturing process of the semiconductor device following to FIG. 25.

Next, as shown in FIG. 26, an insulating film IF9 composing the gate insulating film is formed so as to cover the bottom surface of each trench DT4, DT5. That is, an insulating film IF9 covering each of the upper surface of each fins FB, FC, which is the bottom surface of each trench DT4, DT5, and the side surface of each trench DT4, DT5 is formed by ozone ($O_3$) water treatment. Subsequently, an insulating film HK is formed on semiconductor substrate SB by an atomic layer deposition (Atomic Layer Deposition) method. The insulating film HK is a high-k film having a dielectric constant higher than that of the silicon nitride film, and here, the insulating film HK is formed of a hafnium oxide film. Note that the insulating film HK may be formed using a metal oxide such as a zirconium oxide film, an aluminum oxide film, a tantalum oxide film, or a lanthanum oxide film. Thereafter, a heat treatment (first heat treatment) is performed at 800° C. to 900° C. in order to improve the reliability of the insulating films IF9 and HK. Specifically, semiconductor substrate SB on which the insulating films IF9 and HK are formed is subjected to heat treatment at 850° C., for example. The heat treatment is a heat treatment performed for a relatively short time, that is, a spike anneal.

Next, a metallic film CP and a semiconductor film SI3 are sequentially formed on the insulating film HK by the CVD method. The semiconductor film SI3 is made of, for example, polysilicon, and the metal film CP is made of, for example, titanium nitride (TiN). Here, the inside of each trench DT4, DT5 is embedded due to the insulating film IF9, the metallic film CP, and the semiconductor film SI3. That is, the side surface and the bottom surface of each trench DT4, DT5 are covered with the insulating film HK, the metallic film CP, and the semiconductor film SI3 formed in this order from the side surface side and the bottom surface side.

Subsequently, heat treatment (second heat treatment) at 900 to 1000° C., for example, is performed on semiconductor substrate SBs on which the insulating films IF9, HK, the metallic films CP, and the semiconductor films SI3 are formed. Specifically, for example, heat treatment is performed at 950° C. The heat treatment is performed in order to improve the reliability of the insulating films IF9, HK, the metallic film CP, and the like. The heat treatment is performed by a combination of spike annealing and LSA (Laser Spike Anneal). Here, in order to avoid performing the heat treatment in a state where the metal film CP is exposed, the heat treatment is performed in a state where the metal film CP is covered with a semiconductor film SI3. Each of the first heat treatment and the second heat treatment is performed at a temperature higher than either of the third heat treatment and the fourth heat treatment performed to react a metallic with a semiconductor when forming silicide layers S1 and S2 to be formed later.

Figure 27:
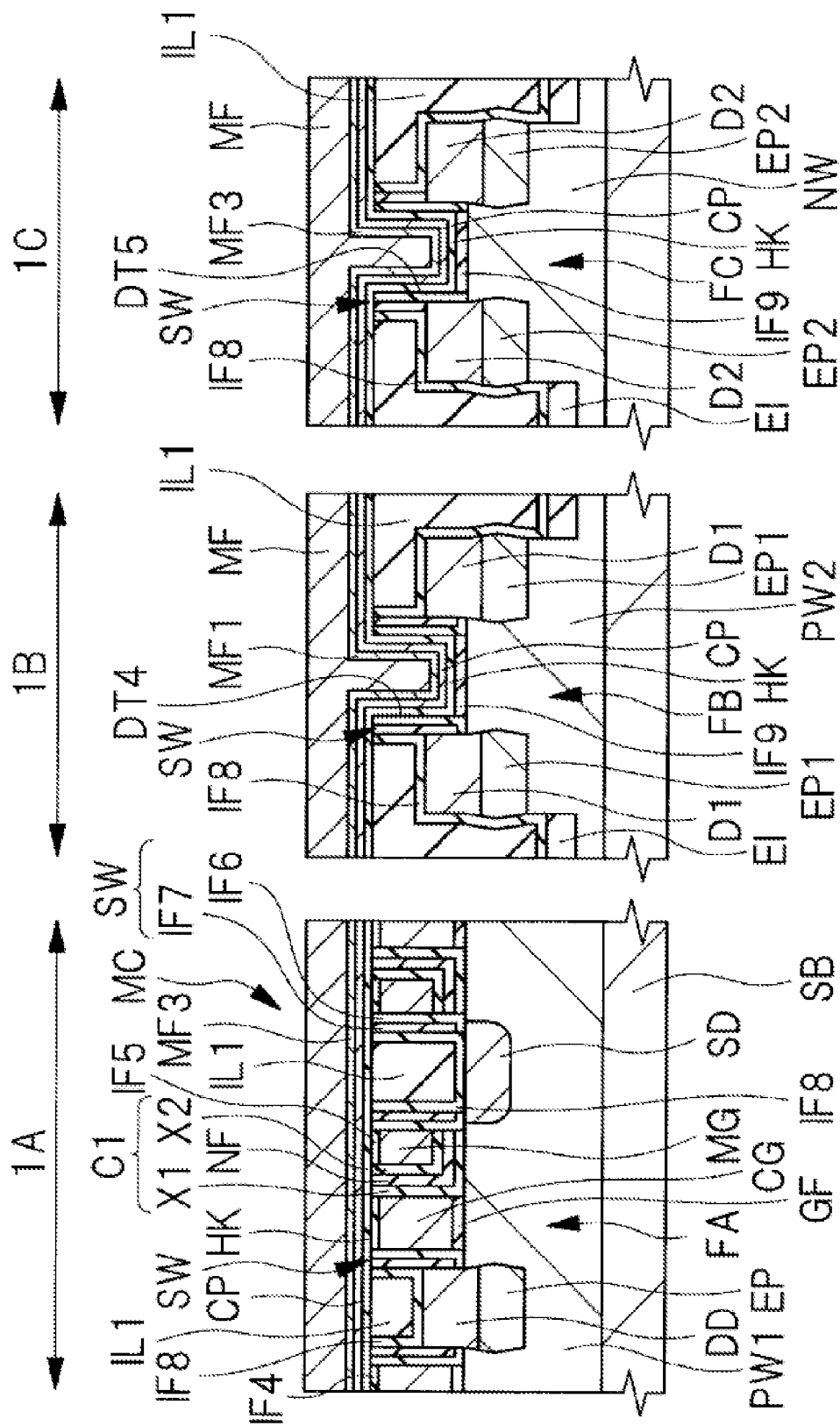
FIG. 27 is a cross section view explaining the manufacturing process of the semiconductor device following to FIG. 26.

Next, as shown in FIG. 27, the semiconductor film SI3 is removed by wet etching. Subsequently, a metallic film MF1 is formed on semiconductor substrate SB including the inside of the trench DT4 by, e.g., sputtering. Subsequently, the metallic film MF1 in the memory cell region 1A and pMIS region 1C is removed by using a photolithography technique and an etch method.

The metallic film MF1 here consists of a TiAl film. For the metallic film MF1, a titanium nitride (TiN) film, a tantalum nitride (TaN) film, a tungsten nitride (WN) film, a titanium carbide (TiC) film, or the like may be used. As the metal film MF1, a tantalum carbide (TaC) film, a tungsten carbide (WC) film, a tantalum nitride carbide (TaCN) film, a titanium (Ti) film, a tantalum (Ta) film, or the like may be used.

Subsequently, a metallic film MF3 is formed on semiconductor substrate SB including the inside of the trench DT5 by, e.g., sputtering. Subsequently, the metallic film MF3 on nMIS region 1B is removed by photolithography and an etch method.

The metallic film MF3 here consists of a titanium nitride film. As the metallic film MF3, a tantalum nitride (TaN) film, a tungsten nitride (WN) film, a titanium carbide (TiC) film, a tantalum carbide (TaC) film, or the like may be used. As the metal film MF3, a tungsten carbide (WC) film, a tantalum nitride carbide (TaCN) film, a titanium (Ti) film, a tantalum (Ta) film, a titanium aluminum (TiAl) film, or the like may be used.

Subsequently, the metallic film MF is formed on semiconductor substrate SB including the inside of the trench DT4 and the inside of the trench DT5 by using, for example, a sputtering method. The metal film MF is made of, for example, a tungsten (W) film. As a result, the inside of each of the trench DT4 and the trench DT5 is embedded by the metallic film MF. The metallic film MF1 is a work-function film for adjusting the threshold voltages of the n-type transistors formed in nMIS regions 1B. The metallic film MF3 is a work-function film for adjusting the threshold voltages of the p-type transistors formed in pMIS regions 1C.

Figure 28:
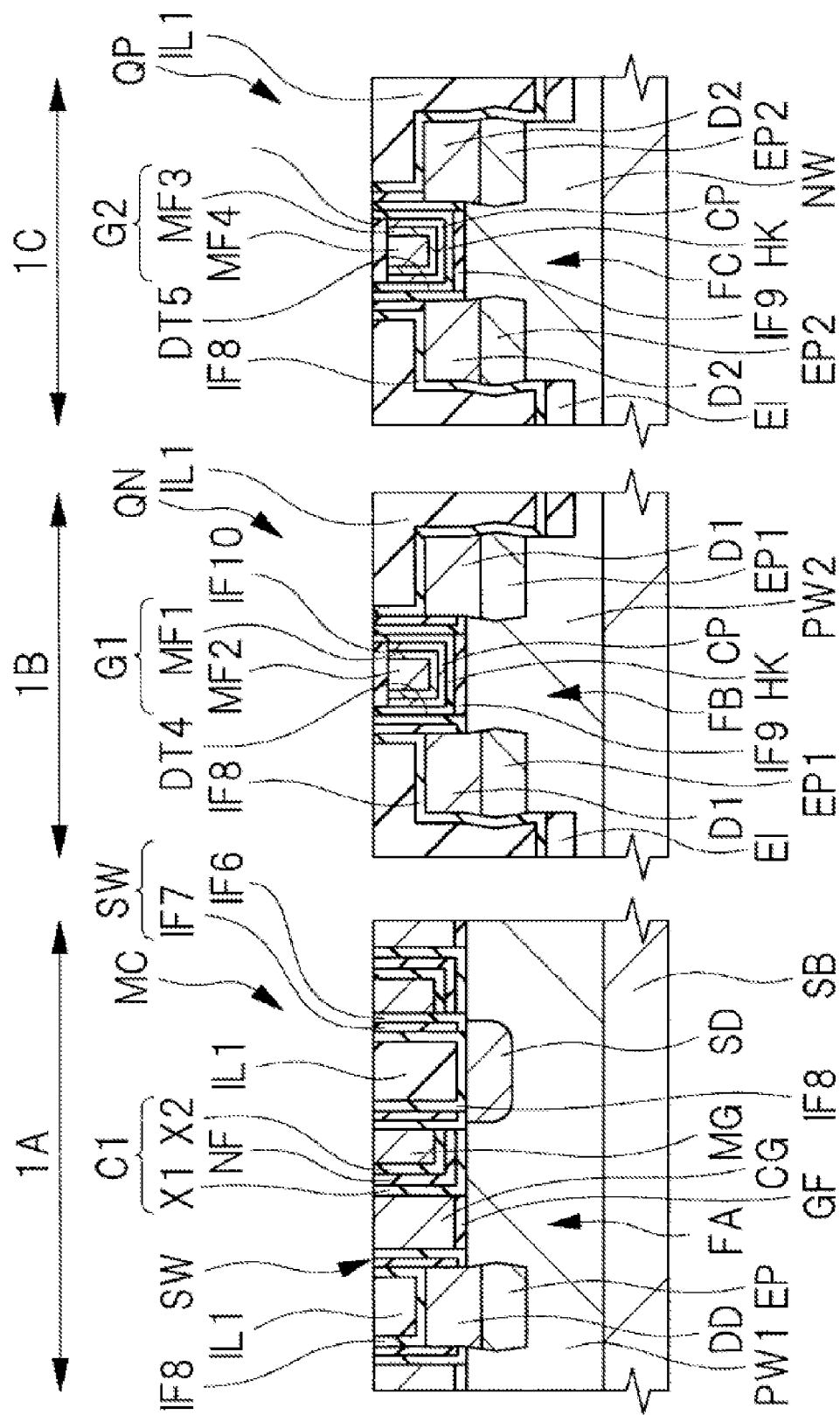
FIG. 28 is a cross section view explaining the manufacturing process of the semiconductor device following to FIG. 27.

Next, as shown in FIG. 28, polishing is performed by the CMP method to remove each metallic film MF, MF1, and MF3 on each trench DT4, DT5. As a result, the metal film MF2 of the metal film MF remains in the trench DT4. In addition, the metal film MF4 made of the metal film MF remains in the trench DT5. In this polishing step, the insulating film IF4 is removed to expose upper surface of each of the control gate electrode CG and the memory gate electrode MG. Upper surface of each of the interlayer insulating film IL1, the sidewall spacers SW, the control gate electrodes CG, and the memory gate electrodes MG is planarized in substantially the same plane.

Through the polishing process, a gate insulating film made of insulating films IF9 and HK buried in the trench DT4 and gate electrodes G1 made of a metallic film MF1, MF2 are formed. In other words, the gate electrode G1 covering each of the upper surface of the fin FB between the pair of epitaxial layers EP1 arranged next to each other in the second direction and the side surface of the fin FB between the pair of epitaxial layers EP1 arranged next to each other in the second direction is formed. As a result, the n-type transistor QN including the gate electrode G1 and the source/drain region of nMIS region 1B is formed. In addition, a gate insulating film made of insulating films IF9 and HK embedded in the trench DT5 and gate electrodes G2 made of a metallic film MF3, MF4 are formed by the polishing process. In other words, the gate electrode G2 covering each of the upper surface of the fin FC between the pair of epitaxial layers EP2 arranged next to each other in the second direction and the side surface of the fin FC between the pair of epitaxial layers EP2 arranged next to each other in the second direction is formed. As a result, the p-type transistor QP including the gate electrode G2 and the source/drain region of pMIS region 1C is formed.

Subsequently, a photoresist film (not shown) covering the memory cell area 1A is formed, and then etched using the photoresist film as a mask, thereby receding upper surface of each of the metallic films CP and MF1~MF4 downward. As a result, a groove is formed on each of the gate electrodes G1 and G2. Subsequently, after the photoresist film is removed, an insulating film IF10 is formed on semiconductor substrate SB by the CVD method or the like. The insulating film IF10 is made of, for example, a silicon nitride film, and fills the trench. Subsequently, the insulating film IF10 on the interlayer insulating film IL1 is removed by, e.g., CMP-method. As a result, the insulating film IF10 remains as a protective film for the gate electrodes G1 and G2 only on the gate electrodes G1 and G2, respectively.

Figure 29:
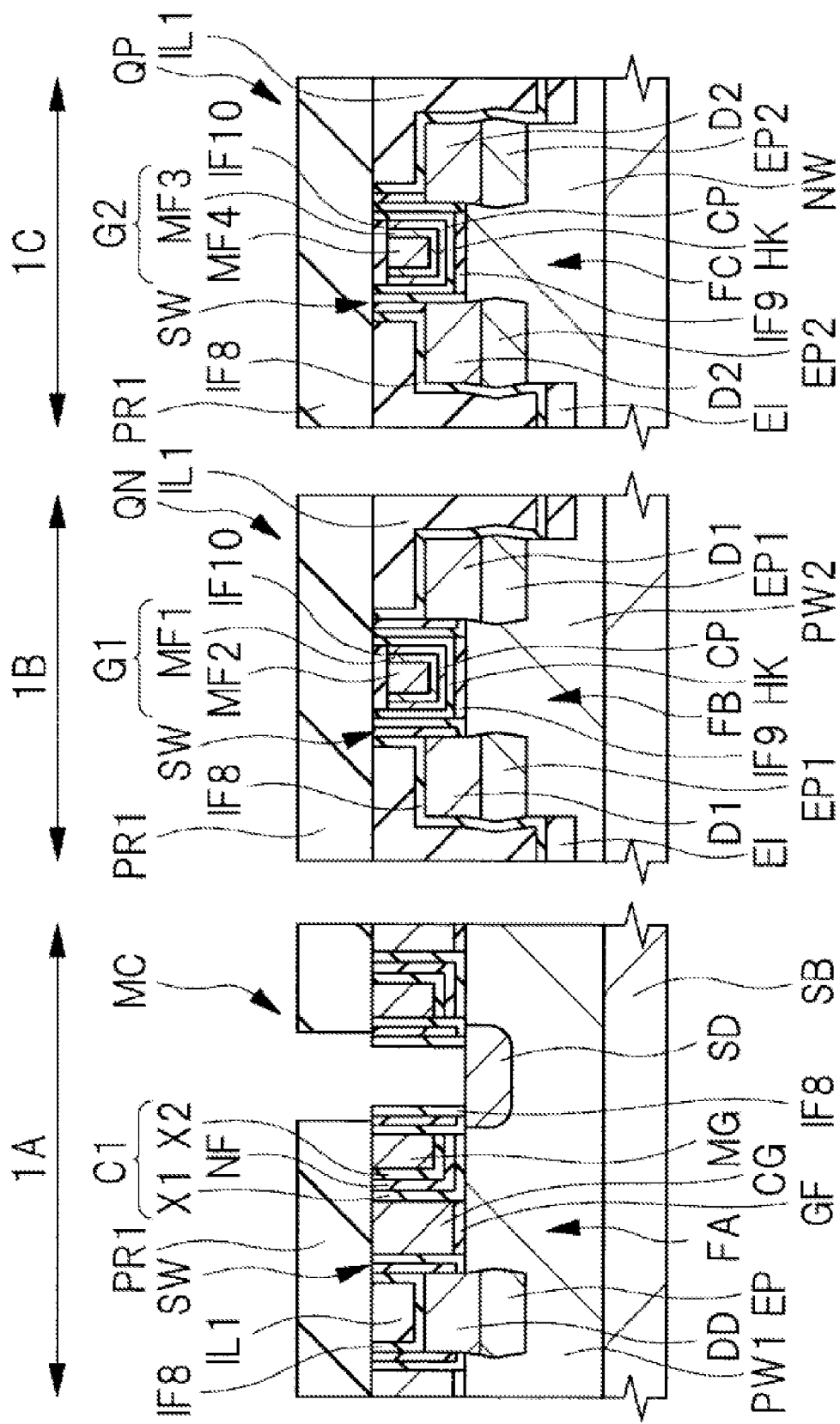
FIG. 29 is a cross section view explaining the manufacturing process of the semiconductor device following to FIG. 28.

Next, as shown in FIG. 29, a photo resist film PR1 is formed on semiconductor substrate SB. The photoresist film PR1 exposes only the fins FA (source-forming regions) between adjacent memory gate electrodes MG without interposing the control gate electrodes CG among the fins FA (source-forming regions) in the memory cell region 1A. The photoresist film PR1 covers the remaining regions in the memory cell region 1A, nMIS region 1B, and pMIS region 1C.

Subsequently, dry etching is performed using the photoresist film PR1 as an etching mask. Thus, the interlayer insulating film IL1 and the insulating film IF8 covering the source-forming regions between the memory gate electrodes MG are removed. That is, upper surface of the fins FA in which the diffusion region SD are formed is exposed from the interlayer insulating film IL1 and the insulating film IF8. At this time, the epitaxial layers EP, EP1, and EP2 are covered with the interlayer insulating film IL1 and the insulating film IF8. The interlayer insulating film IL1 is removed by isotropic etching, while the insulating film IF8 is removed by anisotropic etching. Therefore, although upper surface of the fin FA in which the diffusion region SD are formed is exposed, the side surface of the fin FA remains covered with the insulating film IF8. the upper and side surfaces of the fin FA are exposed from the interlayer insulating film IL1.

Figure 30:
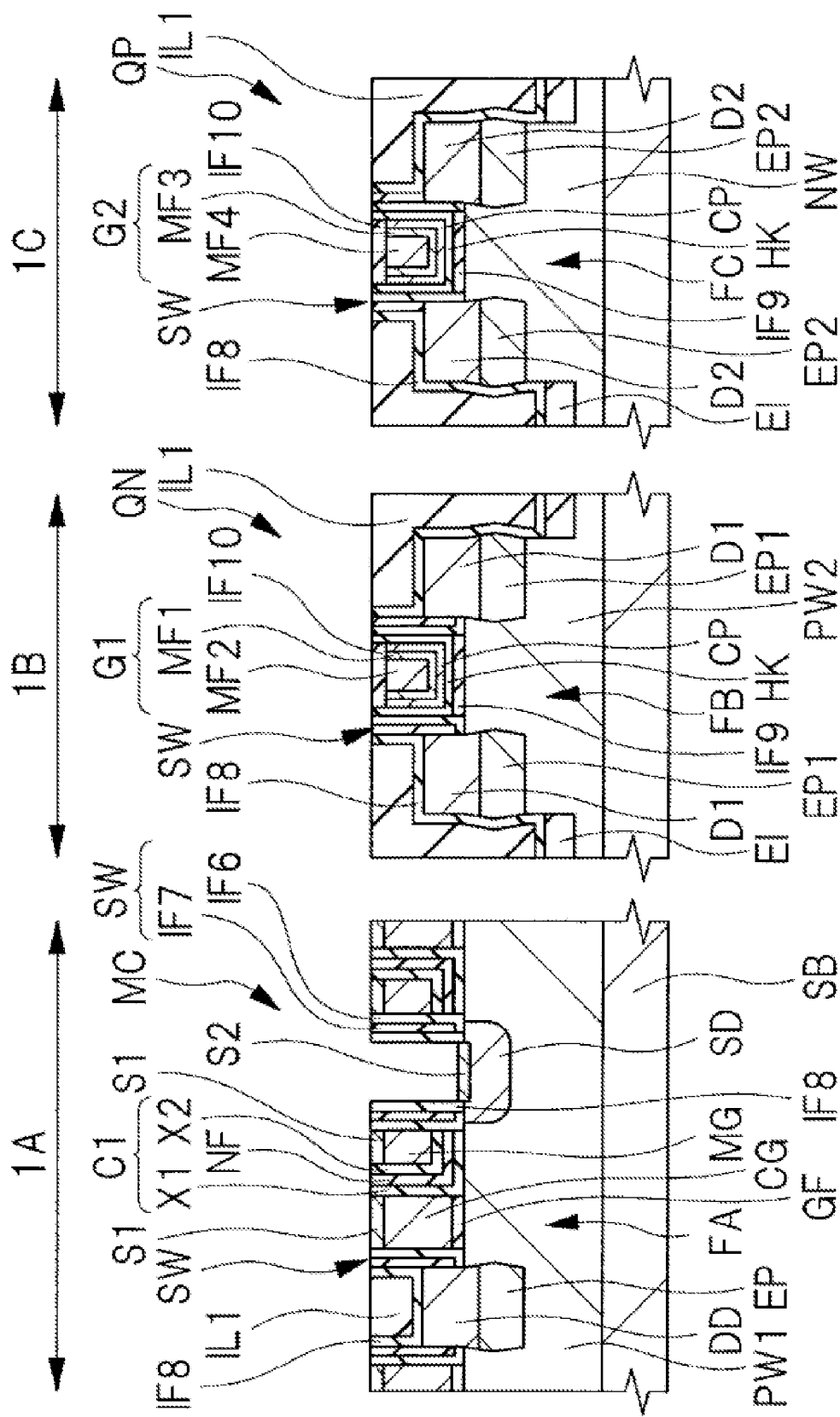
FIG. 30 is a cross section view explaining the manufacturing process of the semiconductor device following to FIG. 29.

Next, as shown in FIG. 30, after the photoresist film PR1 is removed, a well-known salicide process is performed. As a result, a silicide layer S1 is formed on upper surface of each of the control gate electrode CG and the memory gate electrode MG, and a silicide layer S2 is formed on upper surface of the fins FA in the source-forming regions. Here, after a metallic film (a nickel (Ni) film or a cobalt (Co) film) is deposited on semiconductor substrate SB by a sputtering method, a third heat treatment is performed on semiconductor substrate SB to form silicide layers S1 and S2. The temperature of the third heat treatment is, for example, 210° C. to 310° C., specifically, 260° C. Subsequently, after the unreacted excess metallic film is removed, a fourth heat treatment is performed on semiconductor substrate SB, whereby silicide layers S1 and S2 having low resistivity can be formed. The temperature of the fourth heat treatment is, for example, 350° C. to 450° C., specifically, 400° C. The silicide layer S1 is, for example, a Ni silicide layer or a Co silicide layer. That is, the silicide layers S1 and S2 are made of the same material. Upper surface of the silicide layer S2 is located below the lower surface of the memory gate electrode MG. The silicide layer S2 is electrically connected to the diffusion region SD.

At this time, the silicide layer S2 is formed on the upper surface of the fin FA on which the diffusion region SD is formed, and the side surface of the fin FA is covered with the insulating film IF8. Therefore, it is considered that the silicide layer S2 is not formed on the side surface. Since the epitaxial layer EP including the diffusion region DD composing the drain region is covered with the interlayer insulating film IL1 and the insulating film IF8, the silicide layer is not formed on the surface of the epitaxial layer EP. One of the main features of method of manufacturing a semiconductor device of present embodiment is that after the dummy gate electrode of each of nMIS region 1B and pMIS region 1C is replaced with a metal gate electrode, a silicide layer S2 is formed on the source region of the memory cell MC.

Figure 31:
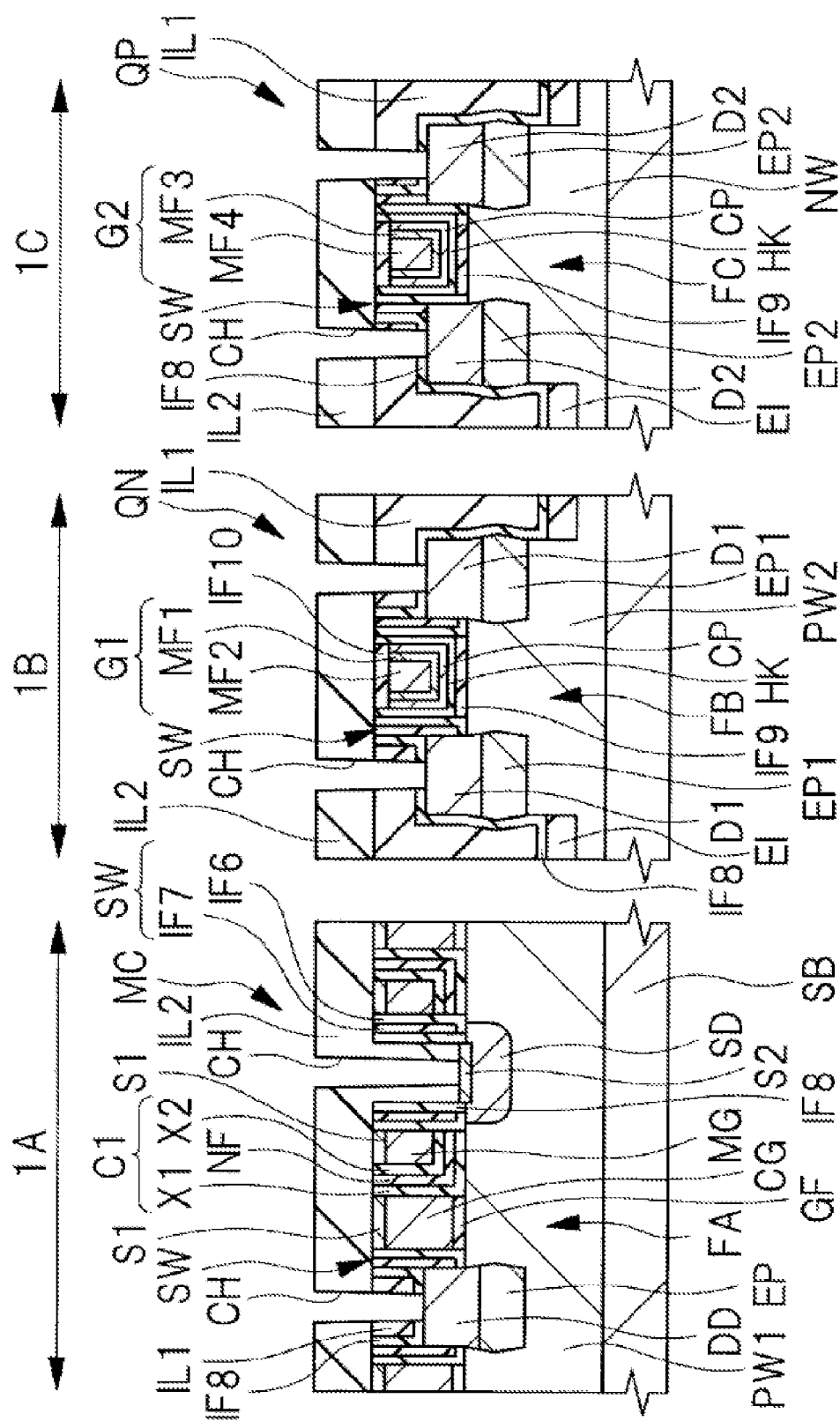
FIG. 31 is a cross section view explaining the manufacturing process of the semiconductor device following to FIG. 30.

Next, as shown in FIG. 31, an interlayer insulating film IL2 is formed on semiconductor substrate SBs by, e.g., CVD. The interlayer insulating film IL2 is made of, for example, a silicon oxide film. Subsequently, upper surface of the interlayer insulating film IL2 is flattened by the CMP method or the like. Subsequently, a plurality of contact holes CH penetrating the interlayer insulating film IL2 and a plurality of contact holes CH penetrating the interlayer insulating film IL2, IL1 are formed by photolithography and dry-etching. The contact hole CH penetrating the interlayer insulating film IL1 also penetrates the insulating film IF8.

In the memory cell region 1A, the epitaxial layer EP in which the diffusion region SD is formed and upper surface of the silicide layer S1 or S2 are exposed at the bottom of the contact hole CH. In nMIS region 1B, upper surface of the epitaxial layer EP1 or upper surface of the gate electrode G1 is exposed at the bottom of the contact hole CH. In pMIS region 1C, upper surface of the epitaxial layer EP2 or upper surface of the gate electrode G1 is exposed at the bottom of the contact hole CH. The contact holes CH exposing upper surface of each of the gate electrodes G1 and G2, the control gate electrode CG, and the memory gate electrode MG are formed in regions (not shown). The contact holes CH on these gate electrodes do not penetrate the interlayer insulating film IL1.

Figure 32:
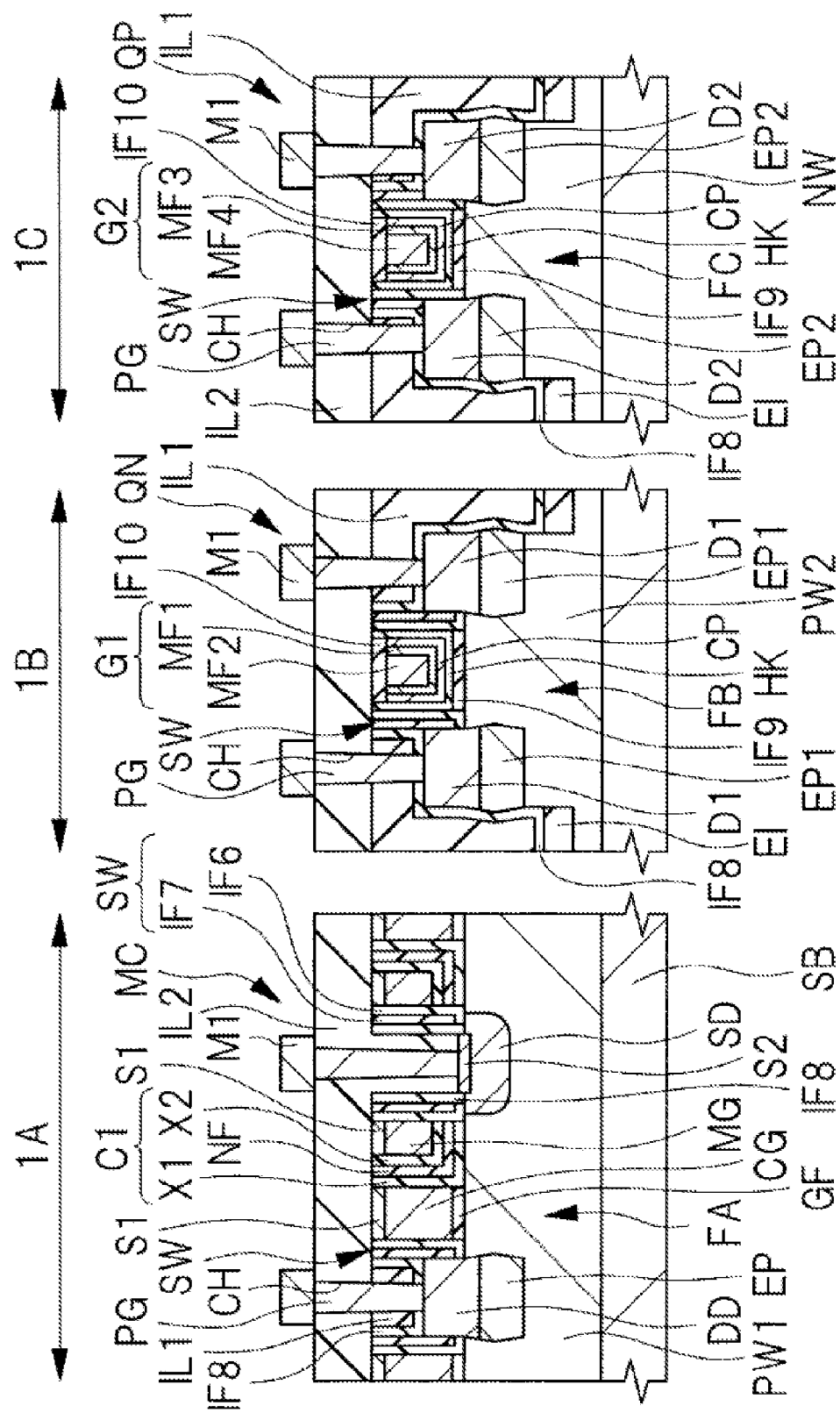
FIG. 32 is a cross section view explaining the manufacturing process of the semiconductor device following to FIG. 31.

Next, as shown in FIG. 32, a conductive plug PG made of tungsten (W) or the like is formed in the contact hole CH as a conductive member for connection. The plug PG has a laminated structure of a barrier conductor film (for example, a titanium film, a titanium nitride film, or a laminated film thereof) and a main conductor film (for example, a tungsten film) positioned on the barrier conductor film.

The plug PG electrically connected to the drain region of the memory cell region 1A is in contact with the epitaxial layer EP in which the diffusion region DD is formed, without interposing a silicide layer therebetween. The plug PG electrically connected to the source region of the memory cell region 1A is in contact with the upper surface of the silicide layer S2 on the fin FA on which the diffusion region SD is formed. The plug PG connected with the source/drain region of nMIS region 1B is in contact with the upper surface of the epitaxial layer EP1 without intervening a silicide layer therebetween. The plug PG connected with the source/drain region of pMIS region 1C is in contact with the upper surface of the epitaxial layer EP2 without intervening a silicide layer therebetween.

In the step of forming the plug PG, after the barrier conductor film and the main conductor film filling the contact holes CH are formed, the barrier conductor film and the main conductor film on the interlayer insulating film IL2 are removed by the CMP method or the like. As a result, the plug PG composed of the barrier conductor film and the main conductor film is formed in the contact hole CH.

Subsequently, the interconnection M1 is formed on the interlayer insulating film IL2. The wiring M1 has a laminated structure of a barrier conductor film (for example, a titanium nitride film, a tantalum film, a tantalum nitride film, or the like) and a main conductor film (copper film) formed on the barrier conductor film. In FIG. 32, in order to simplify the drawing, the wiring M1 is shown by integrating the barrier conductor film and the main conductor film. The same applies to the plug PG.

The wiring M1 can be formed by, for example, a so-called single damascene method. That is, an interlayer insulating film having a wiring groove is formed on the interlayer insulating film IL2, and a metallic film is buried in the wiring groove, whereby the wiring M1 can be formed. Here, the interlayer insulating film on the side of the wiring M1 is not shown. Thereafter, a laminated wiring layer is formed on the wiring M1.

Through the above step, semiconductor device of present embodiment is substantially completed.

<Effect of Method of Manufacturing Semiconductor Device>

As described above with reference to FIG. 35, in the memory cell made of FINFET, each of the source region and the drain region may be formed in the epitaxial layer. However, when the upper end of the epitaxial layer EP4 shown in FIG. 35 reaches a position above the bottom surface of the memory gate electrode MG, the breakdown voltage between the memory gate electrode MG and the source region may be lowered.

When the epitaxial layer is formed on the fin adjacent to the memory gate electrode MG, stresses applied to FINFET channel region increase. As a result, the flow direction of the current in the channel region under the memory gate electrode MG can be changed. That is, when the epitaxial layers EP4 are formed, the times required for rewriting the memory cells MCAs vary, and the reliability of semiconductor device decreases.

Therefore, it is necessary to prevent such a decrease in breakdown voltage and a variation in the characteristics of the memory cell. Therefore, in order to reduce the above-mentioned connecting resistance without forming an epitaxial layer, the upper surface of the fin in which the source/drain region is formed may be covered with a silicide layer. However, for example, when the gate electrode composing FINFET of the logic circuit region is formed of a metal film (metal gate electrode), the silicide layer may be deteriorated to increase the resistivity of the logic circuit region. That is, as a method of forming the metal film, there is a method of forming a dummy gate electrode made of silicon or the like in a logic circuit region, forming the silicide layer, and then replacing the dummy gate electrode with the metal film. In the case where such a step is performed, the silicide layer is changed in quality and has high resistance by heat treatment performed when the dummy gate electrode is replaced with a metal gate electrode formed of a metal film.

Specifically, the heat treatment herein refers to each of the two heat treatments described with reference to FIG. 26. That is, heat treatment (for example, 800 to 900° C.) is performed to improve the reliability of the insulating films IF9 and HK, and heat treatment (for example, 900 to 1000° C.) is performed after the metallic film CP and the semiconductor film SI3 are formed. When the silicide layer is changed in quality by the heat treatment at these high temperatures and the resistor of the silicide layer is increased, the effect obtained by forming the silicide layer is impaired.

In present embodiment, as shown in FIG. 20, epitaxial layers EP are formed on the fins FAs adjacent to the control gate electrodes CG of the memory cell regions 1A. On the other hand, an epitaxial layer is not formed on the fin FA adjacent to the memory gate electrode MG, and a silicide layer S2 is formed as shown in FIG. 30. Since the position of upper surface of the silicide layer S2 is lower than the position of the lower surface of the memory gate electrode MG, a drop in breakdown voltage between the memory gate electrode MG and the source region can be prevented as compared with the comparative example. By forming the silicide layer S2, the connection resistance between the source region and the plug PG can be reduced without forming an epitaxial layer.

Here, after the two heat treatments described with reference to FIG. 26, the silicide layer S2 connected to the diffusion region SD is formed by the process described with reference to FIGS. 29 and 30. Therefore, after the silicide layer S2 is formed, the silicide layer S2 can be prevented from being altered by heat treatment at a high temperature.

In addition, by not forming the epitaxial layer on the source region side, the generation of stress applied to the channel region due to the formation of the epitaxial layer can be prevented. Therefore, it is possible to prevent the operation of the memory cell MC from fluctuating due to stress. As described above, the reliability of semiconductor device can be improved.

<Modified Example>

FIG. 34 is a plan view showing a semiconductor device according to a modified example of the embodiment of the present invention. Plan view shown in FIG. 34 is a plan view showing an end portion of the memory cell array in the memory cell area. Here, similarly to the embodiment described above, the drain region of the memory cell is formed in the epitaxial layer, the source region of the memory cell is formed only in the fin, and the epitaxial layer is not formed on the source region. In FIG. 34, illustration of the epitaxial layer is omitted. In FIG. 34, the region where the epitaxial layer is formed is surrounded by a dashed line, and the region where the epitaxial layer is not formed is surrounded by a dashed line.

As shown in FIG. 34, a plurality of fins FA extending in the X direction is arranged side by side in the Y direction. A part of each of the control gate electrode CG and the memory gate electrode MG, which are extending in the Y direction, protrude outside the memory cell array in plan view, and a gate voltage is supplied to each protruding portion. The memory gate electrode MG formed along the side surface of the control gate electrode CG surrounds the dummy control gate electrode DCG separated from the control gate electrode CG in the protruding portion. The memory gate electrode MG of the power supply unit is electrically connected to the plug PG in a region adjacent to the dummy control gate electrode DCG.

Here, the drain region of the fin FA is formed in the epitaxial layer EP as described above (refer to FIG. 3), the plug PG is connected to the upper surface of the epitaxial layer EP. However, no epitaxial layer is formed on the fin FA located at the extreme end portion of the fins FA arranged in the Y direction. That is, on the fin FA, no epitaxial layer is formed between the adjacent control gate electrodes CG (drain region) and between the adjacent memory gate electrodes MG (source region). A plug is not connected to the drain region of the fin FA. On the other hand, the plug PG electrically connected to the source region extends in the Y direction similarly to the control gate electrode CG and the memory gate electrode MG, and is also electrically connected to the fin FA at the extreme end portion in the Y direction.

In the memory cell array, the control gate electrode CG and the memory gate electrode MG which are adjacent to each other in the X direction are repeatedly arranged. A source potential (not shown) is supplied from a source line to each source region via the plug PG, and a drain potential is supplied to each drain region via a bit line (not shown). Here, the epitaxial layer and the plug are not formed on the fin FA (for details, drain region of this fin FA) located at the extreme end portion of the fin FA in the X direction and positioned next to the control gate electrode CG. The fin FA located at the outermost end portion is the end portion of the fin FA adjacent to the control gate electrode CG at the outermost end in the X direction in plan view without interposing the memory gate electrode MG therebetween, among end portions of the fin FA.

As described above, in the present modified example, the drain region (semiconductor region) of the fin FA at each of the respective end in the X direction (longitudinal direction of fin FA) and the respective end in the Y direction (latitudinal direction of fin FA) is not connected to the epitaxial layer and the plug. That is, the upper surface of the semiconductor region in the fin FA adjacent to the control gate electrodes CG at each end in the X and Y directions in the memory cell array is exposed from the epitaxial layer and the plug, and insulated from the bit line. In other words, the fin FA adjacent to the control gate electrode CG at each of the end in the X direction and the end in the Y direction in the memory cell array is separated from the epitaxial layer in plan view. Note that the plug referred to herein refers to a plug (contact plug) located closest to the memory cell MC in the vertical direction and lower than the wiring M1 (refer to FIG. 4) which is the first wiring arranged on the memory cell MC. Here, the vertical direction is a direction perpendicular to upper surface of semiconductor substrate, that is, a direction perpendicular to both the X direction and the Y direction.

In the manufacturing process of semiconductor device of the present modified example, first, a plurality of fins FAs arranged in the Y-direction are formed in a first region, i.e., a memory cell array forming region. Thereafter, the epitaxial layer EP is formed in a state in which the fin FA adjacent to the control gate electrode CG is covered with the protective film at each end in the X direction and the Y direction of the first region among the plurality of fins FA arranged in the line.

In this manner, by not forming epitaxial layers on the fins at the ends of the memory cell array, the generation of foreign matter (e.g., dust generation) in the manufacturing process of semiconductor device can be prevented. The generation of the foreign matter causes a film formation defect, a drop in breakdown voltage, a short circuit, and the like. The generation of such foreign matter is likely to occur at the end of the cell array. Therefore, in the present modified example, the reliability of semiconductor device can be improved.

Although the invention made by the present inventor has been specifically described based on the embodiment, the present invention is not limited to the as described above embodiment, and it is needless to say that various modifications can be made without departing from the gist thereof.

What is claimed is:

1. A semiconductor device comprising:
a semiconductor substrate having a first region;
a first protruding portion protruded from a bottom surface of a first groove formed in an upper surface of the semiconductor substrate, and extended in a first direction along the upper surface of the semiconductor substrate, the first protruding portion being a part of the semiconductor substrate in the first region;
a first gate electrode formed on each of an upper surface of the first protruding portion and a side surface of the first protruding portion via a first insulating film, and extended in a second direction crossing to the first direction in plan view;
a second gate electrode formed on each of the upper surface of the first protruding portion and the side surface of the first protruding portion via a second insulating film including a charge storage portion, and adjacent to one side surface of the first gate electrode via a third insulating film, and extended in the second direction;
a first semiconductor layer formed on the upper surface of the first protruding portion located on the first gate electrode side, the first protruding portion sandwiching both the first gate electrode and the second gate electrode in plan view;
a first semiconductor region formed in the first semiconductor layer, the first semiconductor region being a first conductive type region;
a second semiconductor region formed in the first protruding portion located on a second gate electrode side, the second semiconductor region being the first conductive type region; and
a silicide layer contacted with an upper surface of the second semiconductor region,
wherein a width of the first semiconductor layer is larger than a width of the first protruding portion, and
wherein the first gate electrode, the second gate electrode, the second insulating film, the first semiconductor region and the second semiconductor region compose a non-volatile memory element.

2. The semiconductor device according to claim 1, further comprising:
a first conductive connecting portion formed on the non-volatile memory element; and
a second conductive connecting portion formed on the non-volatile memory element,
wherein the first conductive connecting portion is in contact with an upper surface of the first semiconductor layer, and
wherein the second conductive connecting portion is in contact with an upper surface of the silicide layer.

3. The semiconductor device according to claim 1,
wherein a position of an upper surface of the first semiconductor layer is higher than a position of a lower surface of the second gate electrode, and
wherein a position of an upper surface of the silicide layer is lower than a position of the lower surface of the second gate electrode.

4. The semiconductor device according to claim 1, wherein a width of the first semiconductor region is larger than a width of the second semiconductor region.

5. The semiconductor device according to claim 1, further comprising:
a second protruding portion protruded from a bottom surface of a second groove formed in the upper surface of the semiconductor substrate, and extended in a third direction along the upper surface of the semiconductor substrate, the second protruding portion being a part of the semiconductor substrate in a second region different from the first region;
a third gate electrode formed on an upper surface of the second protruding portion via a fourth insulating film, and extended in a fourth direction crossing to the third direction in plan view;
a pair of second semiconductor layers formed on the upper surface of the second protruding portion located on both sides of the third gate electrode, respectively, the second protruding portion sandwiching the third gate electrode in plan view;
a drain region formed in one of the pair of second semiconductor layers; and
a source region formed in the other of the pair of second semiconductor layers,
wherein a width of each of the pair of second semiconductor layers is greater than a width of the second protruding portion,
wherein the third gate electrode is made of a metal film, and
wherein the third gate electrode, the drain region and the source region compose a field effect transistor.

6. The semiconductor device according to claim 1,
wherein, in the first region, a plurality of the first protruding portion is arranged in the second direction, and
wherein, among the plurality of the first protruding portion, one of:
(1) the upper surface of the first protruding portion located at an end portion in the second direction, and (2) the upper surface of a portion located at an end portion of the first protruding portion in the first direction and positioned next to the first gate electrode, is exposed from the first semiconductor layer.

7. A method of manufacturing a semiconductor device, comprising:
(a) preparing a semiconductor substrate having a first region;
(b) forming a first protruding portion, by forming a first groove on an upper surface of the semiconductor substrate in the first region, protruded from a bottom surface of the first groove, and extended in a first direction along the upper surface of the semiconductor substrate, the first protruding portion being comprised of a part of the semiconductor substrate in the first region;
(c) forming an element isolation film filling the first groove located around the first protruding portion;
(d) forming a first gate electrode on each of an upper surface of the first protruding portion and a side surface of the first protruding portion via a first insulating film, and forming a second gate electrode on each of the upper surface of the first protruding portion and the side surface of the first protruding portion via a second insulating film including a charge storage portion, the first gate electrode being extended in a second direction crossing to the first direction in plan view, the second gate electrode being adjacent to one side surface of the first gate electrode via a third insulating film, and the second gate electrode being extended in the second direction;
(e) forming a first epitaxial layer on the upper surface of the first protruding portion located on the first gate electrode side, the first protruding portion sandwiching both the first gate electrode and the second gate electrode in plan view;
(f) forming a first semiconductor region in the first epitaxial layer, and forming a second semiconductor region in the first protruding portion located on a second gate electrode side, the first semiconductor region being a first conductive type region, and the second semiconductor region being the first conductive type region; and
(g) after the (f), forming a first silicide layer on each of an upper surface of the first gate electrode and an upper surface of the second gate electrode, and forming a second silicide layer on the upper surface of the first protruding portion located on the second gate electrode side, the second silicide layer being electrically connected with the second semiconductor region,
wherein the first gate electrode, the second gate electrode, the second insulating film, the first semiconductor region and the second semiconductor region compose a non-volatile memory element.

8. The method according to claim 7,
wherein the semiconductor substrate has a second region,
wherein, in the (b), a second protruding portion is formed by forming a second groove on the upper surface of the semiconductor substrate in the second region, the second protruding portion being comprised of a part of the semiconductor substrate in the second region, the second protruding portion being protruded from a bottom surface of the second groove, and the second protruding portion being extended in a third direction along the upper surface of the semiconductor substrate, wherein, in the (c), the element isolation film filling the second groove located around the second protruding portion is formed,
wherein, in the (d), a third gate electrode is formed on each of an upper surface of the second protruding portion and a side surface of the second protruding portion via a fourth insulating film, the third gate electrode being extended in a fourth direction crossing to the third direction in plan view,
wherein, in the (e), a pair of second epitaxial layers is formed on the upper surface of the second protruding portion located on both sides of the third gate electrode, respectively, the second protruding portion sandwiching the third gate electrode in plan view;
wherein, in the (f), a source region is formed in one of the pair of second epitaxial layers,
wherein, in the (f), a drain region is formed in the other of the pair of second epitaxial layers,
wherein the source region being the first conductive type region,
wherein the drain region being the first conductive type region,
wherein the method according to claim 7 further comprising:
(f1) after the (f), removing the third gate electrode, and forming a fourth gate electrode on each of the upper surface of the second protruding portion between the pair of second epitaxial layers and the side surface of the second protruding portion between the pair of second epitaxial layers, the fourth gate electrode being extended in the fourth direction, and the fourth gate electrode being made of a first metal film, and
wherein the fourth gate electrode, the source region and the drain region compose a field effect transistor.

9. The method according to claim 8, wherein the (f1) is performed before the (g).

10. The method according to claim 9,
wherein (f1) further comprising:
(f2) removing the third gate electrode,
(f3) after the (f2), forming a first film on each of the upper surface of the second protruding portion between the pair of second epitaxial layers and the side surface of the second protruding portion between the pair of second epitaxial layers,
(f4) after the (f3), performing a heat treatment with first temperature against the semiconductor substrate, and
(f5) after the (f4), forming the fourth gate electrode on each of the upper surface of the second protruding portion and the side surface of the second protruding portion via the first film, and
wherein the (g) further comprising:
(g1) forming a second metal film covering each of the upper surface of the first gate electrode and the upper surface of the second gate electrode,
(g2) after the (g1), forming the first silicide layer and the second silicide layer by performing a heat treatment with a second temperature lower than the first temperature against the semiconductor substrate, and
(g3) after the (g2), performing a heat treatment with a third temperature lower than the first temperature against the semiconductor substrate.

11. The method according to claim 7, further comprising:
(h) after the (g), forming a first conductive connecting portion that is in contact with an upper surface of the first epitaxial layer, and forming a second conductive connecting portion that is in contact with an upper surface of the second silicide layer.

12. The method according to claim 7, further comprising:
(d1) after the (d) and before the (e), forming a third groove by etching the upper surface of the first protruding portion located on the first gate electrode side,
wherein, in the (e), the first epitaxial layer is formed on the third groove.

13. The method according to claim 7, further comprising:
(f6) after the (f) and before the (g), forming an interlayer insulating film covering the first epitaxial layer and exposing the upper surface of the first protruding portion located on the second gate electrode side,
wherein, in the (g), the first silicide layer and the second silicide layer are formed in such a state that the first epitaxial layer is covered with the interlayer insulating film.

14. The method according to claim 7,
wherein, in the (b), a plurality of the first protruding portion is formed so as to be arranged in the second direction, in the first region, and
wherein, in the (e), the first epitaxial layer is formed in such a state that, among the plurality of the first protruding portion, one of:
  (1) the upper surface of the first protruding portion located at an end portion in the second direction, and
  (2) the upper surface of a portion located at an end portion of the first protruding portion in the first direction and positioned next to the first gate electrode, is covered with a protective film.

* * * * *